US012686759B2

(12) United States Patent
Silvi

(10) Patent No.: US 12,686,759 B2
(45) Date of Patent: Jul. 21, 2026

(54) PBT-CARBON FIBER COMPOSITES FOR MICROWAVE SHIELDING

(71) Applicant: SHPP GLOBAL TECHNOLOGIES B.V., Bergen op Zoom (NL)

(72) Inventor: Norberto Silvi, Selkirk, NY (US)

(73) Assignee: SHPP Global Technologies B.V., Bergen op Zoom (NL)

( * ) Notice: Subject to any disclaimer, the term of this patent is extended or adjusted under 35 U.S.C. 154(b) by 537 days.

(21) Appl. No.: 18/269,643

(22) PCT Filed: Dec. 31, 2021

(86) PCT No.: PCT/IB2021/062524
§ 371 (c)(1),
(2) Date: Jun. 26, 2023

(87) PCT Pub. No.: WO2022/144854
PCT Pub. Date: Jul. 7, 2022

(65) Prior Publication Data

US 2024/0093004 A1 Mar. 21, 2024

(30) Foreign Application Priority Data

Dec. 31, 2020 (EP) .................................... 20217988

(51) Int. Cl.
*C08K 7/06* (2006.01)
*C08K 3/04* (2006.01)
(Continued)

(52) U.S. Cl.
CPC .................. *C08K 7/06* (2013.01); *C08K 3/04* (2013.01); *C08L 67/02* (2013.01); *H05K 9/009* (2013.01);
(Continued)

(58) Field of Classification Search
CPC .................................. C08K 7/06; C08L 67/02
See application file for complete search history.

(56) References Cited

U.S. PATENT DOCUMENTS 6,248,262 B1 * 6/2001 Kubotera ............. B29C 70/882 252/511
6,689,835 B2 2/2004 Amarasekera et al.
(Continued)

FOREIGN PATENT DOCUMENTS

EP 3712209 A1 9/2020
EP 3845587 A1 7/2021
(Continued)

OTHER PUBLICATIONS

"T300 Standard Modulus Carbon Fiber", 2018, retrieved from https://www.toraycma.com/wp-content/uploads/T300-Technical-Data-Sheet-1.pdf on Sep. 23, 2024 (2 pgs.).
(Continued)

*Primary Examiner* — Joseph D Anthony
(74) *Attorney, Agent, or Firm* — Quicker Law, LLC

(57) ABSTRACT

Disclosed is a composite comprising: from about 50 wt. % to about 99 wt. % of a thermoplastic resin, wherein the thermoplastic resin comprises a polyester; and from about 0.1 wt. % to 15 wt. % of a carbon fiber filler, wherein the carbon fiber has a bulk density of at least 500 g/l and a volume electrical resistivity of less than 2,000μΩ#cm, with individual filaments that have a length-to-diameter ratio of at least 300, wherein a 3.175 mm thick molded sample of the composite exhibits a Transmission of less than 15% of incident microwave radiation when observed according to a Free Space method, measured at frequencies of 75 to 110 GHz, wherein the combined weight percent value of all
(Continued)

components does not exceed 100 wt. %, and all weight percent values are based on the total weight of the composite.

19 Claims, 46 Drawing Sheets

(51) Int. Cl.

| | |
|---|---|
| ***C08L 67/02*** | (2006.01) |
| ***H05K 9/00*** | (2006.01) |
| *G01S 7/02* | (2006.01) |

(52) U.S. Cl.

CPC .. *C08K 2201/004* (2013.01); *C08K 2201/016* (2013.01); *C08K 2201/019* (2013.01); *G01S 7/027* (2021.05)

(56) References Cited

U.S. PATENT DOCUMENTS

| | | | | |
|---|---|---|---|---|
| 2002/0183438 | A1* | 12/2002 | Amarasekera | C08K 5/00 524/495 |
| 2016/0111792 | A1 | 4/2016 | Katayama et al. | |
| 2019/0092924 | A1* | 3/2019 | Choi | C08K 3/04 |
| 2021/0371623 | A1* | 12/2021 | Ueda | C08K 3/04 |
| 2024/0059871 | A1* | 2/2024 | Wei | C08J 5/042 |

FOREIGN PATENT DOCUMENTS

| | | | |
|---|---|---|---|
| JP | S61-16957 | A | 1/1986 |
| JP | 2002-290094 | A | 10/2002 |
| JP | 2019-161208 | A | 9/2019 |
| KR | 10-2019-0037491 | A | 4/2019 |
| WO | 2019/088062 | A1 | 5/2019 |
| WO | 2020/244995 | A1 | 12/2020 |

OTHER PUBLICATIONS

Al-Saleh et al. “EMI shielding effectiveness of carbon based nanostructured polymeric materials: A comparative study,” Carbon vol. 60, pp. 146-156, 2013.

Hwang, S. “Tensile, electrical conductivity and EMI shielding properties of solid and foamed PBT/carbon fiber composites”. Composites Part B: Engineering, vol. 98, 2016, pp. 1-8.

“T700S Standard Modulus Carbon Fiber”, 2018, retrieved from https://www.toraycma.com/wp-content/uploads/T700S-Technical-Data-Sheet-1.pdf.pdf.

International Search Report and Written Opinion mailed Apr. 8, 2022 in PCT/IB2021/062524 (11 pgs.).

* cited by examiner

Scattering Parameters - K-Band

Percent Power in Transmission - K-Band

Percent Power in Transmission - K-Band

Percent Power in Transmission - K-Band

Percent Power in Transmission - K-Band

Percent Power in Transmission - W-Band

Percent Power in Transmission - W-Band

Total Shielding Effectiveness - K-Band

Percent Absorbed Power in Transmission- K-Band

Percent Absorbed Power in Transmission - W-Band

Table 3. Volume and Surface Electrical Resistivities

| | | | | | | | | | | | |
|---|---|---|---|---|---|---|---|---|---|---|---|
| Item Description | | CE-1 | CE-2 | CE-3 | CE-4 | CE-5 | EX-1 | EX-2 | EX-3 | EX-4 | EX-5 |
| VALOX 195 1001 (C9060) | % | 57.31 | 56.14 | 54.97 | 53.80 | 52.63 | 57.31 | 56.14 | 54.97 | 53.80 | 52.63 |
| VALOX 315 1001 (C601) | % | 40.69 | 39.86 | 39.03 | 38.20 | 37.37 | 40.69 | 39.86 | 39.03 | 38.20 | 37.37 |
| ENSACO 360G Carbon Powder | % | 2 | 4 | 6 | 8 | 10 | | | | | |
| TENAX J HT C493 6MM Chopped CF | % | | | | | | 2 | 4 | 6 | 8 | 10 |
| | % | 100 | 100 | 100 | 100 | 100 | 100 | 100 | 100 | 100 | 100 |
| (Valox 195 / Valox 315) Ratio | | 1.408 | 1.408 | 1.408 | 1.408 | 1.408 | 1.408 | 1.408 | 1.408 | 1.408 | 1.408 |
| Total Resin | | 98 | 96 | 94 | 92 | 90 | 98 | 96 | 94 | 92 | 90 |
| | | | | | | | | | | | |
| Volume Resistivity Average (Ohm.cm) | | 7.20E+14 | 5.10E+14 | 6.60E+10 | 7.00E+02 | 6.40E+01 | 1.00E+15 | 1.40E+15 | 7.10E+14 | 1.50E+06 | 3.80E+04 |
| Volume Resistivity St Dev (Ohm.cm) | | 6.20E+14 | 2.60E+14 | 5.00E+10 | 4.50E+02 | 7.00E+00 | 7.70E+14 | 8.90E+14 | 3.70E+14 | 6.90E+05 | 1.50E+04 |
| | | | | | | | | | | | |
| Surface Resistivity Average (Ohm/sq) | | 1.30E+13 | 2.80E+13 | 2.30E+09 | 4.20E+03 | 3.80E+02 | 2.90E+13 | 3.40E+14 | 9.00E+13 | 9.10E+12 | 1.50E+04 |
| Surface Resistivity St Dev (Ohm/sq) | | 7.00E+12 | 3.50E+13 | 1.20E+09 | 3.10E+03 | 4.70E+01 | 3.20E+13 | 6.10E+14 | | 1.80E+13 | 6.60E+03 |

FIG. 20

Table 4. PBT – PC-siloxane formulations

| | PBT | | IMPACT MODIFIER | | | HEAT STABILIZER | | MOLD RELEASE | PC-Siloxane | CARBON FIBER |
|---|---|---|---|---|---|---|---|---|---|---|
| | Valox™ 195 - 1001 | Valox™ 315 - 1001 | Ethylene-ethylacrylate Copolymer | Polybutylene tere/iso phthalate-co-polyoxybutylene | Ethylene-Methylacrylate-Glycidyl methacrylate Copolymer | Phosphoric acid, zinc salt (2:1) | Anti-oxidant 1010 | PETS | ML7437-111N (EXL - 20% siloxane) | TENAX J HT C493 6MM |
| CE-6 | 45.07 | 32.01 | 2 | 2.5 | 3 | 0.05 | 0.06 | 0.2 | 15 | 0.1 |
| EX-6 | 44.84 | 31.85 | 2 | 2.5 | 3 | 0.05 | 0.06 | 0.2 | 15 | 0.5 |
| EX-7 | 44.55 | 31.64 | 2 | 2.5 | 3 | 0.05 | 0.06 | 0.2 | 15 | 1 |
| EX-8 | 44.25 | 31.43 | 2 | 2.5 | 3 | 0.05 | 0.06 | 0.2 | 15 | 1.5 |
| EX-9 | 43.97 | 31.23 | 2 | 2.5 | 3 | 0.05 | 0.06 | 0.2 | 15 | 2 |

FIG. 22

Table 5.

| | Freq. (Hz) | ε' | ε" | ε"/ε' (tan d) | Att. Const. (dB/cm) | Total Shielding Eff. (dB) | RL Meas. (Metal-Backed) (dB) | RL Calc. (Metal-Backed) (dB) | % Power in Metal-Backed Reflection (Absorption) | % Power in Trans. (Reflected) | % Power in Trans. (Absorbed) | % Power in trans. (Transmitted) |
|---|---|---|---|---|---|---|---|---|---|---|---|---|
| CE-6 | 7.70 E+10 | 3.180 | 0.253 | 0.080 | -9.921 | 3.598 | -3.242 | -4.428 | 52.60 | 10.97 | 45.35 | 43.67 |
| EX-6 | 7.70 E+10 | 10.537 | 0.984 | 0.093 | -21.211 | 8.980 | -9.352 | -3.638 | 88.39 | 15.87 | 71.49 | 12.65 |
| EX-7 | 7.70 E+10 | 23.422 | 2.350 | 0.100 | -33.961 | 15.562 | -4.336 | -4.358 | 63.16 | 35.21 | 62.02 | 2.78 |
| EX-8 | 7.70 E+10 | 26.981 | 4.588 | 0.170 | -61.635 | 24.806 | -4.548 | -3.266 | 64.91 | 35.82 | 63.85 | 0.33 |
| EX-9 | 7.70 E+10 | 30.119 | 7.178 | 0.238 | -90.961 | 33.502 | -3.976 | -3.139 | 59.97 | 40.46 | 59.49 | 0.04 |

FIG. 23

Table 6A. Flexural and Tensile Properties Observed at 23 °C for CE-6 and EX-6 to EX-9.

| Test Code | Test Description | Unit | CE-6 | EX-6 | EX-7 | EX-8 | EX-9 |
|---|---|---|---|---|---|---|---|
| Cnd: Speed | | mm/min | 5 | 5 | 5 | 5 | 5 |
| **Results** TENS-ASTM-GLB-F-SLK | | | | | | | |
| | **Modulus of Elasticity-Avg** | MPa | 2118 | 2342 | 2532 | 2774 | 3066 |
| | **Modulus of Elasticity-Std** | - | 31.145 | 51.186 | 64.962 | 64.265 | 68.044 |
| | **Modulus of Elasticity-Rsd** | % | 1.5 | 2.2 | 2.6 | 2.3 | 2.2 |
| | **Stress at Yield-Avg** | MPa | 41.2 | 44.9 | 46.7 | 50.6 | 53.8 |
| | **Stress at Yield-Std** | - | 0.277 | 0.336 | 0.332 | 0.377 | 0.944 |
| | **Stress at Yield-Rsd** | % | 0.67 | 0.75 | 0.71 | 0.75 | 1.8 |
| | **Stress at Break-Avg** | MPa | 33.4 | 34.9 | 35.1 | 44.8 | 48 |
| | **Stress at Break-Std** | - | 0.733 | 0.383 | 0.327 | 2.26 | 1.13 |
| | **Stress at Break-Rsd** | % | 2.2 | 1.1 | 0.93 | 5 | 2.4 |
| | **Elongation at Yield-Avg** | % | 4 | 4 | 4.3 | 4.8 | 4.8 |
| | **Elongation at Yield-Std** | - | 0.18 | 0.14 | 0.38 | 0.43 | 0.22 |
| | **Elongation at Yield-Rsd** | % | 4.5 | 3.5 | 8.9 | 8.8 | 4.5 |
| | **Elongation at Break-Avg** | % | 50 | 20 | 15 | 7.9 | 7.5 |
| | **Elongation at Break-Std** | - | 16 | 3.6 | 1.8 | 1.3 | 0.53 |
| | **Elongation at Break-Rsd** | % | 31 | 18 | 12 | 17 | 7 |
| **Conditions** | | | | | | | |
| Cnd: Thickness | | mm | 3.2 | 3.2 | 3.2 | 3.2 | 3.2 |
| Cnd: Speed | | mm/min | 1.27(3.2mm | 1.27(3.2mm | 1.27(3.2mm | 1.27(3.2mm | 1.27(3.2mm |
| **Results** FLEX-ASTM-GLB-SLK | | | | | | | |
| | **Flexural Modulus-Avg** | MPa | 1960 | 2140 | 2260 | 2420 | 2500 |
| | **Flexural Modulus-Std** | - | 15.2 | 21 | 26.5 | 43.4 | 22.6 |
| | **Flexural Modulus-Rsd** | % | 0.775 | 0.98 | 1.17 | 1.8 | 0.902 |
| | **Flex Stress at 5%Strain-Avg** | MPa | 68.8 | 74.7 | 78.3 | 81.8 | 85.6 |
| | **Flex Stress at 5%Strain-Std** | - | 0.312 | 0.074 | 0.224 | 0.444 | 0.459 |
| | **Flex Stress at 5%Strain-Rsd** | % | 0.453 | 0.0991 | 0.287 | 0.543 | 0.536 |
| | **Flexural Stress at Yield-Avg** | MPa | X | X | X | X | X |
| | **Flexural Stress at Yield-Std** | - | X | X | X | X | X |
| | **Flexural Stress at Yield-Rsd** | % | X | X | X | X | X |
| | **Flexural Stress at Break-Avg** | MPa | X | X | X | X | X |
| | **Flexural Stress at Break-Std** | - | X | X | X | X | X |
| | **Flexural Stress at Break-Rsd** | % | X | X | X | X | X |

TENS-ASTM-GLB-F-SLK Tensile test - ASTM D 638 With Extensometer , Uniaxial tensile test. Filled Materials. Test Speed = 5 mm/min Results in Metric Units - Selkirk FLEX-ASTM-GLB-SLK Flexural test - ASTM D 790, 3-point flexural test. Selkirk

FIG. 41

Table 6B. Impact Strength Properties Observed at 23 °C for CE-6 and EX-6 to EX-9.

| Test Code | Test Description | Unit | CE-6 | EX-6 | EX-7 | EX-8 | EX-9 |
|---|---|---|---|---|---|---|---|
| **Conditions** | | | | | | | |
| Cnd: Temperature | | °C | 23 | 23 | 23 | 23 | 23 |
| Cnd: Notch | | - | 23 °C Un-notched | U | U | U | U |
| Cnd: Pendulum Energy | | - | 11 | 11 | 11 | 11 | 11 |
| **Results** IZOD-ASTM-GLB-SLK | | | | | | | |
| | **Ductility** | % | 100 | 100 | 80 | 0 | 0 |
| | **Impact Strength-Avg** | J/m | 1440 | 1160 | 1030 | 828 | 731 |
| | **Impact Strength-Std** | - | 192 | 155 | 114 | 51.4 | 73.8 |
| | **Impact Strength-Rsd** | % | 13.4 | 13.4 | 11.1 | 6.21 | 10.1 |
| **Conditions** | | | | | | | |
| Cnd: Temperature | | °C | 23 | 23 | 23 | 23 | 23 |
| Cnd: Notch | | - | 23 °C Notched | N | N | N | N |
| Cnd: Pendulum Energy | | - | 2.75 | 2.75 | 2.75 | 2.75 | 2.75 |
| **Results** IZOD-ASTM-GLB-SLK | | | | | | | |
| | **Ductility** | % | 20 | 0 | 0 | 0 | 0 |
| | **Impact Strength-Avg** | J/m | 176 | 91.2 | 84.8 | 85.7 | 76.6 |
| | **Impact Strength-Std** | - | 78.4 | 5.33 | 3.02 | 4.85 | 4.5 |
| | **Impact Strength-Rsd** | % | 44.5 | 5.85 | 3.56 | 5.66 | 5.88 |
| IZOD-ASTM-GLB-SLK | Izod Impact - ASTM D256, ASTM D4812 | | | | | | |

FIG. 42

Table 7. Impact Strength Properties Observed at 30 °C for CE-6 and EX-6 to EX-9.

| Test Code | Test Description | Unit | CE-6 | EX-6 | EX-7 | EX-8 | EX-9 |
|---|---|---|---|---|---|---|---|
| Conditions | | | | | | | |
| Cnd: Temperature | | °C | -30 | -30 | -30 | -30 | -30 |
| Cnd: Notch | | - | (-30 °C) Un-notched | U | U | U | U |
| Cnd: Pendulum Energy | | - | 1 | 1 | 1 | 1 | 1 |
| **Results** IZOD-ASTM-GLB-SLK | | | | | | | |
| **Ductility** | | % | 40 | 40 | 20 | 0 | 0 |
| **Impact Strength-Avg** | | J/m | 1540 | 1250 | 1000 | 810 | 697 |
| **Impact Strength-Std** | | - | 245 | 105 | 51 | 29.7 | 57.5 |
| **Impact Strength-Rsd** | | % | 15.9 | 8.39 | 5.07 | 3.67 | 8.25 |
| **Conditions** | | | | | | | |
| Cnd: Temperature | | °C | -30 | -30 | -30 | -30 | -30 |
| Cnd: Notch | | - | (-30 °C) Notched | N | N | N | N |
| Cnd: Pendulum Energy | | - | 1 | 1 | 1 | 1 | 1 |
| **Results** IZOD-ASTM-GLB-SLK | | | | | | | |
| **Ductility** | | % | 0 | 0 | 0 | 0 | 0 |
| **Impact Strength-Avg** | | J/m | 69.9 | 53.3 | 51.4 | 49.8 | 49.8 |
| **Impact Strength-Std** | | - | 4.15 | 7 | 7.13 | 1.44 | 4.28 |
| **Impact Strength-Rsd** | | % | 5.94 | 13.1 | 13.9 | 2.9 | 8.59 |
| IZOD-ASTM-GLB-SLK | Izod Impact - ASTM D256, ASTM D4812 | | | | | | |

FIG. 43

Table 8. Heat Deflection Temperature, Specific Gravity, Flow Rate, and Viscosity for CE-6 and EX-6 to EX-9.

| Test Code | Test Description | Unit | CE-6 | EX-6 | EX-7 | EX-8 | EX-9 |
|---|---|---|---|---|---|---|---|
| **Conditions** | | | | | | | |
| Cnd: Stress | | MPa | 1.82 | 1.82 | 1.82 | 1.82 | 1.82 |
| Cnd: Thickness | | mm | 3.2 | 3.2 | 3.2 | 3.2 | 3.2 |
| Cnd: TG (expected) | | °C | | | | | |
| **Results** HDT-ASTM-GLB-SLK | | | | | | | |
| | **Deflection temp-Avg** | °C | 53.2 | 54.2 | 58.8 | 64.4 | 70.2 |
| | **Deflection temp-Std** | - | 1.04 | 0.3 | 0.777 | 2.07 | 4.68 |
| | **Deflection temp-Rsd** | % | 1.96 | 0.554 | 1.32 | 3.21 | 6.66 |
| **No Conditions** | | | | | | | |
| **Results** DENS_SG-ASTM-GLB-SLK | | | | | | | |
| | **Density-Avg** | - | 1.249 | 1.259 | 1.258 | 1.26 | 1.264 |
| | **Density-Std** | - | 0 | 0 | 0 | 0 | 0 |
| | **Density-Rsd** | % | 0 | 0 | 0 | 0 | 0 |
| | **Specific Gravity-Avg** | - | 1.253 | 1.263 | 1.262 | 1.263 | 1.267 |
| | **Specific Gravity-Std** | - | 0 | 0 | 0 | 0 | 0 |
| | **Specific Gravity-Rsd** | % | 0 | 0 | 0 | 0 | 0 |
| **Conditions** | | | | | | | |
| Cnd: Temperature | | °C | 260 | 260 | 260 | 260 | 260 |
| Cnd: Load | | KG | 5 | 5 | 5 | 5 | 5 |
| Cnd: Dwell time | | s | 375 | 375 | 375 | 375 | 375 |
| **Results** MFR-ASTM-GLB-SLK | | | | | | | |
| | **MFR-Avg** | **g/10 min** | 65.4 | 55 | 59.7 | 48 | 58.9 |
| | **MFR-Std** | - | 0.936 | 1.18 | 0.65 | 0.708 | 0.369 |
| | **MFR-Rsd** | % | 1.43 | 2.14 | 1.09 | 1.47 | 0.627 |
| **Conditions** | | | | | | | |
| Cdn: Capillary L/D | | - | | X | X | X | X |
| Cdn: Temperature | | °C | X | X | X | X | X |
| Cdn: Dwell time | | s | X | X | X | X | X |
| **Results** MV_M-01-GEP-GLB-SLK | | | | | | | |
| | Data file (charge #) | - | X | X | X | X | X |
| | Calc viscosity, 100 1/s | Pa·s | 372.5 | 414.6 | 427.5 | 403.8 | 398.4 |
| | Calc viscosity, 500 1/s | Pa·s | 252.2 | 271.9 | 277 | 269.3 | 263.9 |
| | Calc viscosity, 1000 1/s | Pa·s | 198.2 | 211 | 210.4 | 209.1 | 203.4 |
| | Calc viscosity, 1500 1/s | Pa·s | 167.7 | 176.3 | 175.1 | 172.5 | 173.1 |
| | Calc viscosity, 3000 1/s | Pa·s | 118.2 | 124.2 | 123.2 | 122.3 | 121.9 |
| | Calc viscosity, 5000 1/s | Pa·s | 90 | 93.5 | 93.1 | 92.7 | 92.7 |
| | Calc viscosity, 10000 1/s | Pa·s | | | | | |

| | |
|---|---|
| HDT-ASTM-GLB-SLK | Heat deflection temperature (HDT) - ASTM D 648. - Selkirk PSL |
| DENS_SG-ASTM-GLB-SLK | Specific Gravity - ASTM D 792 - Selkirk |
| MFR-ASTM-GLB-SLK | Melt Mass-flow Rate (MFR) - ASTM D 1238 according to Global Test Method - Selkirk |
| MV_M-01-GEP-GLB-SLK | Melt Viscosity (MV) - GEP multi point method [MP], melt viscosity at various shear rates [MV curve] (Kayeness). |

FIG. 46

Table 9. Volume and Surface Resistivity for CE-6 and EX-6 to EX-9

| Test Code | Test Description | Unit | CE-6 | EX-6 | EX-7 | EX-8 | EX-9 |
|---|---|---|---|---|---|---|---|
| **Results** RES_SF-ASTM-GLB-SLK | | | | | | | |
| | Surface Resistivity-Ind | OHM-P-SQ | 3.4E+12 | 4.2E+12 | 5.7E+12 | 7.1E+13 | 7.6E+12 |
| | Surface Resistivity-Ind | OHM-P-SQ | 2.7E+13 | 1.1E+13 | 7.9E+12 | 1.3E+13 | 2.4E+13 |
| | Surface Resistivity-Ind | OHM-P-SQ | 1.1E+13 | 1.1E+13 | 1.9E+13 | 9.8E+12 | 6.5E+12 |
| | Surface Resistivity-Ind | OHM-P-SQ | | | | | |
| | Surface Resistivity-Ind | OHM-P-SQ | | | | | |
| | **Surface Resistivity-Avg** | **OHM-P-SQ** | 1.38E+13 | 8.73E+12 | 1.09E+13 | 3.13E+13 | 1.27E+13 |
| | **Surface Resistivity-Std** | - | 1.2E+13 | 3.9E+12 | 7.1E+12 | 3.4E+13 | 9.8E+12 |
| | **Surface Resistivity-Rsd** | % | 90 | 40 | 70 | 100 | 80 |
| Cnd: Thickness specimen | | mm | 3.2 | 3.2 | 3.2 | 3.2 | 3.2 |
| **Results** RES_VL-ASTM-GLB-SLK | | | | | | | |
| | Volume Resistivity-Ind | Ohm-cm | 5.22E+14 | 8.69E+13 | 1.31E+14 | 1.28E+15 | 3.52E+14 |
| | Volume Resistivity-Ind | Ohm-cm | 7.82E+13 | 7.39E+13 | 5.69E+13 | 1.94E+14 | 2.24E+15 |
| | Volume Resistivity-Ind | Ohm-cm | 6.52E+14 | 4.35E+14 | 2.41E+14 | 1.41E+15 | 1.14E+15 |
| | Volume Resistivity-Ind | Ohm-cm | | | | | |
| | Volume Resistivity-Ind | Ohm-cm | | | | | |
| | **Volume Resistivity-Avg** | **Ohm-cm** | 4.17E+14 | 1.99E+14 | 1.43E+14 | 9.61E+14 | 1.24E+15 |
| | **Volume Resistivity-Std** | - | 3.01E+14 | 2.05E+14 | 9.26E+13 | 6.68E+14 | 9.48E+14 |
| | **Volume Resistivity-Rsd** | % | 72.1 | 103 | 64.8 | 69.5 | 76.2 |
| RES_SF-ASTM-GLB-SLK | Surface Resistivity - ASTM D 257; Test Notes | ASTM D257 - pins up - 5 plaques | | | | | |
| RES_VL-ASTM-GLB-SLK | Volume Resistivity - ASTM D 257; Test Notes | ASTM D257 - pins up - 5 plaques | | | | | |

FIG. 47

PBT-CARBON FIBER COMPOSITES FOR MICROWAVE SHIELDING

CROSS-REFERENCE TO RELATED APPLICATION

This application is the National Stage of International Application No. PCT/IB2021/062524 filed Dec. 31, 2021, which claims priority to and the benefit of European Application No. 20217988.3 filed Dec. 31, 2020, the disclosures of which are incorporated herein by this reference in their entireties.

FIELD OF THE DISCLOSURE

The present disclosure relates to materials exhibiting microwave shielding properties, and in particular to materials exhibiting microwave shielding properties for automotive radar sensor applications.

BACKGROUND OF THE DISCLOSURE

The automotive industry is increasingly employing electronic radar sensors to provide drivers assistance with features such as adaptive cruise control, parking/lane change assist, back-up warning, blind spot detection, collision avoidance, and many others. To ensure proper operation of these sensors, these devices must be protected from potentially spurious sources of electromagnetic radiation. Microwave radiation, from about 1 gigahertz GHz (about 300 millimeter, mm wavelength) to 300 GHz frequency (about 1 mm wavelength), is the most common source of electromagnetic energy used in the operation of radar sensors for automotive applications. Metals (such as, aluminum, stainless steel, for example), polymer composite materials containing metallic fillers, such as aluminum flakes, stainless steel fibers and silver-coated polyamide fibers, metalized coatings, inherently conductive polymers (such as, for example, polyacetylene, polypyrrole, polythiophene, and polyaniline), silicon carbide, ferrites (iron(III) oxide $Fe_2O_3$+ Ni/Zn/Cd/Co oxide), and carbonil iron are some of the materials that are being used to shield automotive radar sensors from damaging microwave electromagnetic radiation.

Metals are the most common materials for microwave (MW) shielding, but they are heavy and expensive. Metals also require complex processing to be shaped into a final part. Polymers or carbon composites are typically preferred because of their lower density, lower cost, easy shaping, and ease of manufacture into high volume molded parts. Further, carbon fillers may be used in the composite to trap microwave radiation in enclosure walls thereby protecting the electronic sensors inside the cavity. Aspects of the present disclosure addresses these and other needs.

SUMMARY

Aspects of the disclosure relate to a composite comprising: from about 50 wt. % to about 99 wt. % of a thermoplastic resin, wherein the thermoplastic resin comprises a polyester; and from about 0.1 wt. % to about 15 wt. % of a carbon fiber filler, wherein the carbon fiber filler has a bulk density of at least 500 grams per liter (g/l) and an electrical conductivity of at least $7\times10^3$ siemens per meter (S/m). The composite may exhibit a transmission of less than 3% of microwave radiation when observed according to a Free Space method, measured at frequencies of 75 to 110 GHz and a higher reflection of microwave radiation than a reference composition comprising the same amount of a carbon powder filler rather the carbon fiber filler, when observed according to a Free Space method, measured at frequencies of 18 to 26.5 GHz and of 75 to 110 GHz. A molded sample of the composite exhibits a Percent Reflected Power measured in Transmission mode of at least 40% when observed according to a Free Space method at frequencies from about 75 GHz to 110 GHz. The combined weight percent value of all components does not exceed 100 wt. %, and all weight percent values are based on the total weight of the composite.

BRIEF DESCRIPTION OF THE FIGURES

FIG. 20 shows Table 3 presenting the volume and surface electrical resistivities of CE-1 to CE-5 and EX-1 and EX-5, respectively.

FIG. 22 shows Table 4 for PBT-poly(carbonate-siloxane) formulations.

FIG. 23 shows Table 5 for dielectric properties of CE-6 and EX-6 to EX-9.

FIG. 41 presents Table 6A showing flexural and tensile properties of CE-6 and EX-6 to EX-9 at 23° C.

FIG. 42 presents Table 6B showing impact strength properties of CE-6 and EX-6 to EX-9 at 23° C.

FIG. 43 presents Table 7 showing impact strength properties of CE-6 and EX-6 to EX-9 at 30° C.

FIG. 46 presents Table 8 showing additional properties for CE-6 and EX-6 to EX-9.

FIG. 47 presents Table 9 showing volume and surface resistivities for CE-6 and EX-6 to EX-9.

DETAILED DESCRIPTION

Figure 1A:
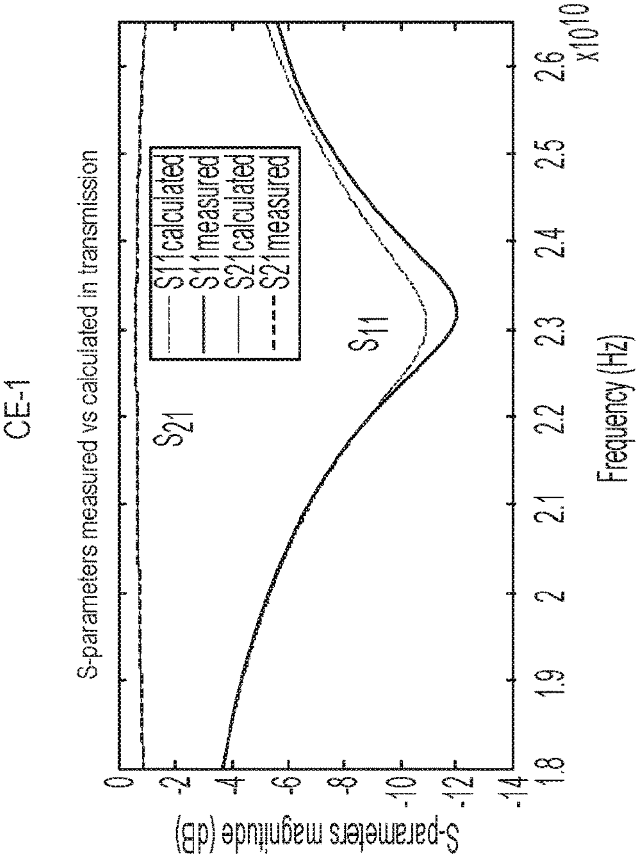
FIGS. 1A and 1B show the Scattering parameters in the K-Band (18-26.5 GHz) for CE-1 and EX-1, respectively.

The present disclosure relates to microwave shielding composite materials. Electronic radar sensors are used in the automotive industry to aid drivers in a variety of operations including cruise control, lane change assistance, self-parking, and blind spot detection, among others. These sensors must be protected from electromagnetic interference that can damage their normal operation. Metals, such as aluminum and stainless steel, are commonly used as microwave shielding materials, but they are heavy, expensive, and demand complex processing to be shaped into a final part. Polymer/carbon composites may be more desirable as a lower density, lower cost alternative. Polymer/carbon composites are also more easily molded and manufactured into high volume molded parts. Carbon fillers of the composite may isolate microwave radiation in enclosure walls to protect the electronic sensors inside the cavity.

Accordingly, moderate electrical conductivity, and relatively large dielectric and magnetic losses are some of the features required for materials used in microwave shielding Metals are the most common materials for microwave (MW) shielding, but they are heavy, expensive and require complex processing. Shielding Effectiveness (SE) of a material describes the ability of the material to reduce the electromagnetic field around it by blocking the field with barriers or shields made of conductive and/or magnetic materials. In these cases, the shielding can be affected by either absorbing or reflecting part or all of the electromagnetic radiation impinging on the material to be protected. The ability of the shielding material to block this harmful radiation generally depends upon the frequency (or wavelength) of the incoming radiation and thickness of the protective layer. Shielding is also expected to vary with the electrical conductivity and/or dielectric properties of the material.

The present disclosure describes thermoplastic-based carbon-fiber-filled materials that are rigid and of high modulus that maintain a certain shape when molded, and they can be used as internal or external components to trap electromagnetic radiation in automotive sensor applications. The polymer-based composites comprise carbon fiber as a microwave shielding filler. The aspect ratio of the carbon fiber filler may impart MW shielding properties that differ from those of a carbon powder or particulate filler.

Before the present compounds, compositions, articles, systems, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Various combinations of elements of this disclosure are encompassed by this disclosure, for example, combinations of elements from dependent claims that depend upon the same independent claim.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

Composite

Aspects of the disclosure relate to a composite comprising a thermoplastic polymer component (including a polyester) and a carbon fiber filler. The thermoplastic polymer component may include any suitable thermoplastic polymer. Examples include, but are not limited to, polycarbonate, polyetherimide, liquid crystal polymer, polyamide, polyimide, polyester, copolymers thereof, blends thereof, or combinations thereof. In specific examples, the polymer component is a polyalkylene terephthalate.

A molded plaque formed from the disclosed composite may be suitable as an external or internal component of an electric device used in microwave absorbing, reflecting or shielding applications. Experimentation showed that plaques molded from the materials of this disclosure are capable of transmitting less than about 3% of microwave radiation at frequencies from about 75 GHz to about 110 GHz. The molded plaque may have a thickness of from 1 millimeter (mm) to about 5 mm. In various examples, the molded plaque may have a thickness of 0.125 inches (3.175 mm). The injection molded plaques used to measure the microwave absorption and reflection properties of the compositions of this disclosure were 6 in.×8 in.×⅛ in. in size.

In various aspects, the present disclosure provides composite materials useful for the manufacture of enclosures that can isolate electronic sensors from damaging microwave electromagnetic energy. These materials have been evaluated for dielectric properties, such as Reflection, Transmission, and Shielding Effectiveness, among others, at frequencies from about 10 GHz and 120 GHz. Further disclosed herein are radar sensor components (plates, enclosures, covers, etc) manufactured from these materials, and articles (sensors, cameras, electronic control units (ECUs)) manufactured from these components.

In yet further aspects, the composite may comprise a thermoplastic polymer component (including a polyester) and a carbon fiber filler. The composite may comprise from about 50 wt. % to about 99 wt. % of a thermoplastic resin, wherein the thermoplastic resin comprises a polyester; and from about 0.1 wt. % to about 15 wt. % of a carbon fiber filler. The carbon fiber may have a bulk density of at least 300 g/l and an electrical resistivity of less than about 2,000 microhm-centimeters μΩ-cm, with individual filaments that are 5-10 mm long and have a length-to-diameter ratio of at least 300. The disclosed composites may exhibit a transmission of less than 3% of microwave radiation when observed according to a Free Space method, measured at frequencies of 75 to 110 GHz. The disclosed compositions exhibit a high reflection and low transmission of microwave radiation, particularly in the W-band. For example, a molded sample of the composite may exhibit a percent Reflected power measured in Transmission mode of at least 45% when observed according to a Free Space method at frequencies from about 75 GHz to 120 GHz.

Further disclosed is a component of an automotive radar sensor, such as, for example, a plate, enclosure, or cover, which is molded from a material comprising a polymer and a carbon filler, with the molded part having certain design, average thickness, microwave shielding efficiency, absorption bandwidth, and a certain surface and volume electrical resistivity. Still another aspect of the present disclosure is an article, such as, for example, a radar sensor, camera, electronic control unit (ECU), comprising a molded part made from a radar shielding material, with such molded part having at least two openings to allow the transmission of microwave radiation between a transmitting antenna and a receiving antenna located in the printed circuit board of the sensor. Automotive radar sensors for lane-change assistance, self-parking, blind spot detection and collision avoidance typically operate at 24 GHz of frequency; those for adaptive cruise control operate at 77 GHz frequency. Accordingly, composites of the present disclosure have been observed in the K-band, which includes the 24 GHz frequency, and in the W-band, which includes the 77 GHz frequency.

Thermoplastic Resin

In various aspects, the composite can comprise a thermoplastic resin or a thermoset resin. The thermoplastic resin may comprise polypropylene, polyethylene, ethylene based copolymer, polyamide, polycarbonate, polyester, polyoxymethylene (POM), polybutylene terephthalate (PBT), polyethylene terephthalate (PET), polycyclohexylendimethylene terephthalate (PCT), liquid crystal polymers (LCP), polyphenylene sulfide (PPS), polyphenylene ether (PPE), polyphenylene oxide-polystyrene blends, polystyrene, high impact modified polystyrene, acrylonitrile-butadiene-styrene (ABS) terpolymer, acrylic polymer, polyetherimide (PEI), polyurethane, polyetheretherketone (PEEK), polylactic acid (PLA) based polymers, poly ether sulphone (PES), and combinations thereof. The thermoplastic resin can also include thermoplastic elastomers such as polyamide and polyester based elastomers. The base substrate can also comprise blends and/or other types of combination of resins described above. In various aspects, the composite may also comprise a thermosetting polymer. Appropriate thermosetting resins can include phenol resin, urea resin, melamine-formaldehyde resin, urea-formaldehyde latex, xylene resin, diallyl phthalate resin, epoxy resin, aniline resin, furan resin, polyurethane, or combinations thereof.

In various aspects of the present disclosure, the thermoplastic resin may comprise a polyester. For example, the thermoplastic resin may comprise a polyalkylene ester (a polyester), such as a polyalkylene terephthalate polymer.

Polyesters have repeating units of the following formula (A):

(A)

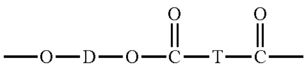

wherein T is a residue derived from a terephthalic acid or chemical equivalent thereof, and D is a residue derived from polymerization of an ethylene glycol, butylene diol, specifically 1,4-butane diol, or chemical equivalent thereof. Chemical equivalents of diacids include dialkyl esters, for example, dimethyl esters, diaryl esters, anhydrides, salts, acid chlorides, acid bromides, and the like. Chemical equivalents of ethylene diol and butylene diol include esters, such as dialkylesters, diaryl esters, and the like. In addition to units derived from a terephthalic acid or chemical equivalent thereof, and ethylene glycol or a butylene diol, specifically 1,4-butane diol, or chemical equivalent thereof, other T and/or D units can be present in the polyester, provided that the type or amount of such units do not significantly adversely affect the desired properties of the thermoplastic compositions. Poly(alkylene arylates) can have a polyester structure according to formula (A), wherein T comprises groups derived from aromatic dicarboxylates, cycloaliphatic dicarboxylic acids, or derivatives thereof.

Examples of specifically useful T groups include, but are not limited to, 1,2-, 1,3-, and 1,4-phenylene; 1,4- and 1,5-naphthylenes; cis- or trans-1,4-cyclohexylene; and the like. Specifically, where T is 1,4-phenylene, the poly(alkylene arylate) is a poly(alkylene terephthalate). In addition, for poly(alkylene arylate), specifically useful alkylene groups D include, for example, ethylene, 1,4-butylene, and bis-(alkylene-disubstituted cyclohexane) including cis- and/or trans-1,4-(cyclohexylene)dimethylene.

Examples of polyalkylene terephthalate include polyethylene terephthalate (PET), poly(1,4-butylene terephthalate) (PBT), and poly(propylene terephthalate) (PPT). Also useful are poly(alkylene naphthoates), such as poly(ethylene naphthanoate) (PEN), and poly(butylene naphthanoate) (PBN). A useful poly(cycloalkylene diester) is poly(cyclohexanedimethylene terephthalate) (PCT). Combinations including at least one of the foregoing polyesters may also be used.

Copolymers including alkylene terephthalate repeating ester units with other ester groups can also be useful. Useful ester units can include different alkylene terephthalate units, which can be present in the polymer chain as individual units, or as blocks of poly(alkylene terephthalates). Specific examples of such copolymers include poly(cyclohexanedimethylene terephthalate)-co-poly(ethylene terephthalate), abbreviated as PETG where the polymer includes greater than or equal to 50 mol % of poly(ethylene terephthalate), and abbreviated as PCTG where the polymer comprises greater than 50 mol % of poly(1,4-cyclohexanedimethylene terephthalate). Poly(cycloalkylene diester)s can also include poly(alkylene cyclohexanedicarboxylate)s. Of these, a specific example is poly(1,4-cyclohexane-dimethanol-1,4-cyclohexanedicarboxylate) (PCCD), having recurring units of formula (B):

(B)

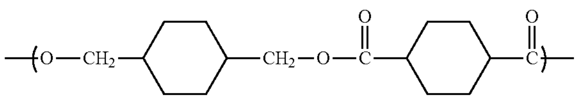

wherein, as described using formula (A), $R^2$ is a 1,4-cyclohexanedimethylene group derived from 1,4-cyclohexanedimethanol, and T is a cyclohexane ring derived from cyclohexanedicarboxylate or a chemical equivalent thereof, and can comprise the cis-isomer, the trans-isomer, or a combination comprising at least one of the foregoing isomers.

In another aspect, the composite can further comprise poly(1,4-butylene terephthalate) or "PBT" resin. PBT may be obtained by polymerizing a glycol component of which at least 70 mol %, preferably at least 80 mol %, consists of tetramethylene glycol and an acid or ester component of which at least 70 mol %, preferably at least 80 mol %, consists of terephthalic acid and/or polyester-forming derivatives thereof. Commercial examples of PBT include those available under the trade names VALOX™ 315, VALOX™ 195 and VALOX™ 176, manufactured by SABIC™, having an intrinsic viscosity of 0.1 deciliters per gram (dl/g) to about 2.0 dl/g (or 0.1 dl/g to 2 dl/g) as measured in a 60:40 phenol/tetrachloroethane mixture or similar solvent at 23 degrees Celsius (° C.) to 30° C. In one aspect, the PBT resin has an intrinsic viscosity of 0.1 dl/g to 1.4 dl/g (or about 0.1 dl/g to about 1.4 dl/g), specifically 0.4 dl/g to 1.4 dl/g (or about 0.4 dl/g to about 1.4 dl/g).

In further aspects, the composite may further comprise a polycarbonate-polysiloxane copolymer or a poly(carbonate-siloxane) copolymer. Non-limiting examples of poly(carbonate-siloxane) copolymers may comprise various copolymers available from SABIC™. In an aspect, the poly(carbonate-siloxane) copolymer may have a total siloxane content of between 1 wt. % and 45 wt. % based on the total weight of the poly(carbonate-siloxane) copolymer. As an example, the poly(carbonate-siloxane) copolymer may have 6% by weight polysiloxane content based upon the total weight of the poly(carbonate-siloxane) copolymer. In various aspects, the 6% by weight polysiloxane block copolymer may have a weight average molecular weight (Mw) of from about 23,000 to 24,000 Daltons using gel permeation chromatography with a bisphenol A polycarbonate absolute molecular weight standard. In certain aspects, the 6% weight siloxane polysiloxane-polycarbonate copolymer may have a melt volume flow rate (MVR) of about 10 $cm^3$/10 min at 300° C./1.2 kg (see for example, C9030T, a 6% by weight polysiloxane content copolymer available from SABIC Innovative Plastics as "transparent" EXL C9030T resin polymer). In a further example, the poly(carbonate-siloxane) copolymer may comprise 20% by weight polysiloxane based upon the total weight of the poly(carbonate-siloxane) copolymer. A suitable poly(carbonate-siloxane) copolymer may comprise a bisphenol A polysiloxane-polycarbonate copolymer end-capped with para-cumyl phenol (PCP) and having a 20% polysiloxane content (see C9030P, commercially available from SABIC™ as the "opaque" EXL C9030P). In various aspects, the weight average molecular weight of the 20% polysiloxane block copolymer may be about 29,900 Daltons to about 31,000 Daltons when tested according to a polycarbonate standard using gel permeation chromatography (GPC) on a cross-linked styrene-divinylbenzene column and calibrated to polycarbonate references using a UV-VIS detector set at 264 nm on 1 mg/ml samples eluted at a flow rate of about 1.0 ml/minute. Moreover, the 20% polysiloxane block copolymer may have an MVR at 300° C./1.2 kg of 7 $cm^3$/10 min and can exhibit siloxane domains sized in a range of from about 5 μm to about 20 μm. The poly(carbonate-siloxane) copolymer may be present in the composite in an amount so that the composite has a total siloxane content of between 1 wt. % and 15 wt. % based on the total weight of the composite.

As described herein, the composition may comprise from about 40 wt. % to about 99 wt. % of a polyalkylene polymer. In further examples, the composition may comprise from about 50 wt. % to about 99 wt. % of a polyalkylene polymer, or from about 40 wt. % to about 99 wt. % of a polyalkylene polymer, or from about 55 wt. % to about 99 wt. % of a polyalkylene polymer, or from about 60 wt. % to about 99 wt. % of a polyalkylene polymer, or from about 70 wt. % to about 99 wt. % of a polyalkylene polymer, or from about 40 wt. % to about 99 wt. % of a polyalkylene polymer, or from about 55 wt. % to about 99 wt. % of a polyalkylene polymer, or from about 60 wt. % to about 95 wt. % of a polyalkylene polymer, or from about 75 wt. % to about 99 wt. %.

Certain aspects of the composition include from about 50 wt. % to about 99 wt. % of a thermoplastic resin, or from about 40 wt. % to about 99 wt. % of a thermoplastic resin, or from about 55 wt. % to about 99 wt. % of a thermoplastic resin, or from about 60 wt. % to about 99 wt. % of a thermoplastic resin, or from about 70 wt. % to about 99 wt. % of a thermoplastic resin, or from about 40 wt. % to about 99 wt. % of a thermoplastic resin, or from about 55 wt. % to about 99 wt. % of a thermoplastic resin, or from about 60 wt. % to about 99 wt. % of a thermoplastic resin, or from about 75 wt. % to about 99 wt. % of a thermoplastic resin. In various aspects, the composite comprises a blend of thermoplastic resins, such as a blend of suitable polyester resins.

Carbon Fiber Filler

In various aspects, the composite comprises a carbon fiber filler. Various types of electrically conductive carbon fibers may be used in the composition. Carbon fibers are generally classified according to their diameter, morphology, and degree of graphitization (morphology and degree of graphitization being interrelated). These characteristics are presently determined by the method used to synthesize the carbon fiber. Moreover, the carbon-fiber filler or the composite may be free of or substantially free of carbon nanotubes, carbon platelets, or carbon powder or particulate.

In certain aspects, the carbon fiber filler includes a coating or a sizing A suitable coating may comprise a polymer such as a polyurethane or a polyamide. As a specific example, the carbon fiber may have a coating or sizing of polyurethane. The amount or sizing content may vary. Sizing may be up to 10% based on the weight of the fiber. For example, the carbon fiber may comprise sizing from 2% to 8%, or from 3% to 6%. In a specific example, the carbon fiber may have 2.7% polyurethane sizing.

The carbon fiber filler may have a particular bulk density. In an example, the carbon fiber filler may exhibit a bulk density of at least 100 grams/liter (g/1), at least 200 g/l, at least 250 g/l, at least 300 g/l, or at least 400 g/l, or at least 500 g/l, or at least 600 g/l.

In further aspects, the carbon fiber may have a particular length. The carbon fiber may have a length of at least 3 mm, at least 4 mm, at least 5 mm. In certain aspects, the carbon fiber may have a length from about 5 mm to about 10 mm. For example, the carbon fiber may have a length of at least 6 mm. Individual filaments of a given carbon fiber may be compiled into a fiber bundle. Individual carbon fiber filaments may have a diameter of about 7 micrometers (μm). The individual filaments may be combined into a fiber bundle having a diameter of 1-2 mm.

The carbon fiber filler may have a particular conductivity. For example, the conductivity of the carbon fiber filler may be $9\text{-}10^3$ S/m. The carbon fiber filler may exhibit an electrical resistivity less than about 2,000 microhmcentimeter (μΩ-cm). A specific carbon fiber filler may be type HT C493 commercially available from Teijin/Toho America Inc. Tenax™ as Tenax-J HT C493.

In some aspects, the composition can comprise from about 0.01 wt. % to about 15 wt. % of a carbon-fiber filler based on the total weight of the polymer composition. The ratio of thermoplastic resin to carbon filler may be from about 10,000:1 to about 5:1, 1000:1 to about 5:1, 100:1 to about 5:1, 1000:1 to about 3:1, 32:1 to about 5:1 or from about 24:1 to about 6:1. In further aspects the composition may include from about 4 wt. % to about 8 wt. %, or from about 0.1 wt. % to about 6 wt. %, or from about 0.1 wt. % to about 10 wt. %, or from about 1 wt. % to about 8 wt. %, or from about 0.5 wt. % to about 7 wt. % of a carbon-fiber filler, or from about 1 wt. % to about 12 wt. % of a carbon-based filler or from about 2 wt. % to about 10 wt. % of a carbon fiber filler.

Additives

The disclosed thermoplastic composition can comprise one or more additives conventionally used in the manufacture of molded thermoplastic parts with the proviso that the optional additives do not adversely affect the desired properties of the resulting composition. Mixtures of optional additives can also be used. Such additives can be mixed at a suitable time during the mixing of the components for forming the composite mixture. Exemplary additives can include ultraviolet agents, ultraviolet stabilizers, heat stabilizers, antistatic agents, anti-microbial agents, anti-drip agents, radiation stabilizers, pigments, dyes, fibers, fillers, plasticizers, fibers, flame retardants, antioxidants, lubricants, wood, glass, and metals, and combinations thereof. According to certain aspects, the polymer compositions may maintain mechanical and dielectric performance even with high levels of fillers (for example, greater than 30 wt. % filler based on the total weight of the polymer composition).

The composite disclosed herein can comprise one or more additional fillers. The filler can be selected to impart additional impact strength and/or provide additional characteristics that can be based on the final selected characteristics of the polymer composition. In some aspects, the filler(s) can comprise inorganic materials which can include clay, titanium oxide, asbestos fibers, silicates and silica powders, boron powders, calcium carbonates, talc, kaolin, sulfides, barium compounds, metals and metal oxides, wollastonite, glass spheres, glass fibers, flaked fillers, fibrous fillers, natural fillers and reinforcements, and reinforcing organic fibrous fillers. In certain aspects, the composite may comprise a glass fiber filler. For example, the composite may comprise from about 0.01 wt. % to about 25 wt. %, from about 10 wt. % to about 25 wt. %, from about 15 wt. % to about 25 wt. %, of a glass fiber filler based on the total weight of the composite. In yet further aspects, the composite may be free or substantially free of a glass filler.

Appropriate fillers or reinforcing agents can include, for example, mica, clay, feldspar, quartz, quartzite, perlite, tripoli, diatomaceous earth, aluminum silicate (mullite), synthetic calcium silicate, fused silica, fumed silica, sand, boron-nitride powder, boron-silicate powder, calcium sulfate, calcium carbonates (such as chalk, limestone, marble, and synthetic precipitated calcium carbonates) talc (including fibrous, modular, needle shaped, and lamellar talc), wollastonite, hollow or solid glass spheres, silicate spheres, cenospheres, aluminosilicate or (armospheres), kaolin, whiskers of silicon carbide, alumina, boron carbide, iron, nickel, or copper, continuous and chopped carbon fibers or glass fibers, molybdenum sulfide, zinc sulfide, barium titanate, barium ferrite, barium sulfate, heavy spar, titanium dioxide, aluminum oxide, magnesium oxide, particulate or fibrous aluminum, bronze, zinc, copper, or nickel, glass flakes, flaked silicon carbide, flaked aluminum diboride, flaked aluminum, steel flakes, natural fillers such as wood flour, fibrous cellulose, cotton, sisal, jute, starch, lignin, ground nut shells, or rice grain husks, reinforcing organic fibrous fillers such as poly(ether ketone), polyimide, polybenzoxazole, poly(phenylene sulfide), polyesters, polyethylene, aromatic polyamides, aromatic polyimides, polyetherimides, polytetrafluoroethylene, and poly(vinyl alcohol), as well combinations comprising at least one of the foregoing fillers or reinforcing agents. The fillers and reinforcing agents may be coated or surface treated, with silanes for example, to improve adhesion and dispersion with the polymer matrix. Fillers generally can be used in amounts of 1 to 200 parts by weight, based on 100 parts by weight of based on 100 parts by weight of the total composition.

In some aspects, the thermoplastic composition may comprise a synergist. In various examples fillers may serve as flame retardant synergists. The synergist facilitates an improvement in the flame retardant properties when added to the flame retardant composition over a comparative composition that contains all of the same ingredients in the same quantities except for the synergist. Examples of mineral fillers that may serve as synergists are mica, talc, calcium carbonate, dolomite, wollastonite, barium sulfate, silica, kaolin, feldspar, barytes, or the like, or a combination comprising at least one of the foregoing mineral fillers. Metal synergists, for example, antimony oxide, can also be used with the flame retardant. In one example, the synergist may comprise magnesium hydroxide and phosphoric acid. The mineral filler may have an average particle size of about 0.1 to about 20 micrometers, specifically about 0.5 to about 10 micrometers, and more specifically about 1 to about 3 micrometers.

The thermoplastic composition can comprise an antioxidant. The antioxidants can include either a primary or a secondary antioxidant. For example, antioxidants can include organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis[methylene(3,5-di-tert-butyl-4-hydroxyhydrocinnamate)] methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl) propionate or the like; amides of beta-(3,5-di-tert-butyl-4-hydroxyphenyl)-propionic acid or the like, or combinations including at least one of the foregoing antioxidants. Antioxidants can generally be used in amounts of from 0.01 to 0.5 parts by weight, based on 100 parts by weight of the total composition, excluding any filler.

In various aspects, the thermoplastic composition can comprise a mold release agent. Exemplary mold releasing agents can include for example, metal stearate, stearyl stearate, pentaerythritol tetrastearate, beeswax, montan wax, paraffin wax, or the like, or combinations including at least one of the foregoing mold release agents. Mold releasing agents are generally used in amounts of from about 0.1 to about 1.0 parts by weight, based on 100 parts by weight of the total composition, excluding any filler.

In an aspect, the thermoplastic composition can comprise a heat stabilizer. As an example, heat stabilizers can include, for example, organo phosphites such as triphenyl phosphite, tris-(2,6-dimethylphenyl)phosphite, tris-(mixed mono- and di-nonylphenyl)phosphite or the like; phosphonates such as dimethylbenzene phosphonate or the like, phosphates such as trimethyl phosphate, or the like, or combinations including at least one of the foregoing heat stabilizers. Heat stabilizers can generally be used in amounts of from 0.01 to 0.5 parts by weight based on 100 parts by weight of the total composition, excluding any filler.

In further aspects, light stabilizers can be present in the thermoplastic composition. Exemplary light stabilizers can include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone or the like or combinations including at least one of the foregoing light stabilizers. Light stabilizers can generally be used in amounts of from about 0.1 to about 1.0 parts by weight, based on 100 parts by weight of the total composition, excluding any filler. The thermoplastic composition can also comprise plasticizers. For example, plasticizers can include phthalic acid esters such as dioctyl-4,5-epoxy-hexahydrophthalate, tris-(octoxycarbonylethyl) isocyanurate, tristearin, epoxidized soybean oil or the like, or combinations including at least one of the foregoing plasticizers. Plasticizers are generally used in amounts of from about 0.5 to about 3.0 parts by weight, based on 100 parts by weight of the total composition, excluding any filler.

Ultraviolet (UV) absorbers can also be present in the disclosed thermoplastic composition. Exemplary ultraviolet absorbers can include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB™ 5411); 2-hydroxy-4-n-octyloxybenzophenone (CYASORB™ 531); 2-[4,6-bis(2,4-dimethylphenyl)-1,3,5-triazin-2-yl]-5-(octyloxy)-phenol (CYASORB™ 1164); 2,2'-(1,4-phenylene)bis(4H-3,1-benzoxazin-4-one) (CYASORB™ UV-3638); 1,3-bis[(2-cyano-3,3-diphenylacryloyl)oxy]-2,2-bis[[(2-cyano-3,3-diphenylacryloyl)oxy]methyl]propane (UVINUL™ 3030); 2,2'-(1,4-phenylene) bis(4H-3,1-benzoxazin-4-one); 1,3-bis[(2-cyano-3,3-diphenylacryloyl)oxy]-2,2-bis[[(2-cyano-3,3-diphenylacryloyl) oxy]methyl]propane; nano-size inorganic materials such as titanium oxide, cerium oxide, and zinc oxide, all with particle size less than 100 nanometers; or the like, or combinations including at least one of the foregoing UV absorbers. UV absorbers are generally used in amounts of from 0.01 to 3.0 parts by weight, based on 100 parts by weight of the total composition, excluding any filler.

The thermoplastic composition can further comprise a lubricant. As an example, lubricants can include for example, fatty acid esters such as alkyl stearyl esters, e.g., methyl stearate or the like; mixtures of methyl stearate and hydrophilic and hydrophobic surfactants including polyethylene glycol polymers, polypropylene glycol polymers, and copolymers thereof for example, methyl stearate and polyethylene-polypropylene glycol copolymers in a suitable solvent; or combinations including at least one of the foregoing lubricants. Lubricants can generally be used in amounts of from about 0.1 to about 5 parts by weight, based on 100 parts by weight of the total composition, excluding any filler.

Anti-drip agents can also be used in the composition, for example a fibril forming or non-fibril forming fluoropolymer such as polytetrafluoroethylene (PTFE). The anti-drip agent can be encapsulated by a rigid copolymer, for example styrene-acrylonitrile copolymer (SAN). PTFE encapsulated in SAN is known as TSAN. In one example, TSAN can comprise 50 wt. % PTFE and 50 wt. % SAN, based on the total weight of the encapsulated fluoropolymer. The SAN can comprise, for example, 75 wt. % styrene and 25 wt. % acrylonitrile based on the total weight of the copolymer. An antidrip agent, such as TSAN, can be used in amounts of 0.1 to 10 parts by weight, based on 100 parts by weight of the total composition, excluding any filler.

As an example, the disclosed composition can comprise an impact modifier. The impact modifier can be a chemically reactive impact modifier. By definition, a chemically reactive impact modifier can have at least one reactive group such that when the impact modifier is added to a polymer composition, the impact properties of the composition (expressed in the values of the IZOD impact strength) are improved. In some examples, the chemically reactive impact modifier can be an ethylene copolymer with reactive functional groups selected from, but not limited to, anhydride, carboxyl, hydroxyl, and epoxy. In further aspects of the present disclosure, the composition can comprise a rubbery impact modifier. The rubber impact modifier can be a polymeric material which, at room temperature, is capable of recovering substantially in shape and size after removal of a force. However, the rubbery impact modifier should typically have a glass transition temperature of less than 0° C. In certain aspects, the glass transition temperature ($T_g$) can be less than −5° C., −10° C., −15° C., with a $T_g$ of less than −30° C. typically providing better performance. Representative rubbery impact modifiers can include, for example, functionalized polyolefin ethylene-acrylate terpolymers, such as ethylene-acrylic esters-maleic anhydride (MAH) or glycidyl methacrylate (GMA). The functionalized rubbery polymer can optionally contain repeat units in its backbone which are derived from an anhydride group containing monomer, such as maleic anhydride. In another scenario, the functionalized rubbery polymer can contain anhydride moieties which are grafted onto the polymer in a post polymerization step. Impact modifiers may include ethylene-ethylacrylate copolymer, Polybutylene tere/iso phthalate-co-polyoxybutylene, or ethylene-methylacrylate-glycidylmethacrylate copolymer, or a combination thereof.

Properties and Articles

In certain aspects, the disclosed composites may exhibit microwave shielding properties that are more desirable when compared to a substantially similar reference composition comprising a carbon powder and in the absence of the disclosed carbon fiber filler. For example, compared to reference formulations including the same mixture of polybutylene terephthalate but including a carbon black powder as an electrically conducting filler (rather than a carbon fiber filler), compositions containing the same amount of carbon fibers (as a weight percent) exhibit the following properties:

- Higher reflection of microwave radiation in the K-band (18-26.5 GHz) and W-band (75-110 GHz);
- Lower transmission of microwave radiation in the K-band (18-26.5 GHz) and W-band (75-110 GHz);
- Higher ranges of Shielding Effectiveness (SE) of microwave radiation in the K-band (18-26.5 GHz), 5-80 dB vs 2-25 dB, and W-band (75-110 GHz), 45-120 dB vs 5-55 dB;
- Almost completely opaque microwave performance (Transmission below about 3%) at the higher frequency W-band (75-110 GHz) for all compositions investigated;
- Almost completely opaque microwave performance (Transmission below about 3%) at the lower frequency K-band (18-26.5 GHz) for formulations containing 4 wt. % carbon fibers and higher.

Plaques molded from the disclosed composites may exhibit certain microwave shielding properties. For example, molded plaques at a thickness of about 0.125 inches (3.175 mm) may reflect at least 45% of incident microwave radiation at frequencies from about 75 GHz to 110 GHz, and at least 30% of incident microwave radiation at frequencies from about 18 and 26.5 GHz. Moreover, it was found that compositions EX1-5 containing carbon fibers reflect more microwave radiation than compositions CE-1 through CE-5 containing carbon powder for all the frequencies investigated in the K-band and W-band, and for the same loadings of carbon powder and carbon fibers (FIGS. 5 through 14). Examples EX-3, EX-4 and EX-5 showed Percent Reflection higher than about 70% in the K-band (18-26.5 GHz), and higher than about 65% in the W-band (75-110 GHz). It was also found that none of the comparative example compositions CE-1 through CE-5 reflects more than about 45% in the K-band (18-26.5 GHz), and more than about 40% in the W-band (75-110 GHz). Such performance may be apparent for molded plaques at thicknesses between 1 mm and 5 mm. Plaques molded from the disclosed composite may exhibit certain attenuation properties.

It was found that a 3.175 mm thick molded sample of the composite exhibited a higher reflection of microwave radiation than a reference composition comprising the same amount of a carbon powder filler rather than the carbon fiber filler, when observed according to a Free Space method, measured at frequencies of 18 to 26.5 GHz and of 75 to 110 GHz.

Composites further comprising a poly(carbonate-siloxane) copolymer with the PBT exhibit further properties. These formulations generally achieved comparative performance with a lower carbon fiber filler content. The Percent Absorbed Power measured in Transmission Mode in the W-band (75-110 GHz) was lower than 55% of the incoming radiation for the compositions with the polyester only and higher loading of carbon fiber, while this value was greater than 55% for compositions which included less carbon fiber but featured the poly(carbonate-siloxane) copolymer. Composites including the poly(carbonate-siloxane) copolymer, having carbon fiber filler present in an amount of from 0.15 wt. % to 2 wt. %, may exhibit a Percent Absorbed Power measured in Transmission mode of at least 70% at 77 GHz. These composites also exhibited an un-notched Izod Impact strength at −30° C. of at least 500 J/m, and a notched Izod Impact strength at −30° C. of at least 45 J/m when measured according to ASTM D256.

The disclosed composites may thus be used to optimize the balance between microwave absorption and microwave reflection so the desired Shielding Effectiveness (a combination of both shielding by absorption and shielding by reflection) can be achieved. The polymer/filler ratio of the disclosed materials may be manipulated so as to modify their electromagnetic response.

In the automotive industry, shielding properties have been employed to protect electronic radar sensors from electromagnetic interference that can damage their normal operation. Metals (aluminum, stainless steel) are the most common materials for microwave (MW) shielding, but they are heavy, expensive and demand of complex processing to be shaped into a final part. Carbon fillers trap or deflect MW radiation in enclosure walls protecting the electronic sensors inside the cavity. When used in under-the-hood automotive enclosures, for example, polymer-carbon composites can protect the radar sensors located inside the enclosure by preventing the electromagnetic radiation from an outside source to deteriorate the sensor's electronic performance. Also, carbon-containing elastomers such as silicone, polyurethane and nitrile rubber, among several others, can be used as high-loss protective blankets to attenuate the resonant frequencies generated by the normal operation of the sensors inside the cavity. Relatively high dielectric constant and electrical conductivity, and large dielectric and magnetic losses are some of the features required for materials used in microwave shielding. The present disclosure provides PBT-carbon fiber composites that can be used to protect radar sensors from damaging electromagnetic interference. The polymer/filler ratio of these composites can be manipulated so the relative amounts of microwave absorption and reflection can be adjusted to maximize the Shielding Effectiveness of these materials.

Radar shielding materials are sold commercially mainly in the form of elastomer-based flexible sheets or blankets, liquid paints, and closed-cell polymer foams. The present disclosure provides thermoplastic-based carbon fiber-filled materials that are rigid and that maintain a certain shape when molded, and they can be used as internal or external components to reflect electromagnetic radiation in automotive sensor applications. Disclosed herein are thermoplastic-based carbon fiber-filled materials that can be used as internal or external components to trap electromagnetic radiation in automotive sensor applications. As the disclosed compositions include thermoplastic resins rather than elastomeric resins, they may exhibit a greater modulus that comparable elastomeric resins. Further aspects of the present disclosure include components of an automotive radar sensor (plate, enclosure, cover, among other components), which is molded from a material comprising a polymer and a carbon fiber filler, with the molded part having certain design, average thickness, microwave shielding efficiency, absorption bandwidth, shielding effectiveness, and Attenuation.

Still another embodiment of the present disclosure is an article (radar sensor, camera, ECU, among other articles) comprising a molded part made from a radar shielding material, with such molded part having at least two openings to allow the transmission of microwave radiation between a transmitting antenna and a receiving antenna located in the printed circuit board of the sensor. In various aspects, the present disclosure relates to articles comprising the compositions herein. The compositions can be molded into useful shaped articles by a variety of means such as injection molding, extrusion, rotational molding, blow molding and thermoforming to form articles. The compositions can be useful in the manufacture of articles requiring materials with good flow, good impact strength, and good dielectric performance. In various aspects, the compositions may be useful for as well as electrically conducting purposes.

The advantageous characteristics of the compositions disclosed herein can make them appropriate for an array of uses.

Methods for Making the Composite

Aspects of the disclosure further relate to methods for making a composite including a thermoplastic polymer component. In many aspects, the compositions can be prepared according to a variety of methods. The compositions of the present disclosure can be blended, compounded, or otherwise combined with the aforementioned ingredients by a variety of methods involving intimate admixing of the materials with any additional additives desired in the formulation. Because of the availability of melt blending equipment in commercial polymer processing facilities, melt processing methods can be used. In various further aspects, the equipment used in such melt processing methods can include, but is not limited to, co-rotating and counter-rotating extruders, single screw extruders, co-kneaders, disc-pack processors and various other types of extrusion equipment. In a further aspect, the extruder is a twin-screw extruder. In various further aspects, the composition can be processed in an extruder at temperatures from about 180° C. to about 350° C., particularly 250° C. to 300° C.

Methods may further comprise processing the composite to provide a plaque of a desired thickness. Plaques can be extruded, injection molded, compression molded or injection-compression molded, and may have a thickness between about 0.5 mm and 6 mm. Other processes could also be applied to the thin thermoplastic film, including but not limited to, lamination, co-extrusion, thermo-forming or hot pressing. In such aspects, further layers of other materials (for example, other thermoplastic polymer layers, metallic layers, etc.) could be combined with the composite. Various combinations of elements of this disclosure are encompassed by this disclosure, for example, combinations of elements from dependent claims that depend upon the same independent claim.

Definitions

It is also to be understood that the terminology used herein is for the purpose of describing particular aspects only and is not intended to be limiting. As used in the specification and in the claims, the term "comprising" can include the embodiments "consisting of" and "consisting essentially of" Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a thermoplastic polymer component" includes mixtures of two or more thermoplastic polymer components. As used herein, the term "combination" is inclusive of blends, mixtures, alloys, reaction products, and the like.

In one aspect, "substantially free of" can be less than about 0.5 weight percent (wt. %). In another aspect, substantially free of can be less than about 0.1 wt. %. In another aspect, substantially free of can be less than about 0.01 wt. %. In yet another aspect, substantially free of can be less than about 100 ppm. In yet another aspect, substantially free can refer to an amount, if present at all, below a detectable level. For example, the carbon fiber filler or composite may be free of or substantially free of carbon nanotubes, carbon platelets, or carbon powder.

As used herein, the Shielding Effectiveness of a material, is the result of its reflection, absorption, and internal reflection losses. In its most generic definition, Shielding Effectiveness (SE) of a material describes the ability of the material to reduce the electromagnetic field around it by blocking the field with barriers or shields made of conductive and/or magnetic materials. In these cases, the shielding can be effected by either absorbing or reflecting part or all of the electromagnetic radiation impinging on the material to be protected. The ability of the shielding material to block this harmful radiation usually depends on the frequency (or wavelength) of the incoming radiation, thickness of the protective layer, and it is expected to vary with the electrical conductivity and/or dielectric properties of the material. See, M. H. Al-Saleh, W. H. Saadeh, U. Sundararaj, "*EMI shielding effectiveness of carbon based nanostructured polymeric materials: A comparative study*," CARBON 60, PP. 146-156, 2013. It is represented by the following equation:

$$SE_T(\text{dB}) = SE_A + SE_R + SE_M$$

For shielding efficiencies>10 dB, the Shielding Effectiveness due to multiple reflections $SE_M$ is usually negligible. Therefore, the Total Shielding Effectiveness is reduced to:

$$SE_T(\text{dB}) = SE_A + SE_R\text{, where}$$

$SE_A$ and $SE_R$ are calculated directly from S-parameters measurements using a vector network analyzer as follows:

$$SE_R = -10\log(1-|S_{11}|^2)$$

and $$SE_A = -10\log\left(\frac{|S_{21}|^2}{1-|S_{11}|^2}\right)$$

In the above equations, $S_{11}$ is the Scattering Parameter for Reflection, and $S_{21}$ is the Scattering Parameter for Transmission. A Shielding Effectiveness below 20 dB is considered minimal, with most applications requiring SE above 35 dB or so.

Ranges can be expressed herein as from one value (first value) to another value (second value). When such a range is expressed, the range includes in some aspects one or both of the first value and the second value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the designated value, approximately the designated value, or about the same as the designated value. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise. As used herein, the terms "optional" or "optionally" means that the subsequently described event or circumstance can or cannot occur, and that the description includes instances where said event or circumstance occurs and instances where it does not. For example, the phrase "optional additional processes" means that the additional processes can or cannot be included and that the description includes methods that both include and that do not include the additional processes.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the disclosure. Thus, if there are a variety of additional steps that can be performed it is understood that each of these additional steps can be performed with any specific aspect or combination of aspects of the methods of the disclosure.

References in the specification and concluding claims to parts by weight of a particular element or component in a composition or article, denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5 and are present in such ratio regardless of whether additional components are contained in the compound.

A weight percent of a component, unless specifically stated to the contrary, is based on the total weight of the formulation or composition in which the component is included. The terms "residues" and "structural units", used in reference to the constituents of the polymers, are synonymous throughout the specification.

As used herein the terms "weight percent," "wt %," and "wt. %," which can be used interchangeably, indicate the percent by weight of a given component based on the total weight of the composition, unless otherwise specified. That is, unless otherwise specified, all wt. % values are based on the total weight of the composition. It should be understood that the sum of wt. % values for all components in a disclosed composition or formulation is 100.

Unless otherwise stated to the contrary herein, all test standards are the most recent standard in effect at the time of filing this application. Each of the materials disclosed herein are either commercially available and/or the methods for the production thereof are known to those of skill in the art. It is understood that the compositions disclosed herein have certain functions. Disclosed herein are certain structural requirements for performing the disclosed functions and it is understood that there are a variety of structures that can perform the same function that are related to the disclosed structures, and that these structures will typically achieve the same result.

ASPECTS OF THE DISCLOSURE

The present disclosure pertains to and includes at least the following aspects.

Aspect 1A. A composite comprising: from about 50 wt. % to about 99 wt. % of a thermoplastic resin, wherein the thermoplastic resin comprises a polyester; and from about 0.1 wt. % to 15 wt. % of a carbon fiber filler, wherein the carbon fiber has a bulk density of at least 500 g/l and a volume electrical resistivity of less than 2,000 μΩ·cm, with individual filaments that have a length-to-diameter ratio of at least 300, wherein a 3.175 mm thick molded sample of the composite exhibits a Transmission of less than 15% of incident microwave radiation when observed according to a Free Space method, measured at frequencies of 75 to 110 GHz, wherein a 3.175 mm thick molded sample of the composite exhibits a Percent Reflected Power measured in Transmission mode of at least 15% when observed according to a Free Space method at frequencies from 75 GHz to 110 GHz, and wherein the combined weight percent value of all components does not exceed 100 wt. %, and all weight percent values are based on the total weight of the composite.

Aspect 1B. A composite consisting essentially of: from about 50 wt. % to about 99 wt. % of a thermoplastic resin, wherein the thermoplastic resin comprises a polyester; and from about 0.1 wt. % to 15 wt. % of a carbon fiber filler, wherein the carbon fiber has a bulk density of at least 500 g/l and a volume electrical resistivity of less than 2,000 μΩ·cm, with individual filaments that have a length-to-diameter ratio of at least 300, wherein a 3.175 mm thick molded sample of the composite exhibits a Transmission of less than 15% of incident microwave radiation when observed according to a Free Space method, measured at frequencies of 75 to 110 GHz, wherein a 3.175 mm thick molded sample of the composite exhibits a Percent Reflected Power measured in Transmission mode of at least 15% when observed according to a Free Space method at frequencies from 75 GHz to 110 GHz, and wherein the combined weight percent value of all components does not exceed 100 wt. %, and all weight percent values are based on the total weight of the composite.

Aspect 2. The composite according to any one of aspects 1A-1B, wherein the polyester comprises a polyalkylene terephthalate polymer.

Aspect 3. The composite according to any one of aspects 1A-2, wherein the polyester comprises polybutylene terephthalate.

Aspect 4. The composite according to any one of aspects 1A-3, wherein a 3.175 mm thick molded plaque comprising the composite transmits less than about 5% of incident microwave radiation at frequencies from 75 GHz to 110 GHz.

Aspect 5. The composite according to any one of aspects 1A-4, wherein a 3.175 mm thick molded sample of the composite exhibits a Total Shielding Effectiveness of between 40 and 120 dB when measured according to a Free Space method at frequencies from 75 GHz to 110 GHz.

Aspect 6. The composite according to any one of aspects 1A-5, wherein a 3.175 mm thick molded sample of the composite exhibits a Total Shielding Effectiveness greater than that of a reference composition comprising the same amount of a carbon powder filler rather than the carbon fiber filler measured according to a Free Space method at frequencies from 75 GHz to 110 GHz.

Aspect 7. The composite according to any one of aspects 1A-5, wherein a 3.175 mm thick molded sample of the composite exhibits a higher reflection of microwave radiation than a reference composition comprising the same amount of a carbon powder filler rather than the carbon fiber filler, when observed according to a Free Space method, measured at frequencies of 18 to 26.5 GHz and of 75 to 110 GHz.

Aspect 8. The composite according to any one of aspects 1A-7, wherein individual filaments of the carbon fiber filler are 5 to 10 mm long.

Aspect 9. The composite according to any one of aspects 1A-7, wherein individual filaments of the carbon fiber filler have a length-to-diameter ratio of at least 500.

Aspect 10. The composite according to any one of aspects 1A-7, wherein the carbon fiber filler has an aspect ratio greater than 300:1.

Aspect 11. The composite according to any one of aspects 1A-7, wherein the carbon fiber filler has an aspect ratio greater than 200:1.

Aspect 12. The composite according to any one of aspects 1A-7, wherein the carbon fiber filler has an aspect ratio greater than 50:1.

Aspect 13. The composite according to any one of aspects 1A-12, wherein the carbon fiber filler is not carbon nanotubes, carbon platelets, or carbon powder.

Aspect 14. The composite according to any one of aspects 1A-12, wherein the composite is free of or substantially free of carbon nanotubes, carbon platelets, or carbon powder.

Aspect 15. The composite according to any one of aspects 1A-14, wherein the thermoplastic resin further comprises a poly(carbonate-siloxane) copolymer, wherein the carbon fiber filler is present in an amount of from 0.15 wt. % to 2 wt. %, and wherein a 3.175 mm molded sample of the composite exhibits a Percent Absorbed Power of at least 55% measured in Transmission mode of incident microwave radiation when observed according to a Free Space method, measured at frequencies of 75 to 110 GHz.

Aspect 16. The composite according to aspect 15, wherein the thermoplastic resin exhibits an un-notched Izod Impact strength at −30° C. of at least 500 J/m, and a notched Izod Impact strength at −30° C. of at least 45 J/m when measured according to ASTM D256.

Aspect 17. The composite according to aspect 15, wherein the thermoplastic resin exhibits an un-notched Izod Impact strength at 23° C. of at least 600 J/m, and a notched Izod Impact strength at 23° C. of at least 60 J/m when measured according to ASTM D256.

Aspect 18. The composite according to any one of aspects 15-17, wherein the carbon-fiber based filler is present in an amount of between about 0.12 wt. % and about 0.98 wt. % wherein the Percent Absorbed Power measured in Transmission mode is at least 70% when observed at 77 GHz frequency.

Aspect 19. The composite according to any one of aspects 15-18, wherein the thermoplastic resin further comprises a poly(carbonate-siloxane) copolymer having a siloxane content of at least 5 wt. % based on the total weight of the poly(carbonate-siloxane) copolymer, and wherein the composite has a total siloxane content of between 1 wt. % and 15 wt. % based on the total weight of the composite.

Aspect 20. An article comprising the composite of any one of aspects 1A-19, wherein the article is an autoradar sensor for electromagnetic radiation.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (for example, amounts, and temperature), but some errors and deviations should be accounted for. Unless indicated otherwise, parts are parts by weight, temperature is in ° C. or is at ambient temperature, and pressure is at or near atmospheric. Unless indicated otherwise, percentages referring to composition are in terms of wt. %.

There are numerous variations and combinations of mixing conditions, e.g., component concentrations, extruder design, feed rates, screw speeds, temperatures, pressures and other mixing ranges and conditions that can be used to optimize the product purity and yield obtained from the described process. Only reasonable and routine experimentation will be required to optimize such process conditions.

Example I. Comparing PBT Resins Containing a Carbon Powder or a Carbon Fiber Microwave Shielding Filler Various composite samples were prepared. The comparative formulations are presented in Table 1. Comparative samples included a blend of polyethylene terephthalate Valox™ 195 and Valox™ 315, with a (Valox™ 195/Valox™ 315) ratio equal to 1.408, and a carbon black powder (where the carbon black powder is Ensaco™ 360 G) and are designated CE-1 through CE-5.

TABLE 1

| Comparative formulations | | | | | | |
|---|---|---|---|---|---|---|
| Item | Unit | CE-1 | CE-2 | CE-3 | CE-4 | CE-5 |
| Valox ™ 195 1001 (C9060) | % | 57.31 | 56.14 | 54.97 | 53.80 | 52.63 |
| Valox ™ 315 1001 (C601) | % | 40.69 | 39.86 | 39.03 | 38.20 | 37.37 |
| Ensaco ™ 360 G Carbon Powder | % | 2 | 4 | 6 | 8 | 10 |
| | % | 100 | 100 | 100 | 100 | 100 |
| Valox ™ 195/Valox ™ 315 Ratio | | 1.408 | 1.408 | 1.408 | 1.408 | 1.408 |
| Total Resin | | 98 | 96 | 94 | 92 | 90 |

Inventive samples EX-1 through EX-5 are shown in Table 2 below and combine a blend of polybutylene terephthalate resin and carbon fiber filler. The carbon fiber filler is TENAX J HT C493 6 mm chopped fiber. As it was the case with the comparative formulations, the (Valox™ 195/Valox™ 315) ratio of the inventive formulations is also equal to 1.408.

TABLE 2

| Inventive formulations | | | | | | |
|---|---|---|---|---|---|---|
| Item | Unit | EX-1 | EX-2 | EX-3 | EX-4 | CE-5 |
| Valox ™ 195 1001 (C9060) | % | 57.31 | 56.14 | 54.97 | 53.80 | 52.63 |
| Valox ™ 315 1001 (C601) | % | 40.69 | 39.86 | 39.03 | 38.20 | 37.37 |
| Tenax ™ J HT C493 6 MM Chopped Carbon Fiber | % | 2 | 4 | 6 | 8 | 10 |
| | % | 100 | 100 | 100 | 100 | 100 |
| Valox ™ 195/Valox ™ 315 Ratio | | 1.408 | 1.408 | 1.408 | 1.408 | 1.408 |
| Total Resin | | 98 | 96 | 94 | 92 | 90 |

Composite samples were prepared on a 40 mm diameter, co-rotating intermeshing twin-screw extruder, where the ingredients of the different formulations were added to the extruder, melted, mixed and pushed out of the extruder through a five-hole die plate for the comparative formulations, and a six-hole die plate for the inventive formulations. The extruder was operated at 200 rpm of screw speed for most of the formulations, and at a rate of 29-45 Kg/hr (0.029-0.045 ton/hr) for the comparative formulations and of 68 Kg/hr (0.068 ton/hr) for the inventive formulations. The extruder torque was maintained from about 35% to about 65% of the maximum torque. The extruder barrel temperature was maintained between about 185-200° C. (upstream, in the vicinity of the extruder's feed throat) and about 250° C. (downstream, in the vicinity of the extruder's die plate). The die plate temperature was maintained at about 250° C., and the temperature of the melt exiting the extruder was measured at about 275° C.

Figure 1B:
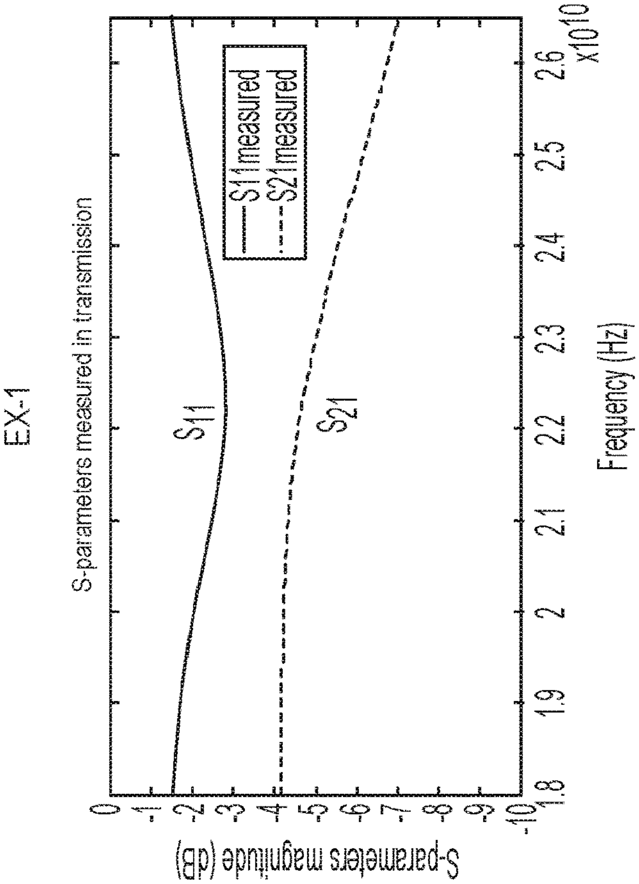

Scattering parameters $S_{11}$ for reflection and $S_{21}$ for transmission (both measured and calculated) in the K-band were observed. Note that $S_{11}$ at 0 dB is a perfect reflector (no reflection loss, like a metallic plate, such as stainless steel, aluminum, etc); while $S_{21}$ at 0 dB is a perfect transmitter (no transmission loss, such as air). FIGS. 1A and 1B show Scattering parameters for CE-1 and EX-1 in the K-band (18-26.5 GHz), respectively. As shown, EX-1 shows less Reflection Loss than CE-1, and CE-1 shows less Transmission Loss than EX-1 in the K-band, suggesting that EX-1 is a better microwave reflector while CE-1 is a better microwave transmitter in this frequency range.

Figure 2A:
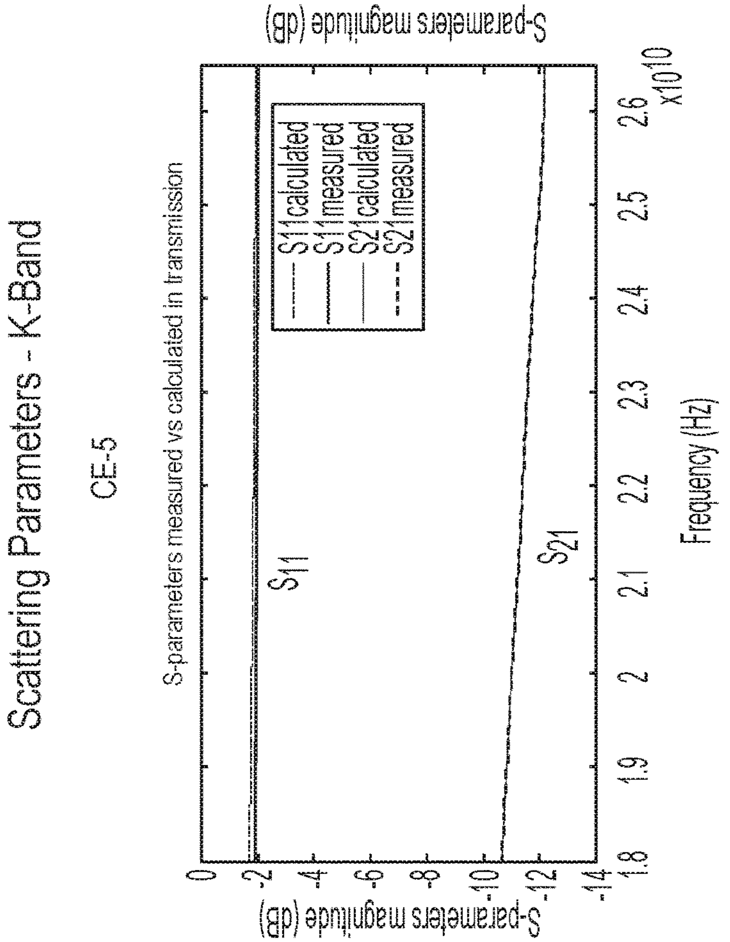
FIGS. 2A and 2B show the Scattering parameters in the K-Band (18-26.5 GHz) for CE-5 and EX-5, respectively.
Figure 2B:
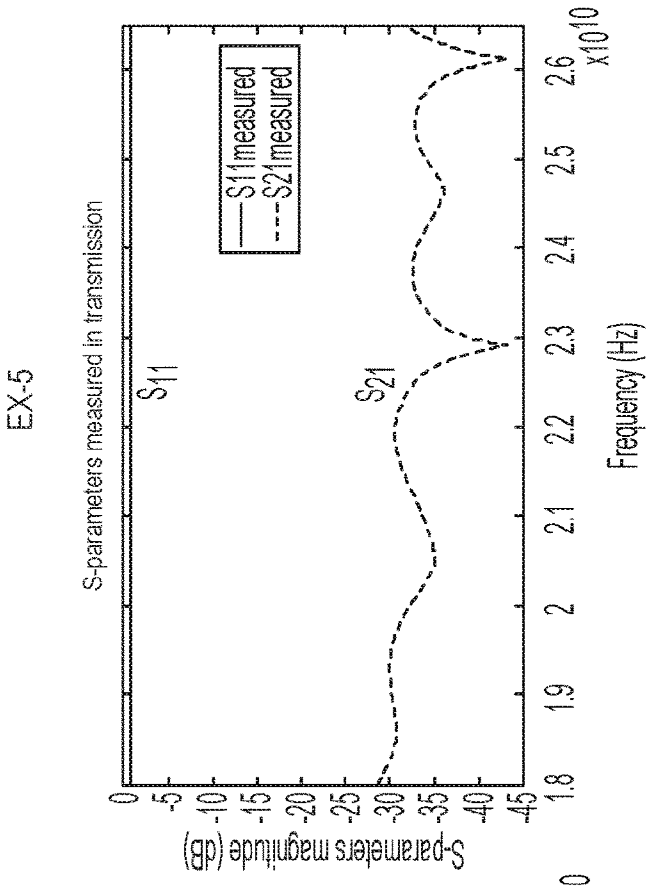
Figure 3A:
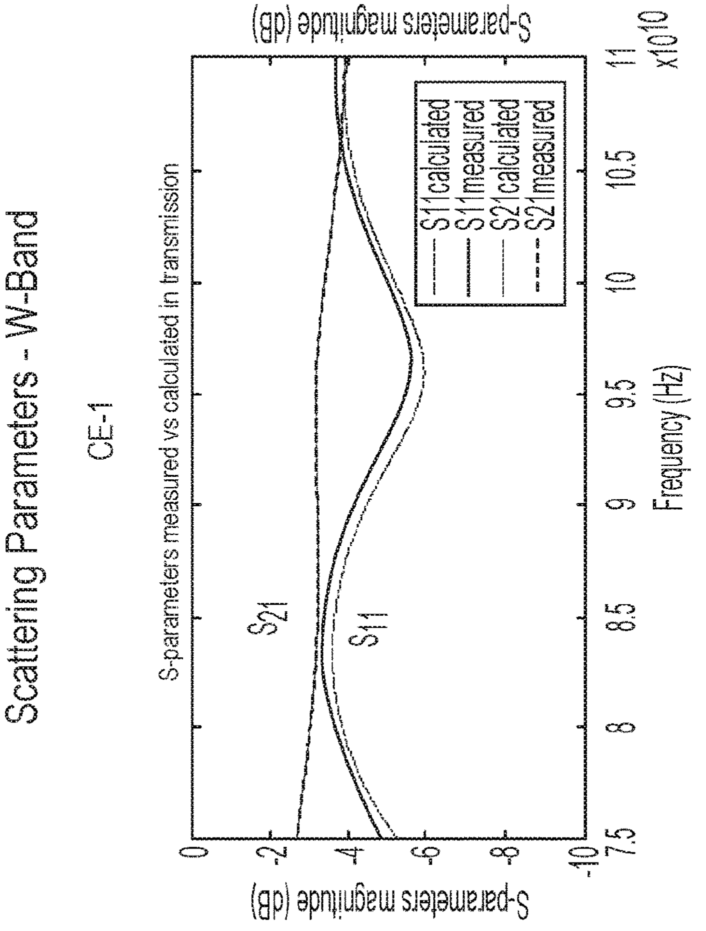
FIGS. 3A and 3B show the Scattering parameters in the W-Band (75-110 GHz) for CE-1 and EX-1, respectively.
Figure 3B:
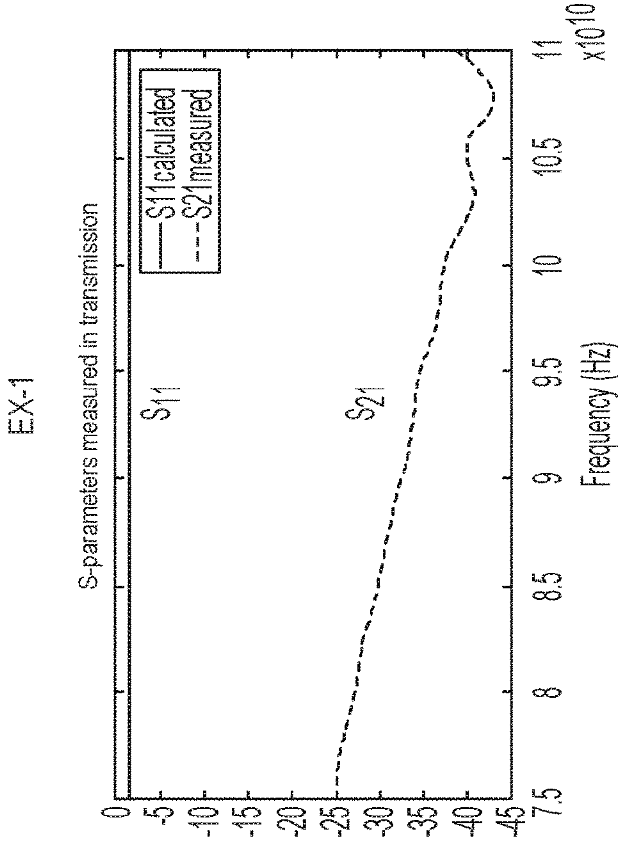
Figure 4B:
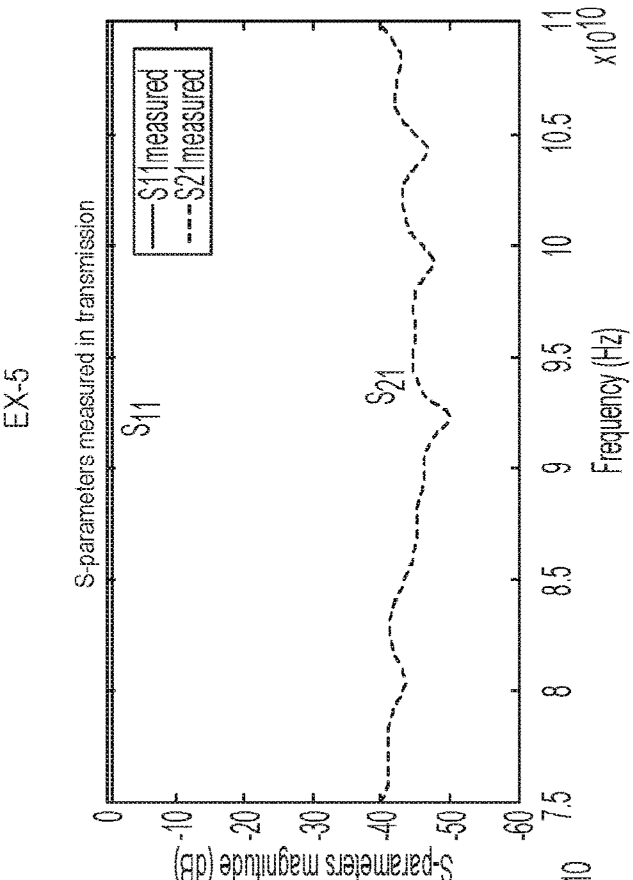
FIGS. 4A and 4B show the Scattering parameters in the W-Band (75-110 GHz) for CE-5 and EX-5, respectively.
Figure 4A:
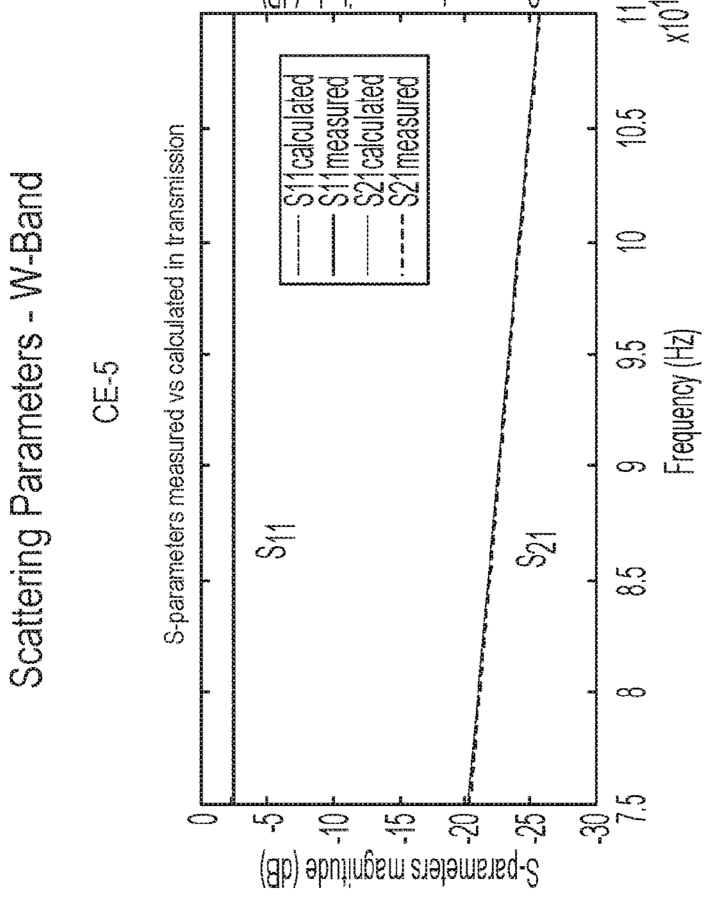

FIGS. 2A and 2B show scattering parameters in the K-Band (18-26.5 GHz) for CE-5 and EX-5, respectively. As shown, EX-5 shows less Reflection Loss than CE-5, and CE-5 shows less Transmission Loss than EX-5 in the K-band, suggesting that EX-5 is a better microwave reflector while CE-5 is a better microwave transmitter in this frequency range. FIGS. 3A and 3B show Scattering parameters in the W-Band (75-110 GHz) for CE-1 and EX-1, respectively. As shown, EX-1 shows less Reflection Loss than CE-1, and CE-1 shows less Transmission Loss than EX-1 in the W-band, suggesting that EX-1 is a better microwave reflector while CE-1 is a better microwave transmitter in this frequency range. Also, for CE-1, the values of $S_{11}$ vary at the different frequencies investigated. FIGS. 4A and 4B show Scattering parameters in the W-Band (75-110 GHz) for CE-5 and EX-5, respectively. The Scattering parameter for Reflection, $S_{11}$, measured for CE-5 and EX-5 both approach 0 dB across the frequencies observed, but $S_{11}$ for EX-5 is closer to 0 dB than $S_{11}$ for CE-5 suggesting that EX-5 is a better microwave reflector than CE-5 in this frequency range. Similarly, since $S_{21}$ for CE-5 is closer to the 0 dB line than EX-5, then CE-5 is a better microwave transmitter than EX-5 in the W-band frequency range.

Figure 5A:
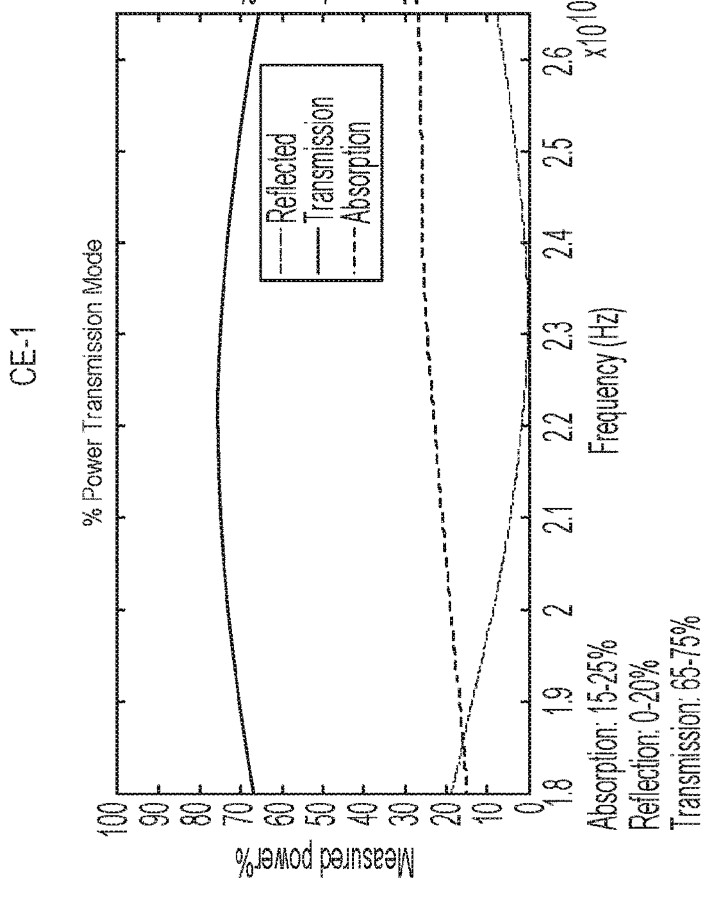
FIGS. 5A and 5B show the Percent Power in Transmission Mode in the K-Band (18-26.5 GHz) for CE-1 and EX-1, respectively.
Figure 5B:
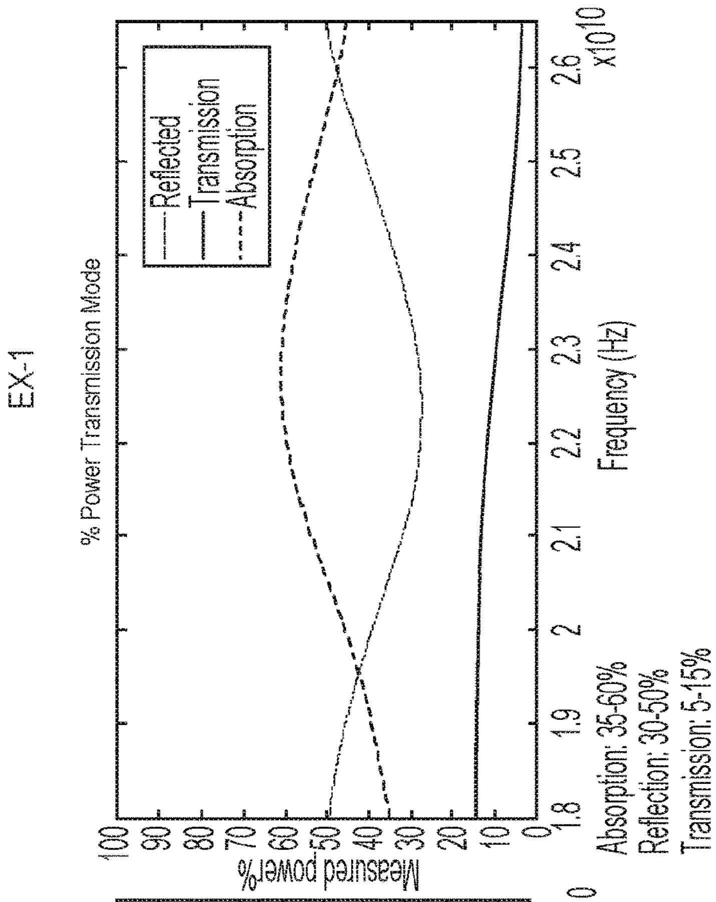

Percent Power in Transmission mode in the K-band (18-26.5 GHz) and W-band (75-110 GHz) were also observed. FIGS. 5A and 5B are a graphical representation of the Percent Power in Transmission mode in the K-Band for CE-1 and EX-1, respectively. The sum of Absorption, Reflection and Transmission at each frequency has to amount to 100% of the incoming MW radiation. In Transmission mode, some transmission through the sample is blocked naturally by the presence of high levels of carbon particles dispersed in the polymer, thus acting to block any passage of microwave energy from the sample to the receiving antenna in very much the same way as a metal plate acts to block through-radiation when using the Metal-backed Reflection Mode of measurement. As this figure shows, Transmission through the comparative sample CE-1 was about 65-75% while that of the inventive sample EX-1 was about 5-15% when observed in the K-band (18-26.5 GHz). EX-1 also exhibited greater microwave Absorption in Transmission mode (compare 15-25% in CE-1 to ~35-60% in EX-1) when observed in the K-band. Microwave Reflection was also higher in EX-1 (about 30 to 50%) compared to CE-1 (about 0 to 20%) for all the frequencies investigated in the K-band.

Figure 6A:
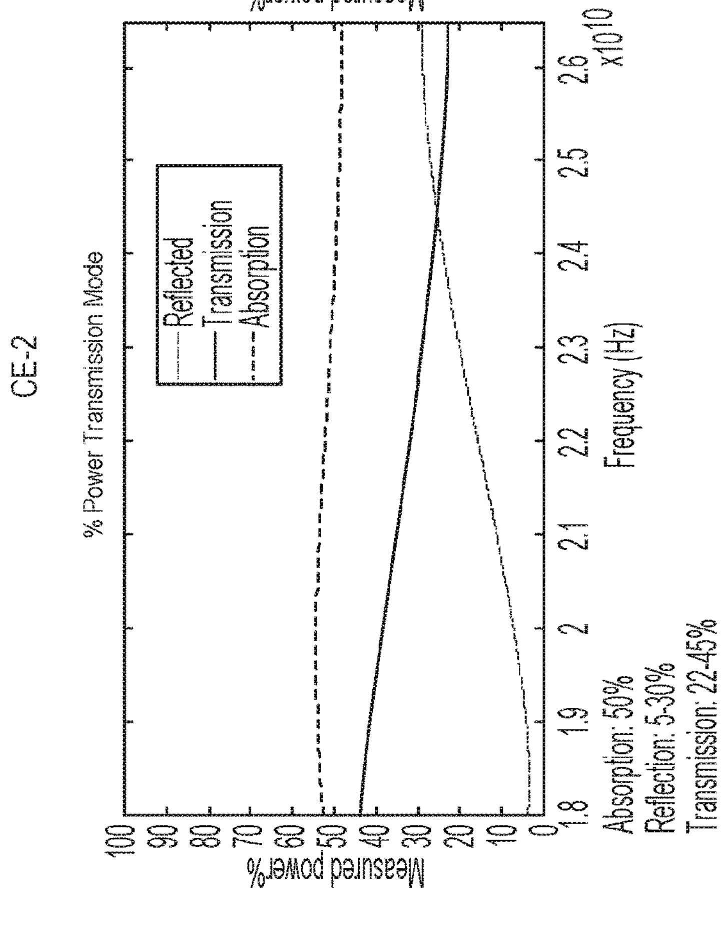
FIGS. 6A and 6B show the Percent Power in Transmission Mode in the K-Band (18-26.5 GHz) for CE-2 and EX-2, respectively.
Figure 6B:
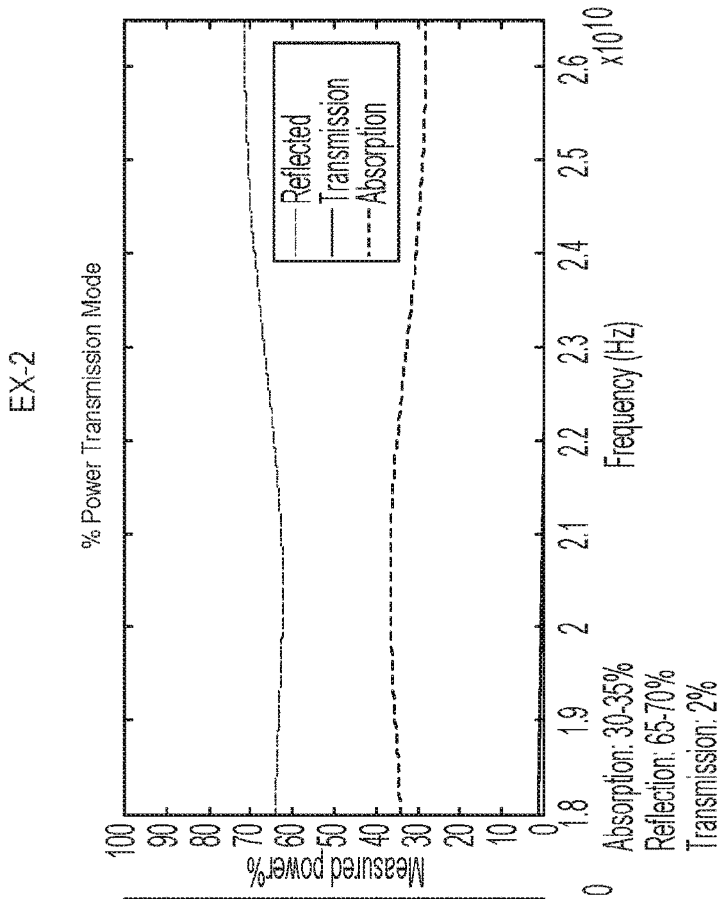
Figure 7A:
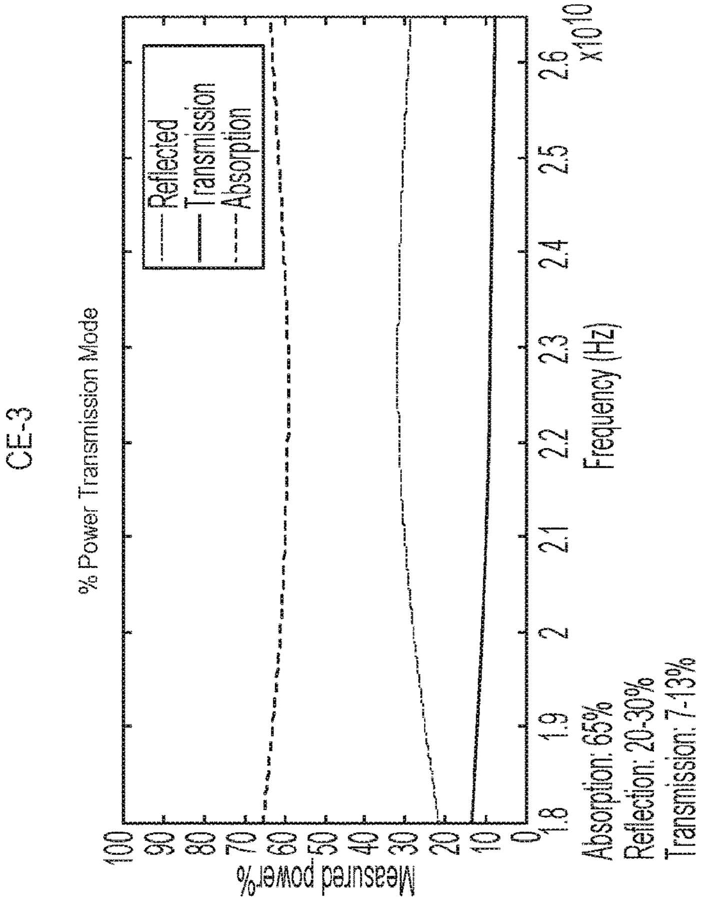
FIGS. 7A and 7B show the Percent Power in Transmission Mode in the K-Band (18-26.5 GHz) for CE-3 and EX-3, respectively.
Figure 7B:
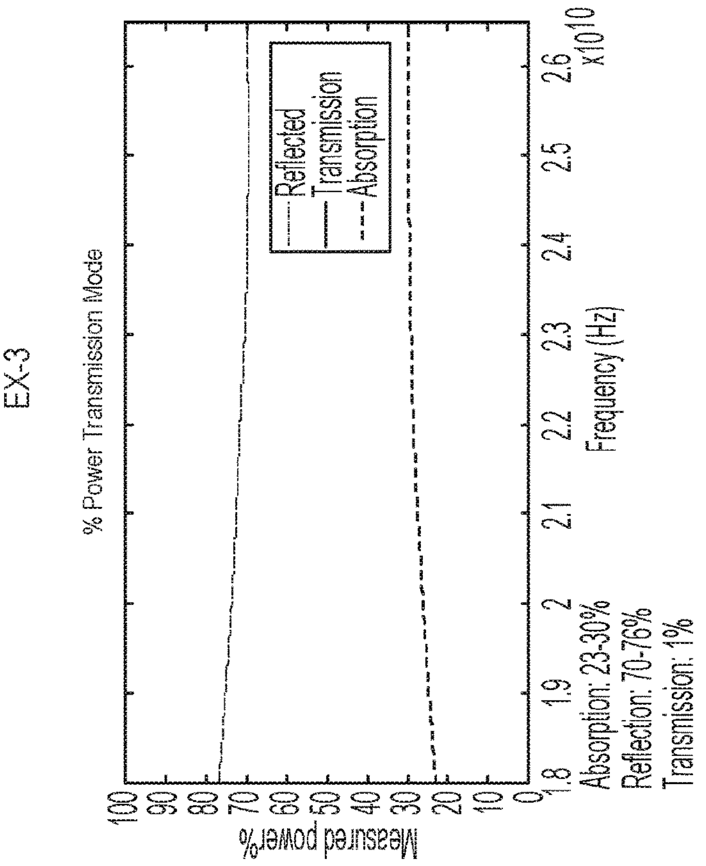

FIGS. 6A and 6B show Percent Power in Transmission Mode in the K-Band for CE-2 and EX-2, respectively. Similarly, Transmission is far less for EX-2 (about 2%) compared to the comparative sample CE-2 (about 22%-45%). FIGS. 7A and 7B show Percent Power in Transmission Mode in the K-Band for CE-3 and EX-3, respectively. Percent Transmission for EX-3 has reduced significantly to about 1% or less while Percent Transmission for CE-3 remains at between about 7% and 13%. Also, microwave Absorption is higher and microwave Reflection is lower for comparative sample CE-3 compared to inventive sample EX-3 when the concentration of carbon filler in both compositions has been kept the same.

Figures 8A, 8B:
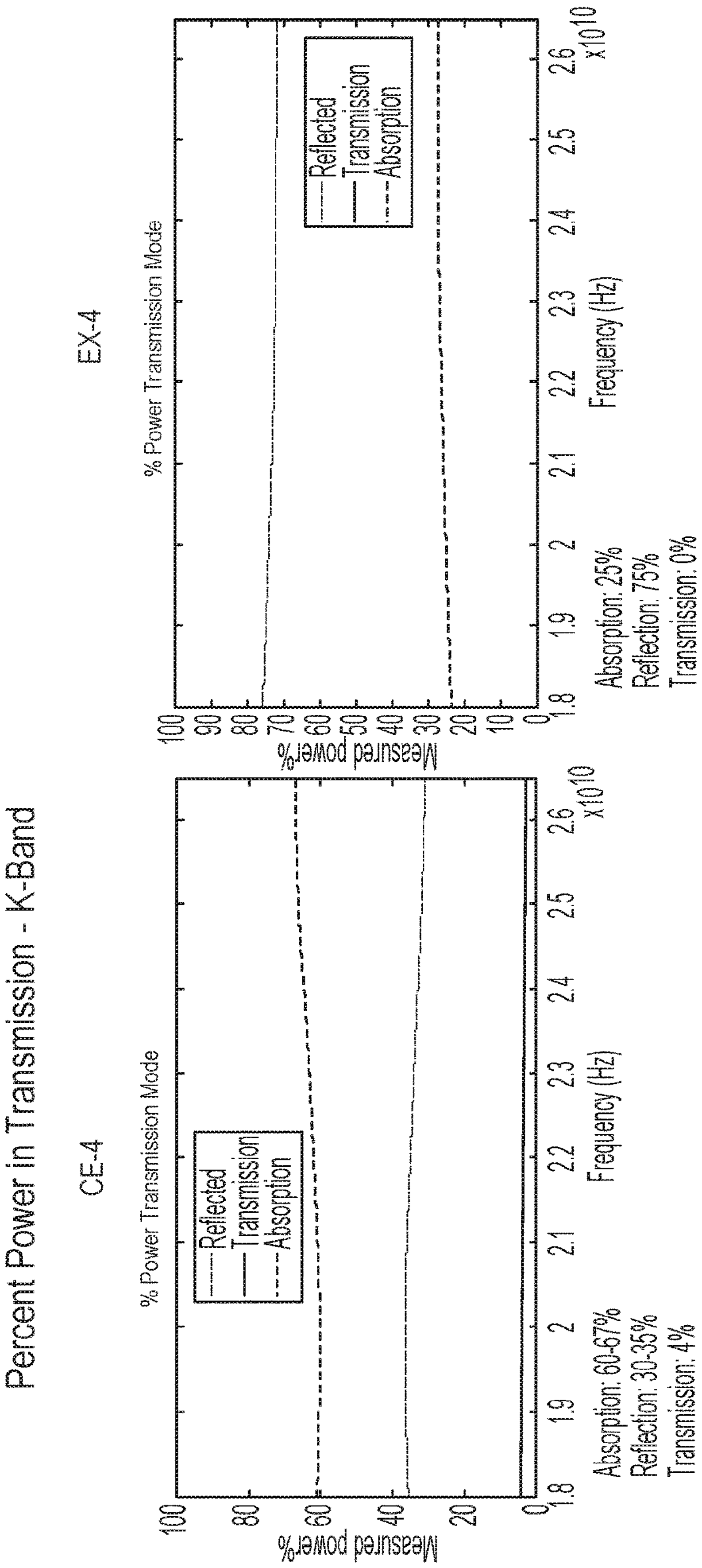
FIGS. 8A and 8B show the Percent Power in Transmission Mode in the K-Band (18-26.5 GHz) for CE-4 and EX-4, respectively.
Figure 9A:
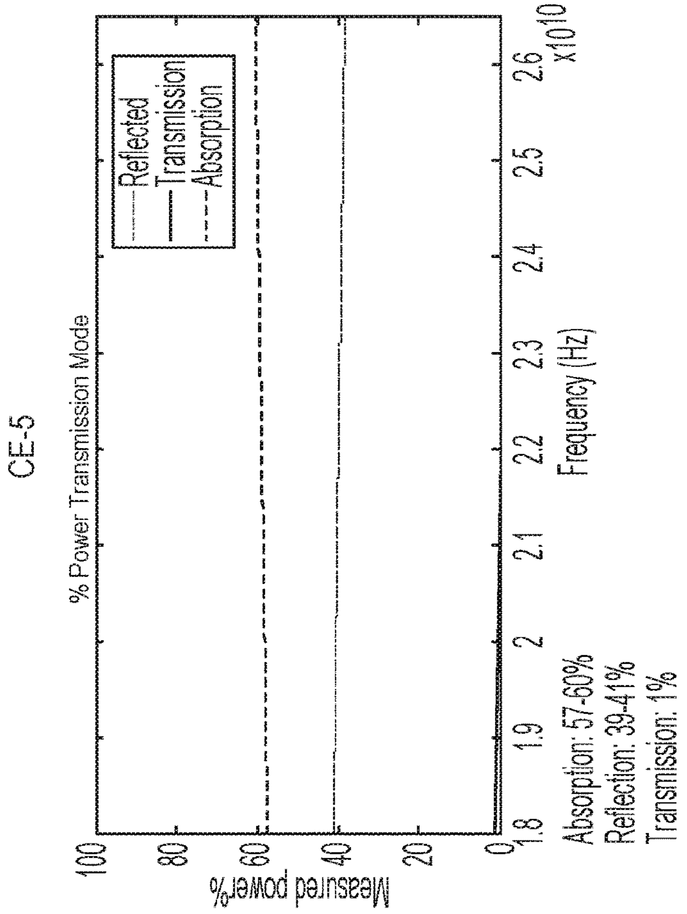
FIGS. 9A and 9B show the Percent Power in Transmission Mode in the K-Band (18-26.5 GHz) for CE-5 and EX-5, respectively.
Figure 9B:
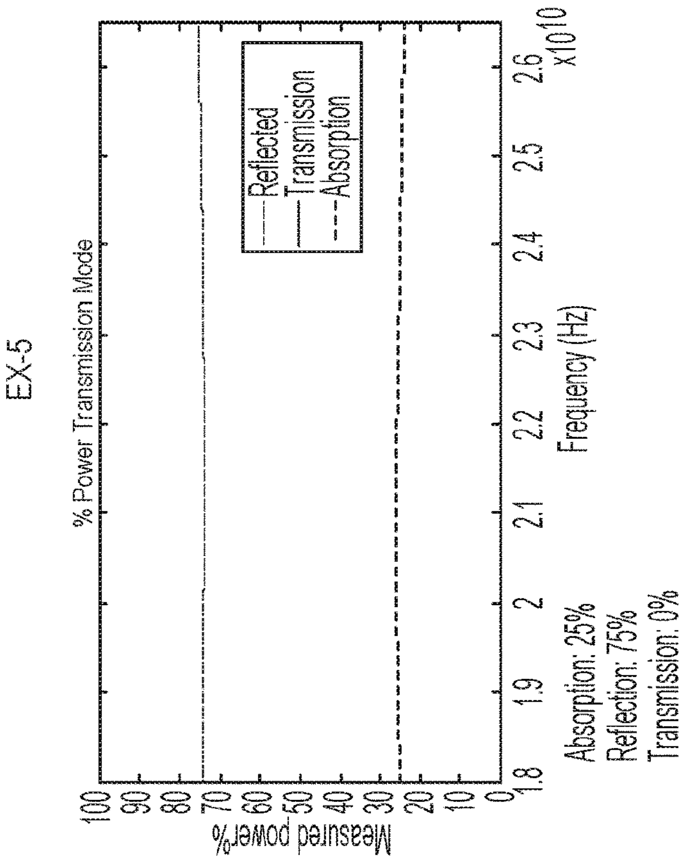
Figure 10B:
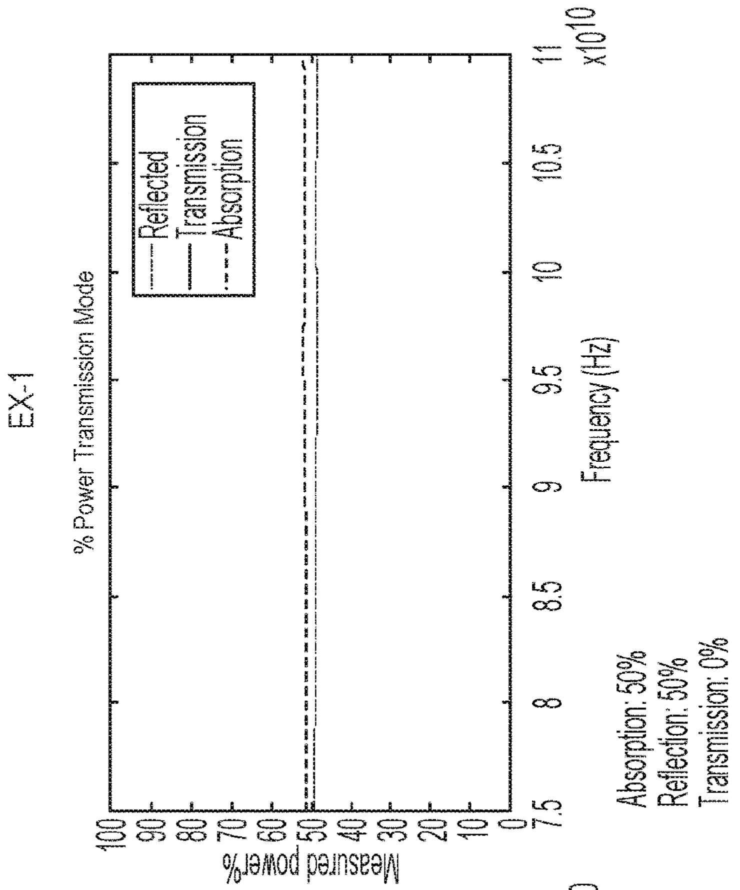
FIGS. 10A and 10B show the Percent Power in Transmission Mode in the W-Band (75-110 GHz) for CE-1 and EX-1, respectively.
Figure 10A:
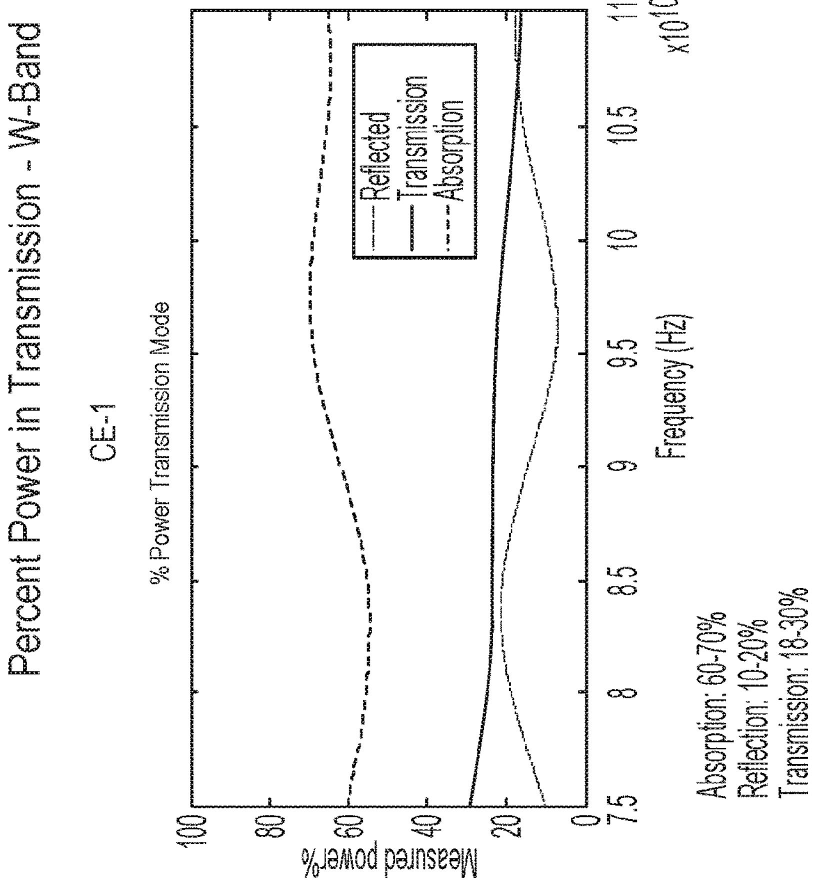
Figure 11B:
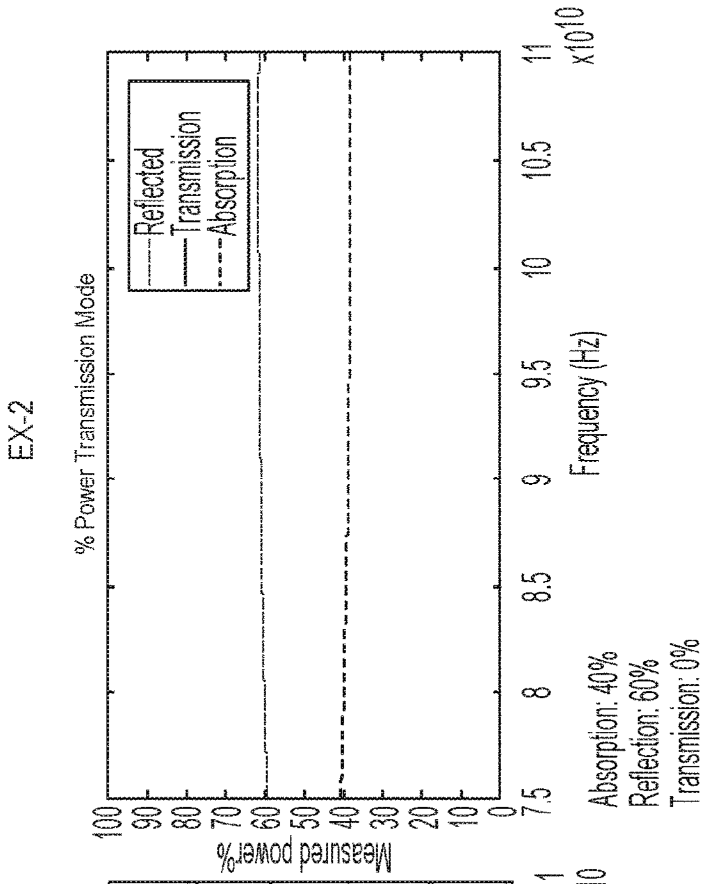
FIGS. 11A and 11B show the Percent Power in Transmission Mode in the W-Band (75-110 GHz) for CE-2 and EX-2, respectively.
Figure 11A:
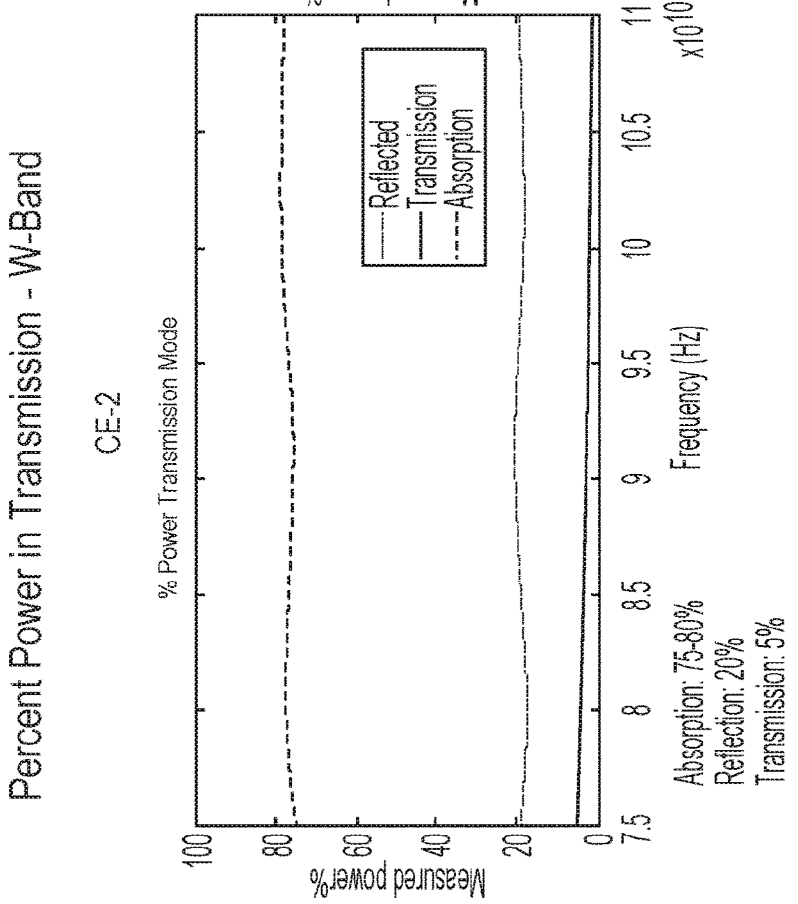
Figure 12A:
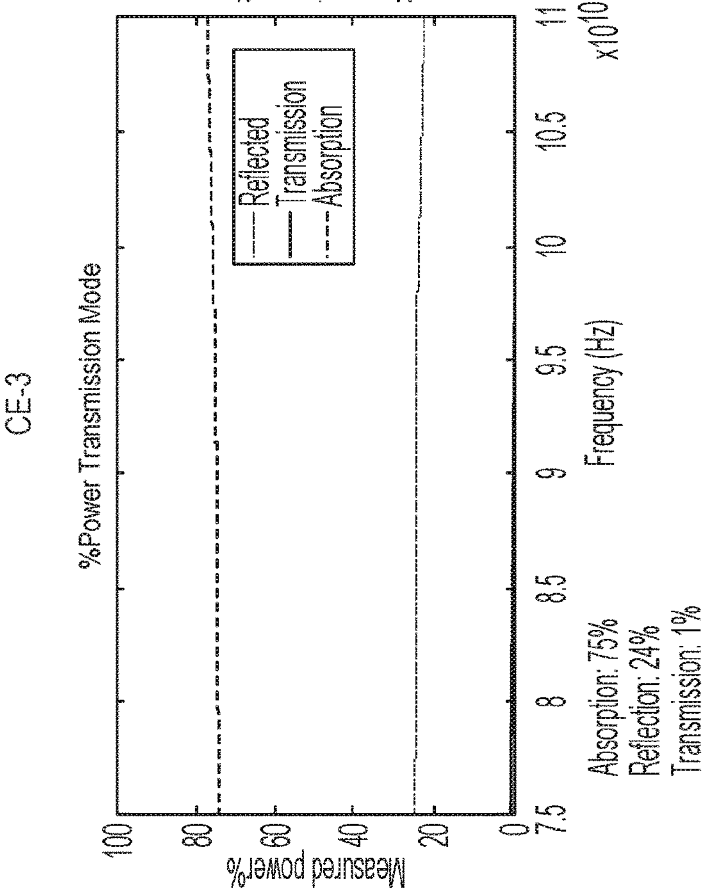
FIGS. 12A and 12B show the Percent Power in Transmission Mode in the W-Band (75-110 GHz) for CE-3 and EX-3, respectively.
Figure 12B:
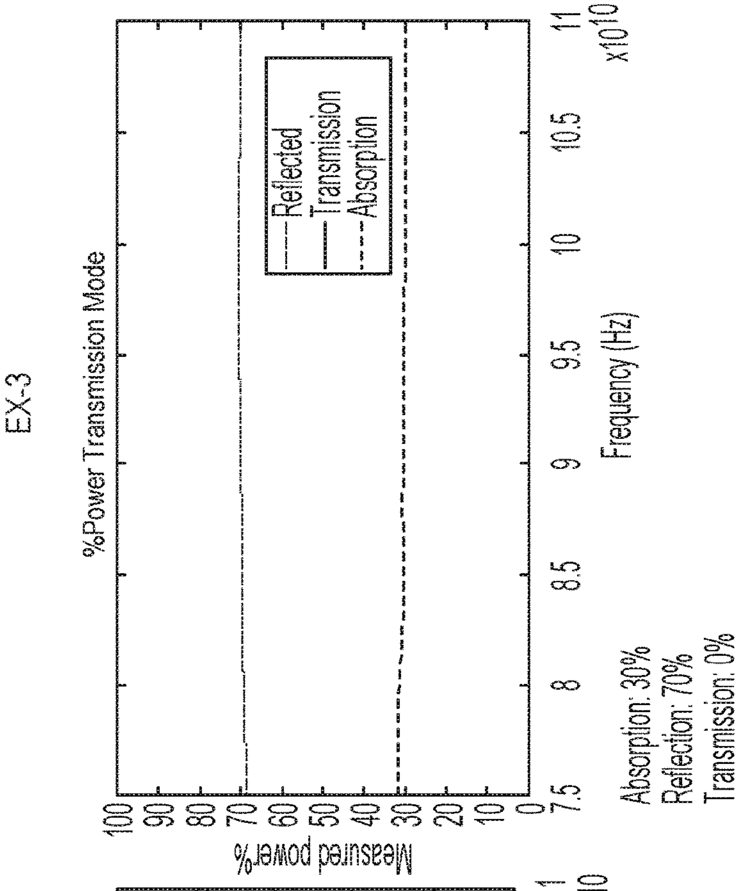
Figure 13A:
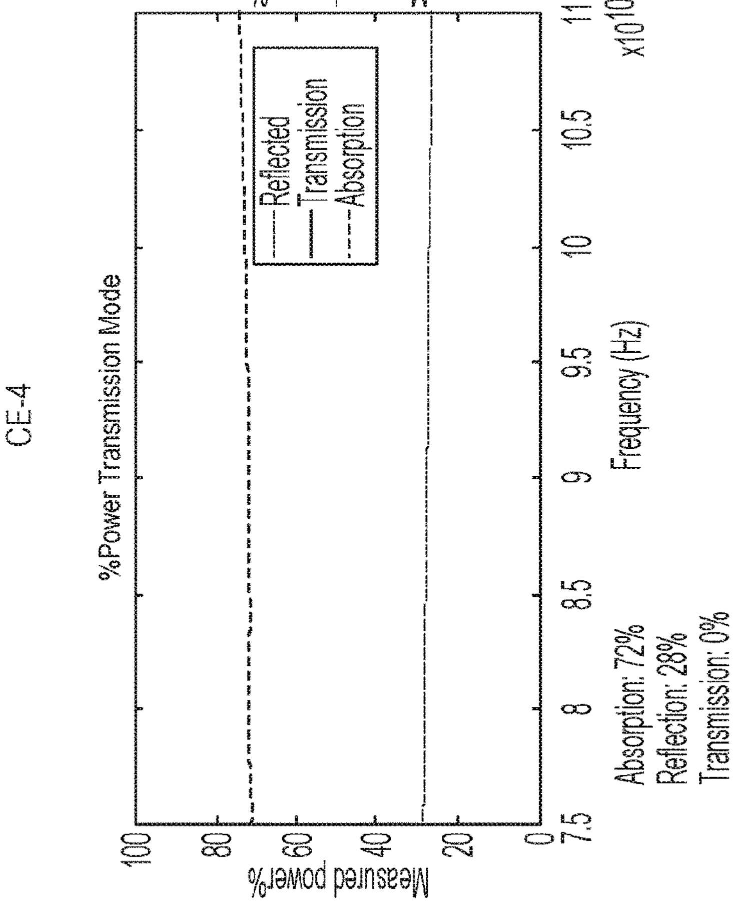
FIGS. 13A and 13B show the Percent Power in Transmission Mode in the W-Band (75-110 GHz) for CE-4 and EX-4, respectively.
Figure 13B:
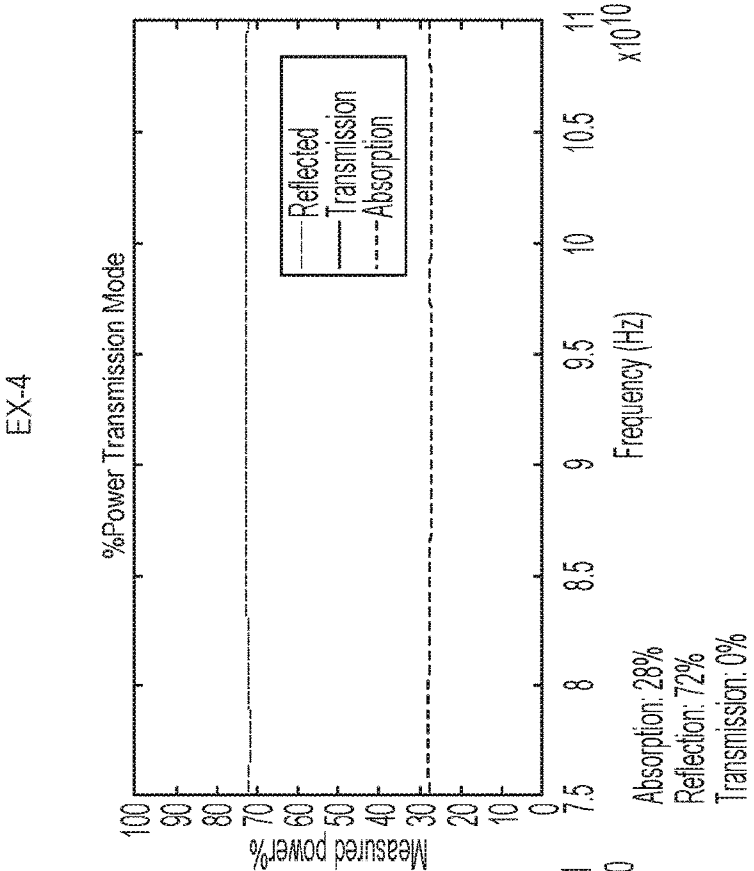
Figure 14B:
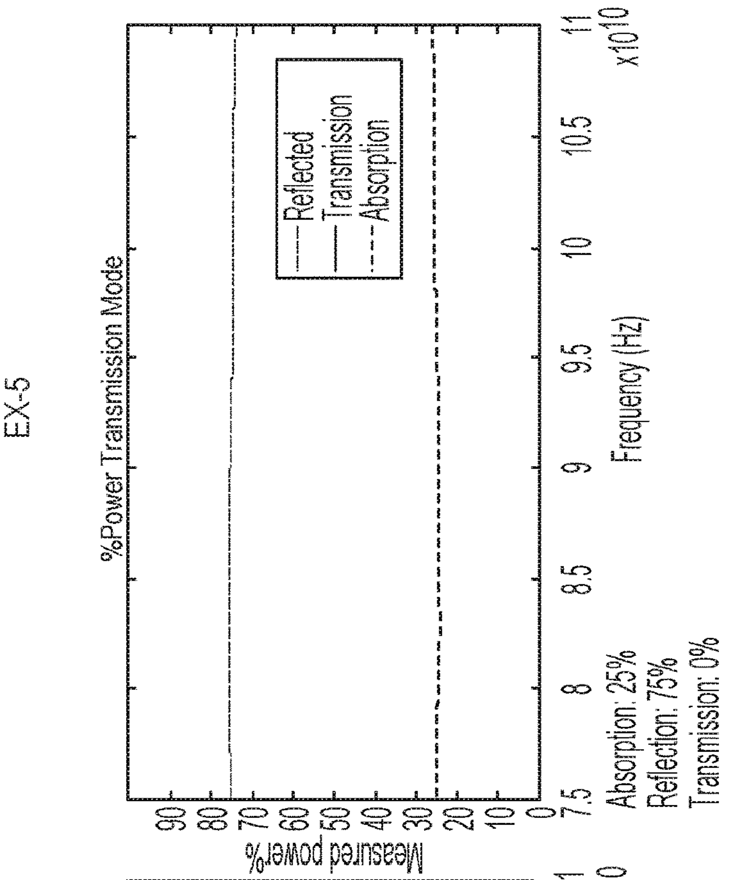
FIGS. 14A and 14B show the Percent Power in Transmission Mode in the W-Band (75-110 GHz) for CE-5 and EX-5, respectively.
Figure 14A:
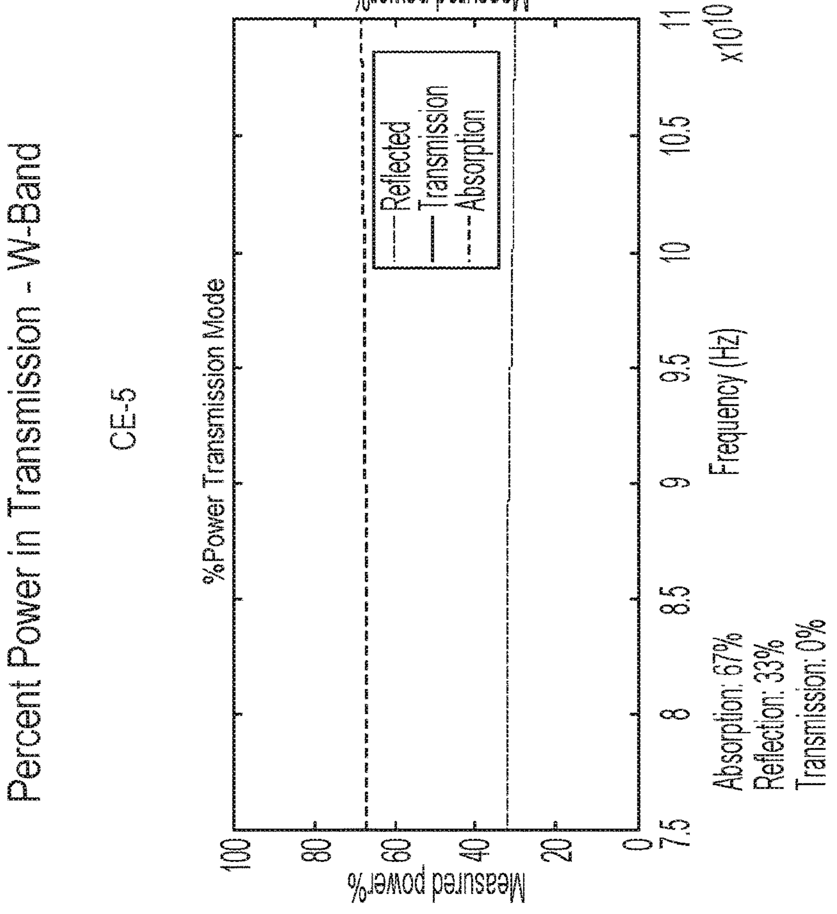

FIGS. 8A and 8B are a graphical representation of the Percent Power measured in Transmission Mode in the K-Band (18-26.5 GHz) for CE-4 and EX-4, respectively. Transmission has decreased to almost zero for inventive sample EX-4 having 8 wt. % chopped carbon fiber, and therefore the sum of Absorption and Reflection accounts for almost 100% of the amount of radiation impinging on the sample. Absorption of the carbon powder sample remains high at about 60% to 67%, while Absorption of the carbon fiber sample stays at about 25%. These trends are consistent for CE-5 and EX-5 shown in FIGS. 9A and 9B, respectively, that show Percent Power in Transmission Mode in the K-Band (18-26.5 GHz). These trends were also observed in higher frequencies of the W-band. FIGS. 10A and 10B show Percent Power in Transmission Mode in the W-Band (75-110 GHz) for CE-1 and EX-1, respectively. At higher frequencies, inventive sample EX-1 having only 2 wt. % chopped carbon fiber has almost 0% Transmission with Absorption and Reflection almost evenly split at about 50% each. Transmission is also almost 0% for inventive sample EX-2 shown in FIG. 11B (see CE-2 in FIG. 11A). FIGS. 12A and 12B show Percent Power in Transmission Mode in the W-Band (75-110 GHz) for CE-3 and EX-3, respectively. As the graphs show, microwave Absorption is higher in comparative sample CE-3 compared to inventive sample EX-3, while microwave Reflection is higher for EX-3 at a carbon filler loading of 6 wt. % (powder in CE-3 vs. fiber in EX-3). FIGS. 13A and 13B show Percent Power in Transmission Mode in the W-Band (75-110 GHz) for CE-4 and EX-4, respectively. CE-4 and EX-4 continue the preceding trend of higher microwave Absorption and lower microwave Reflection for the comparative sample than for the inventive sample at 8 wt. % carbon filler loading. It is worth mentioning that while the % Absorption/% Reflection ratio for comparative sample CE-4 is about 70/30, it is also about 70/30 the ratio of % Reflection/% Absorption for inventive sample EX-4 when the same carbon filler loading is considered. FIGS. 14A and 14B show Percent Power in Transmission Mode measured in the W-Band (75-110 GHz) for CE-5 and EX-5, respectively. Once again, microwave Absorption is greater for the comparative sample CE-5 than for the inventive sample EX-5 at the same carbon filler content. Microwave Transmission is negligible for both samples. It is also worth mentioning that the Percent Reflected Power measured in the W-band (75-110 GHz) of the five inventive compositions containing chopped carbon fibers as the microwave trapping filler increased from about 50% in EX-1 (2 wt. % filler) to about 60% in EX-2 (4 wt. % filler) to about 70% in EX-3 (6 wt. % filler) to about 72% in EX-4 (8 wt. % filler) to about 75% in EX-5 (10 wt. % filler).

These values suggest the disclosed composites can be used to optimize the relative amount of microwave absorption and reflection of the composition in a given frequency range. The polymer/filler ratio of the disclosed materials may be manipulated so as to modify their electromagnetic response. For example, microwave Transmission may be modified between 15% and almost 0%, and microwave Reflection may be modified between 30 and 75% when these resins are tested in the K-band. The polymer/carbon-fiber filler ratio directly affects the value of the ratio of Reflected to Absorbed microwave energy in the high-frequency W-band from 50%/50% in EX-1 (2 wt. % carbon fiber loading) to 75%/25% in EX-5 (10 wt. % carbon fiber loading).

Figure 15A:
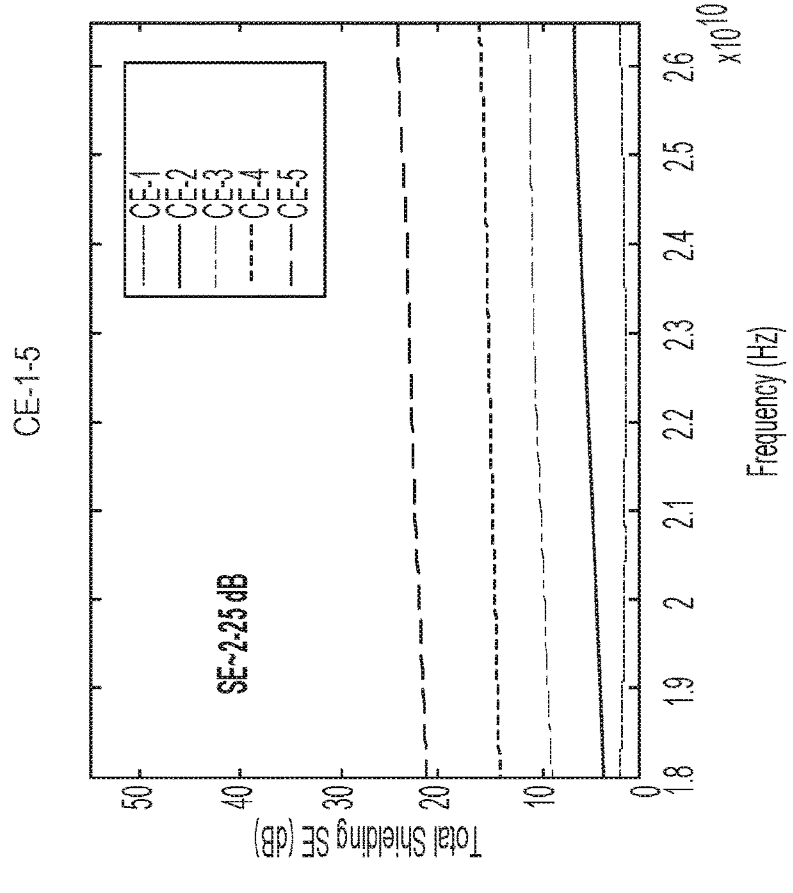
FIGS. 15A and 15B show the Total Shielding Effectiveness in the K-Band (18-26.5 GHz) for CE-1 to CE-5 and EX-1 to EX-5, respectively.
Figure 15B:
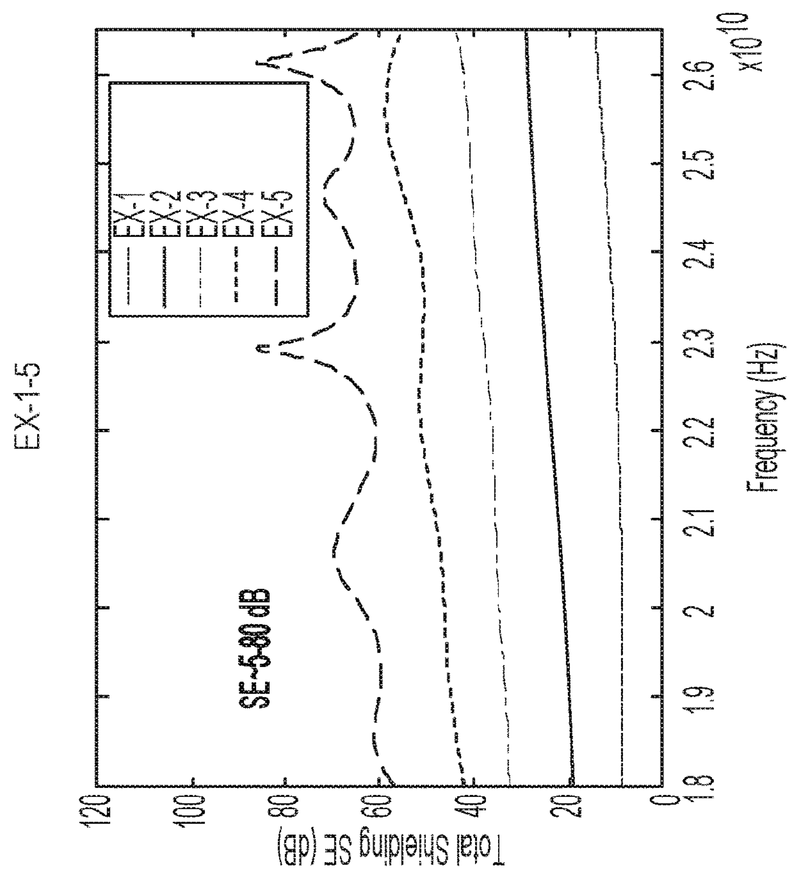
Figure 16B:
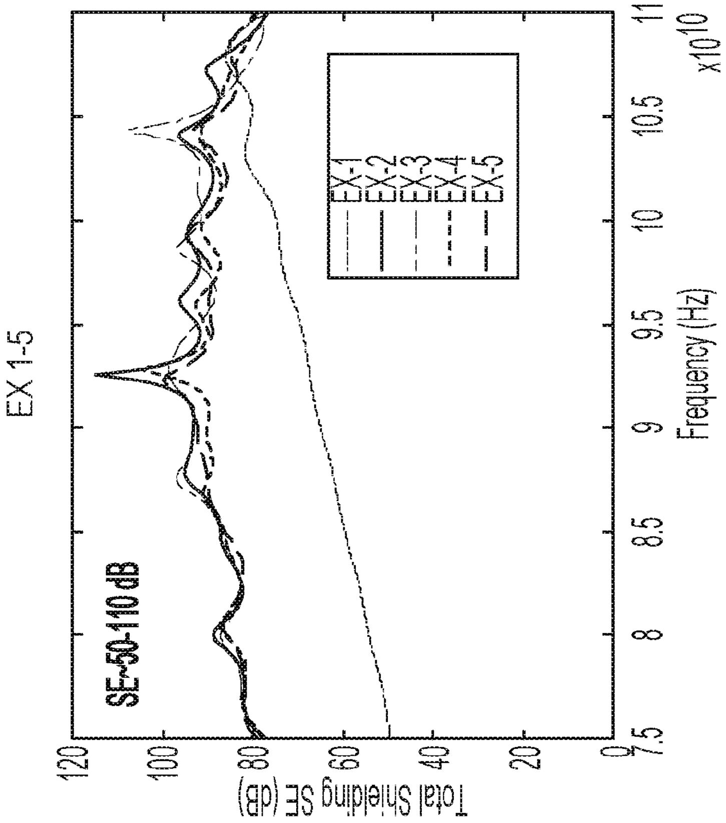
FIGS. 16A and 16B show the Total Shielding Effectiveness in the W-Band (75-110 GHz) for CE-1 to CE-5 and EX-1 to EX-5, respectively.
Figure 16A:
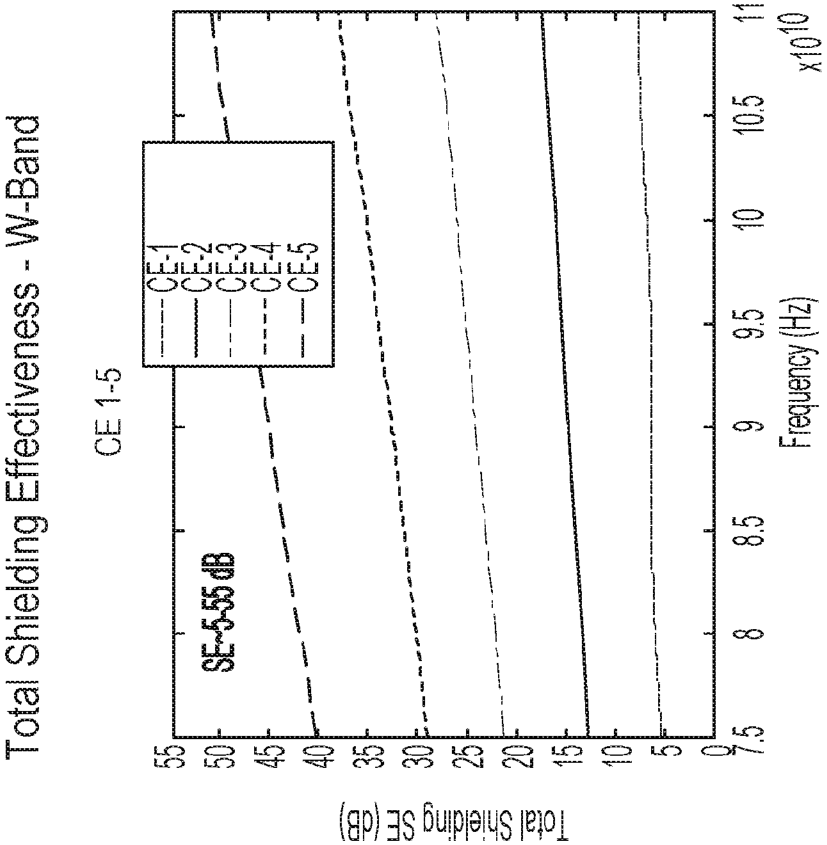

The Shielding Effectiveness describes the combined effect of microwave Absorption and Reflection of the material. FIGS. 15A and 15B are a graphical representation of the Total Shielding Effectiveness in the K-band (18-26.5 GHz) for CE-1 through CE-5 and EX-1 through EX-5, respectively. FIG. 15A shows that the Total Shielding Effectiveness of comparative compositions CE-1 through CE-5 varied from about 2 dB to about 25 dB when observed in the K-band. Similarly, FIG. 15B shows that the Total Shielding Effectiveness of inventive compositions EX-1 through EX-5 varied from about 5 dB to about 80 dB when observed in the K-band. FIGS. 16A and 16B show Total Shielding Effectiveness in the W-Band (75-110 GHz) for CE-1 through CE-5 and EX-1 through EX-5, respectively. As these graphs show, the Shielding Effectiveness of the comparative compositions CE-1 through CE-5 varied between about 5 dB and 55 dB, while the Shielding Effectiveness of the inventive compositions EX-1 through EX-5 varied between about 50 dB and 110 dB. As these results show, the Shielding Effectiveness, which is a combination of the amount of microwave radiation that is either absorbed or reflected by the material, is much higher in the inventive compositions compared with the comparative compositions when the same amount of carbon filler, powder or fibers, in the formulation is considered. These results showed that this seems to be the case for both of the two frequency ranges investigated, the K-band (18-26.5 GHz) and the W-band (75-110 GHz).

Figure 17A:
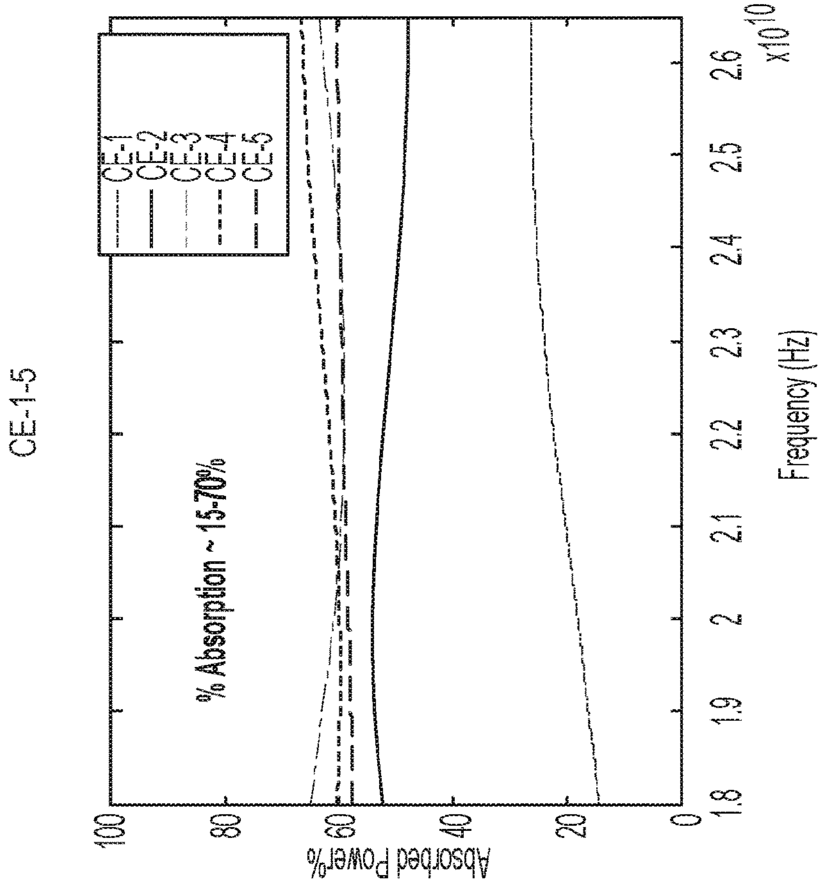
FIGS. 17A and 17B show the Percent Absorbed Power in Transmission Mode in the K-Band (18-26.5 GHz) for CE-1 to CE-5 and EX-1 to EX-5, respectively.
Figure 17B:
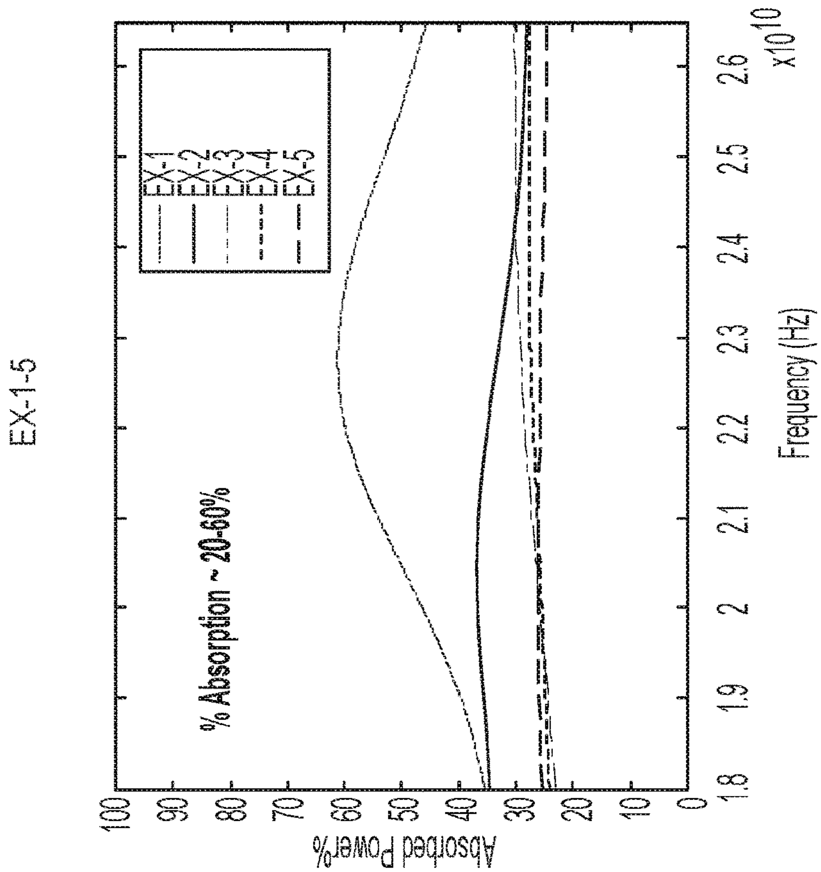
Figure 18A:
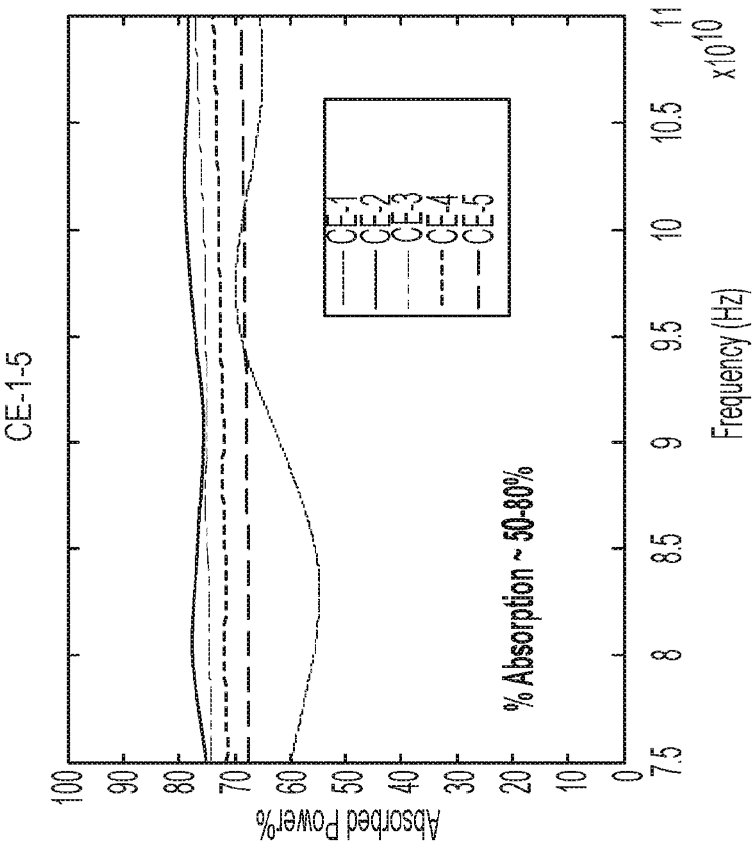
FIGS. 18A and 18B show the Percent Absorbed Power in Transmission Mode in the W-Band (75-110 GHz) for CE-1 to CE-5 and EX-1 to EX-5, respectively.
Figure 18B:
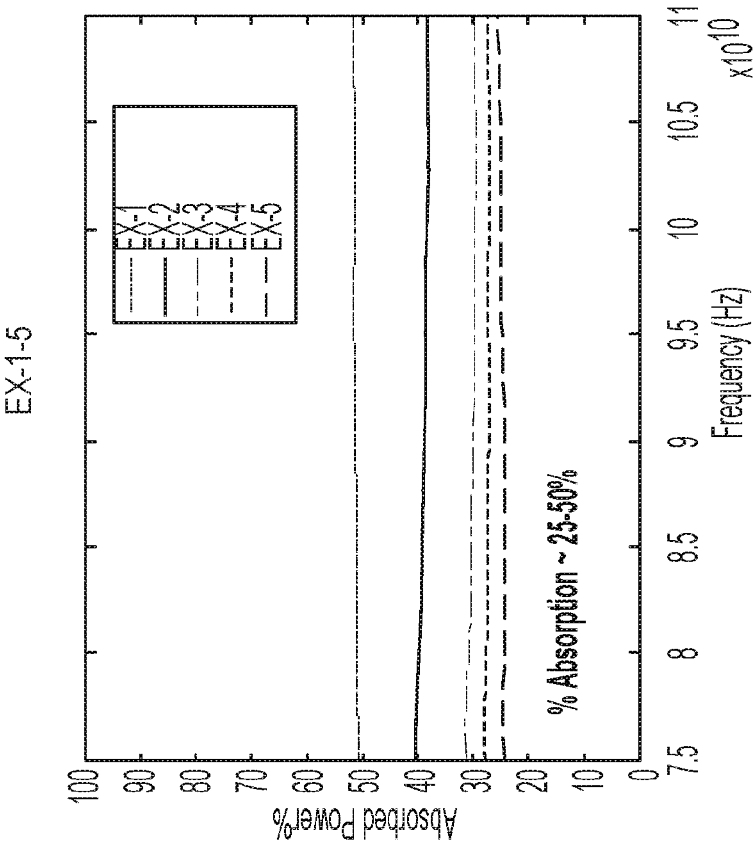

The Percent Absorbed Power in Transmission Mode observed in the K-band (18-26.5 GHz) is shown in FIGS. 17A and 17B for CE-1 through CE-5 and EX-1 through EX-5, respectively. These results show that % Absorption values in the K-band of between about 20% and 60% can be expected in the inventive compositions of this disclosure. FIGS. 18A and 18B show the Percent Absorbed Power in Transmission Mode observed in the W-band (75-110 GHz) for the comparative formulations CE-1 through CE-5 and the inventive formulations EX-1 through EX-5, respectively. These results show that % Absorption values in the W-band of between about 25% and 50% can be expected in the inventive compositions of this disclosure.

The foregoing results demonstrate that carbon fibers produce materials that are highly reflecting of MW radiation as compared to materials comprising carbon powder at the same loadings. The materials comprising carbon powder were more MW absorbing. This is particularly true in the W-band because EX-1 through EX-5 absorb about 20-60% of incident MW radiation while CE-1 through CE-5 absorb about 50-80%. These differences are even more noticeable when compositions containing the same amount of carbon filler (powder vs fibers) are compared. See FIGS. 18A and 18B. Ranges of % Absorption of CE-1 through CE-5 and EX-1 through EX-5 were similar in the K-band. Again, relatively large differences in Percent Absorbed Power were observed when compositions containing the same amount of carbon filler (powder vs fibers) were compared. See FIGS. 17A and 17B. Without being held to any particular theory, the carbon powder-based comparative compositions thus appeared to shield MW radiation mainly by absorption, while the carbon fiber-based inventive compositions shield MW radiation mainly by reflection.

Figure 19:
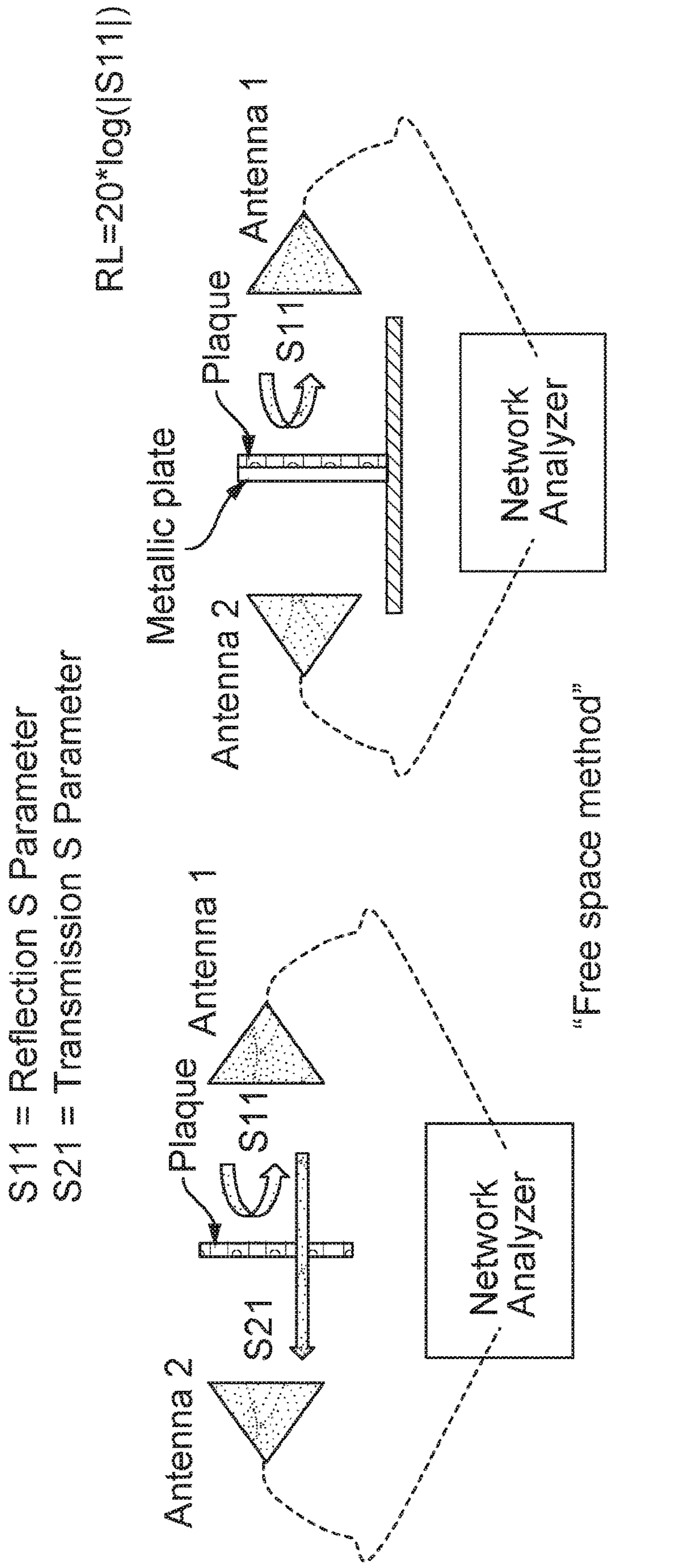
FIG. 19 presents a diagram of the equipment used in Transmission Mode (left) and Metal-backed Reflection Mode (right) to measure dielectric properties according to the Free Space Method.

The values for Power Absorbed, Reflected, and Transmitted measured for the composites of this disclosure were observed according to the Free Space Method. The Free Space Method consists of a Vector Network Analyzer connected to two antennas (a transmitting antenna and a receiving antenna) to focus microwave energy at or through a slab of material. The method can be nm in Transmission Mode (all three modes of energy transfer, Transmission, Absorption and Reflection are allowed) or Metal-backed Reflection Mode (only Absorption and Reflection are allowed, with Transmission being suppressed by the use of a metallic plate placed between the sample and the receiving antenna). This method is non-contacting and is especially useful at mm-wave frequencies. Samples were evaluated in Transmission Mode as presented in FIG. 19.

Figure 21A:
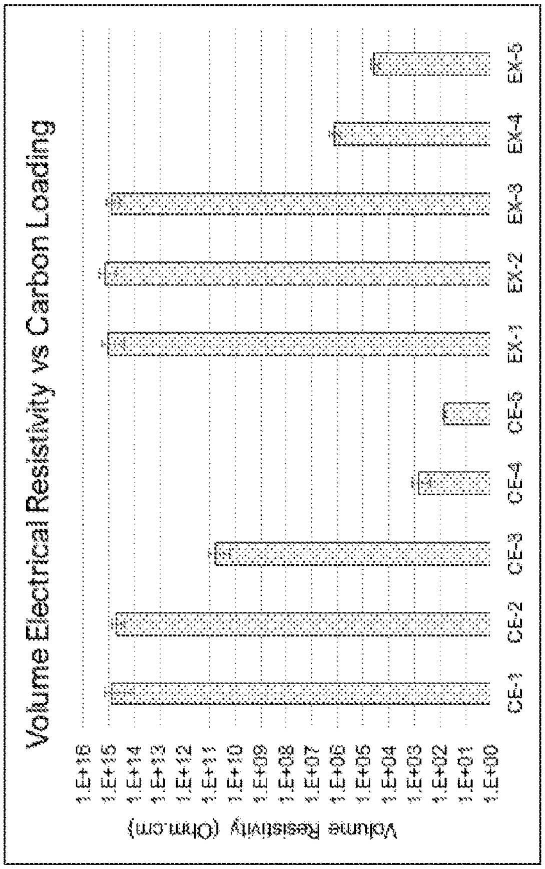
FIGS. 21A and 21B are graphical representations of the volume electrical resistivity and surface electrical resistivity of samples CE-1 to CE-5 and EX-1 to EX-5, respectively.
Figure 21B:
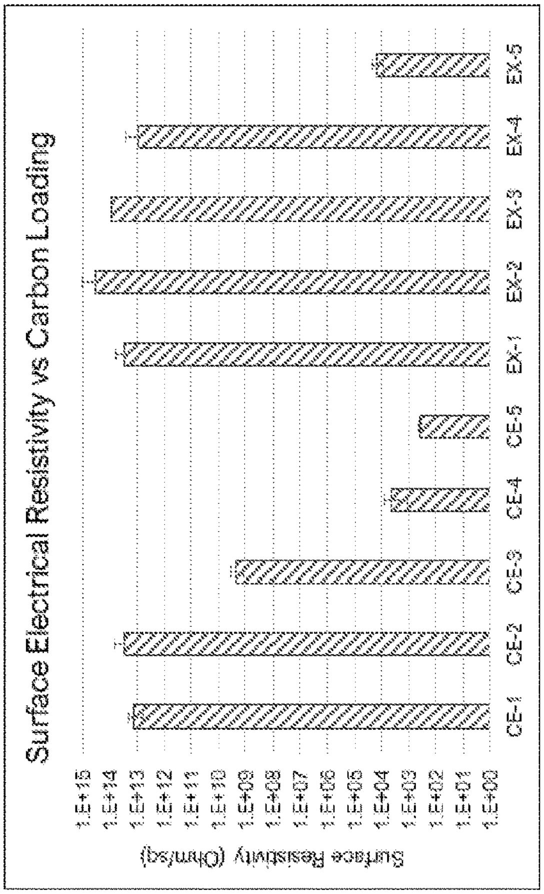

Electrical surface resistivity and volume resistivity were observed for comparative and inventive samples at room temperature, measured according to ASTM D257 on 4 inch by 5 inch and ⅛ inch thick (10.2 cm by 12.7 cm and 0.32 cm thickness) molded plaques, at a range of 10-100V of voltage, at 50% relative humidity (RH) and 23° C. ambient conditions. Table 3 shows the values for the different comparative samples CE-1 through CE-5 and inventive samples EX-1 through EX-5. FIG. 20 presents Table 3 showing the volume and surface electrical resistivities of CE-1 through CE-5 and EX-1 and EX-5, respectively. FIGS. 21A and 21B are graphical representations of the volume resistivity and surface resistivity, respectively, according to the different samples.

Example II. Comparing PBT Resins with Carbon Fiber and Further Comprising a Poly(carbonate-siloxane)

Figure 24:
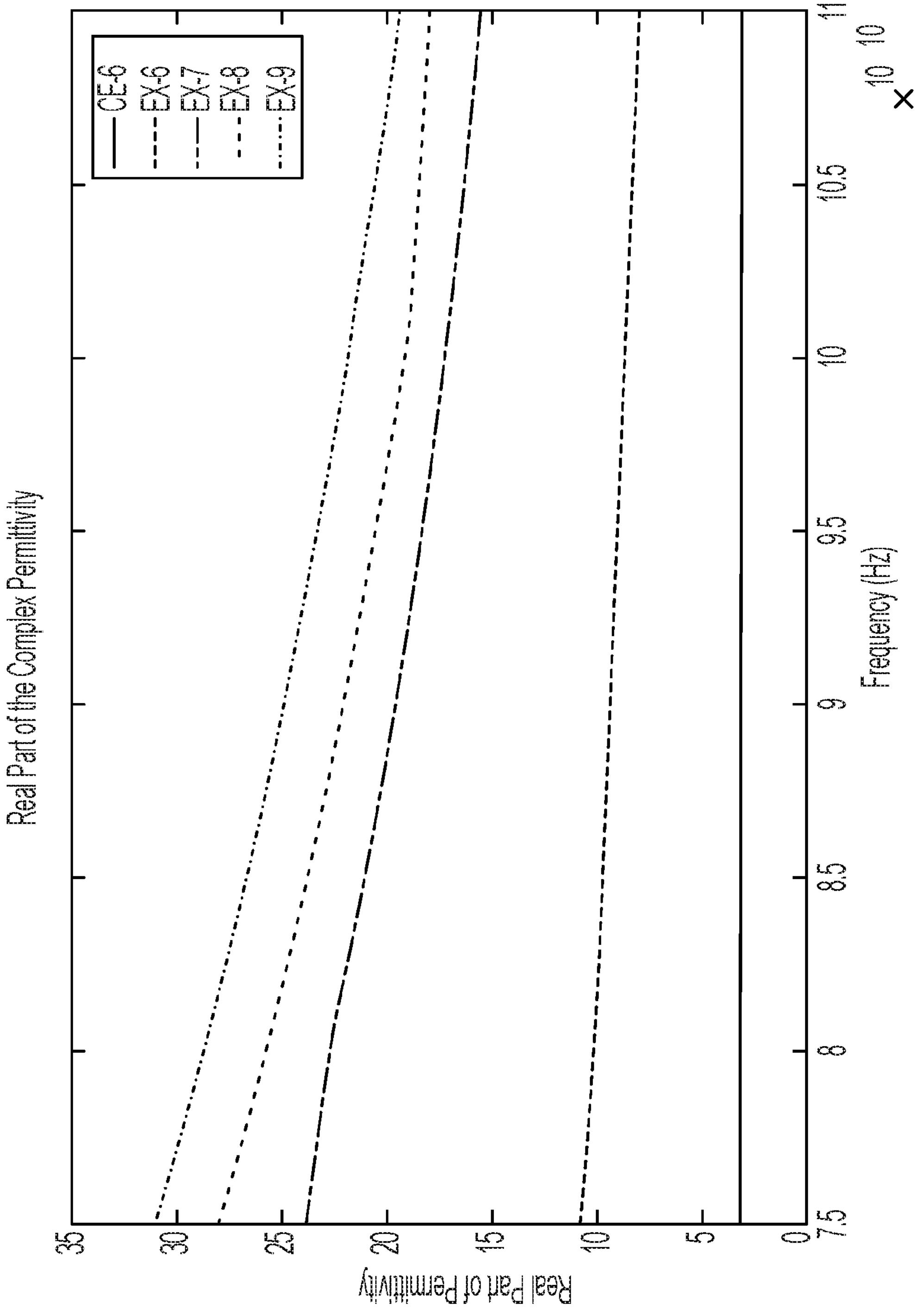
FIG. 24 is a graphical representation of ε' for CE-6 and EX-6 to EX-9 in the W-Band (75-110 GHz).
Figure 25:
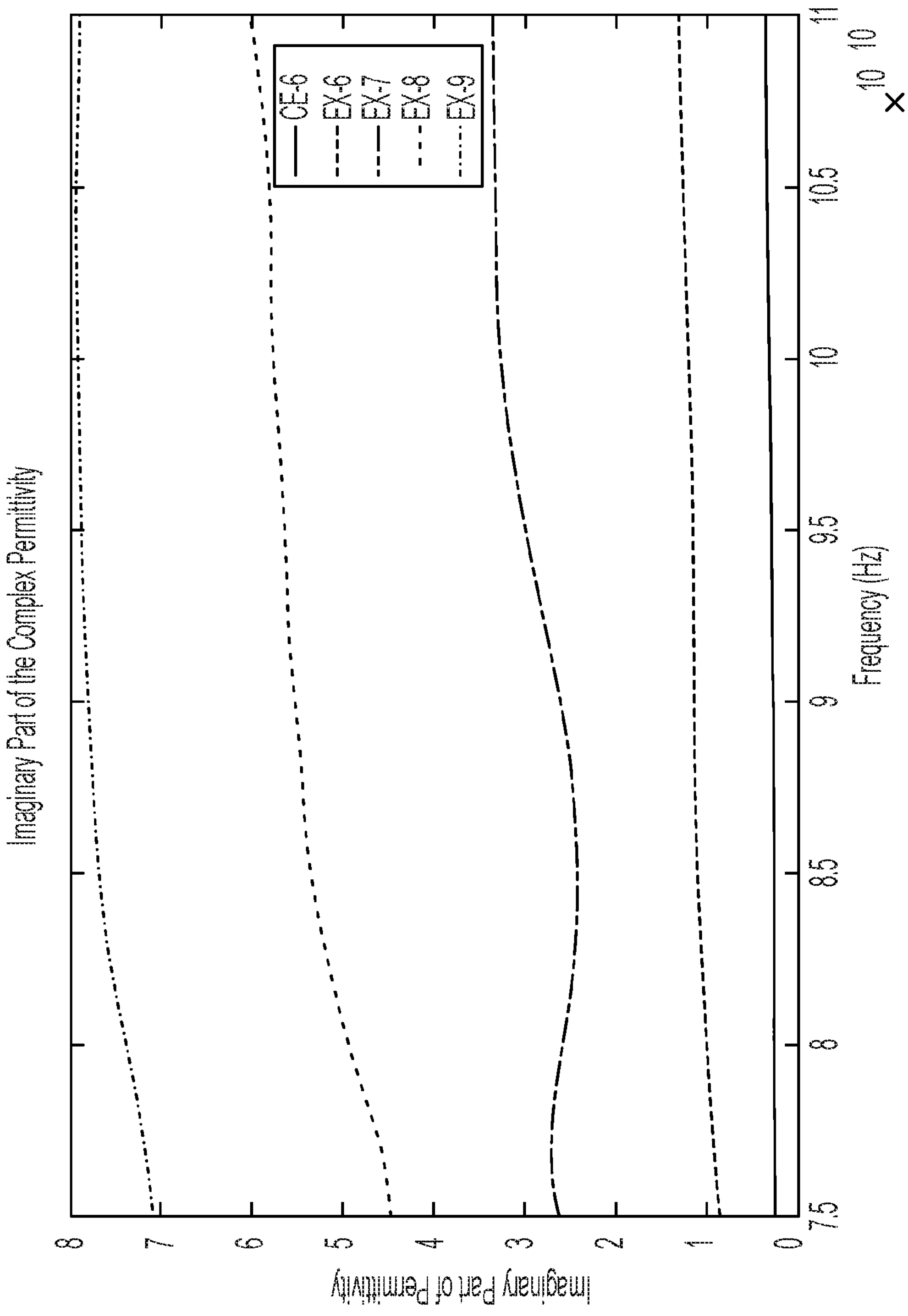
FIG. 25 is a graphical representation of ε' for CE-6 and EX-6 to EX-9 in the W-Band (75-110 GHz).
Figure 26:
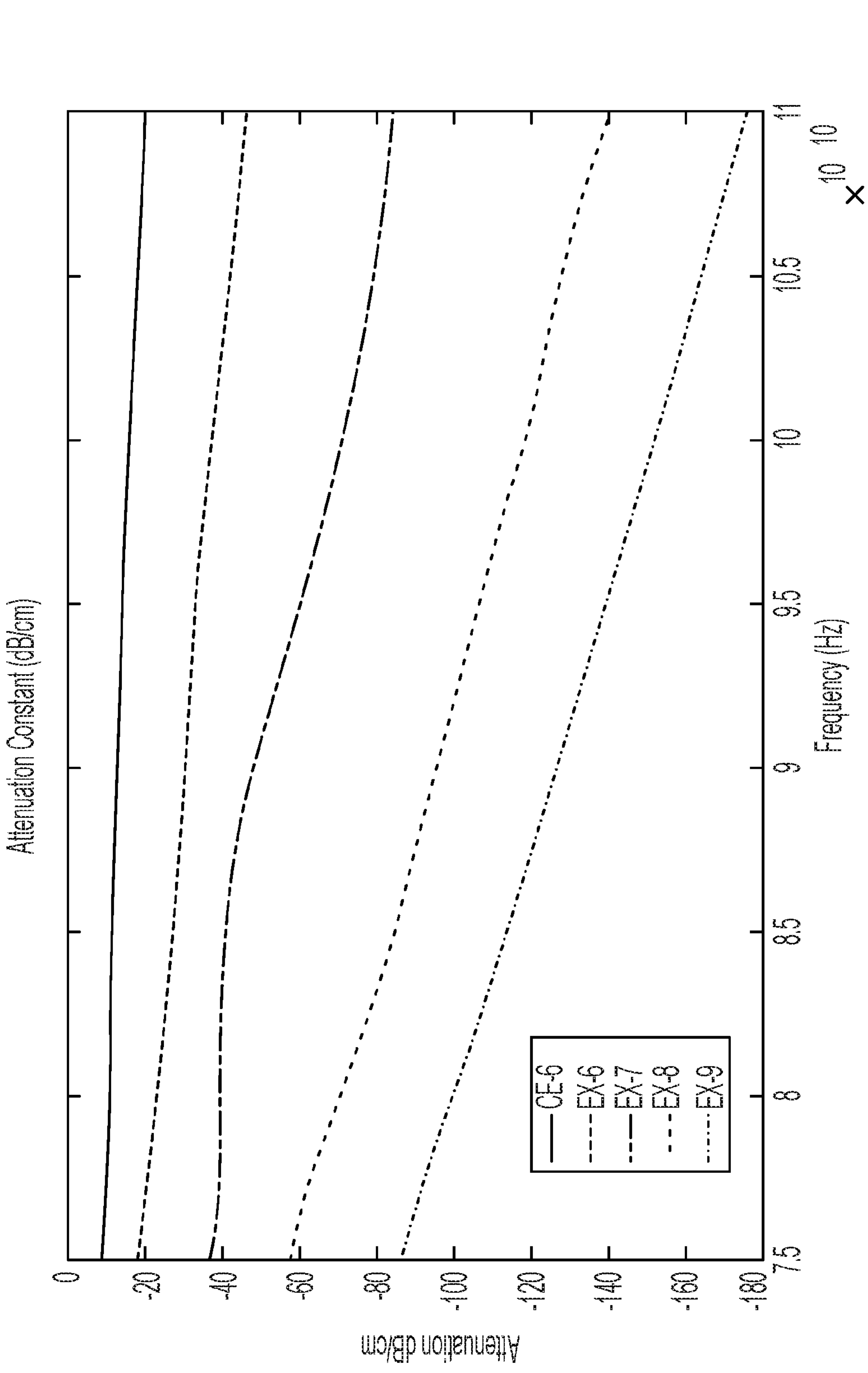
FIG. 26 is a graphical representation of the Attenuation Constant for CE-6 and EX-6 to EX-9 in the W-Band (75-110 GHz).
Figure 27:
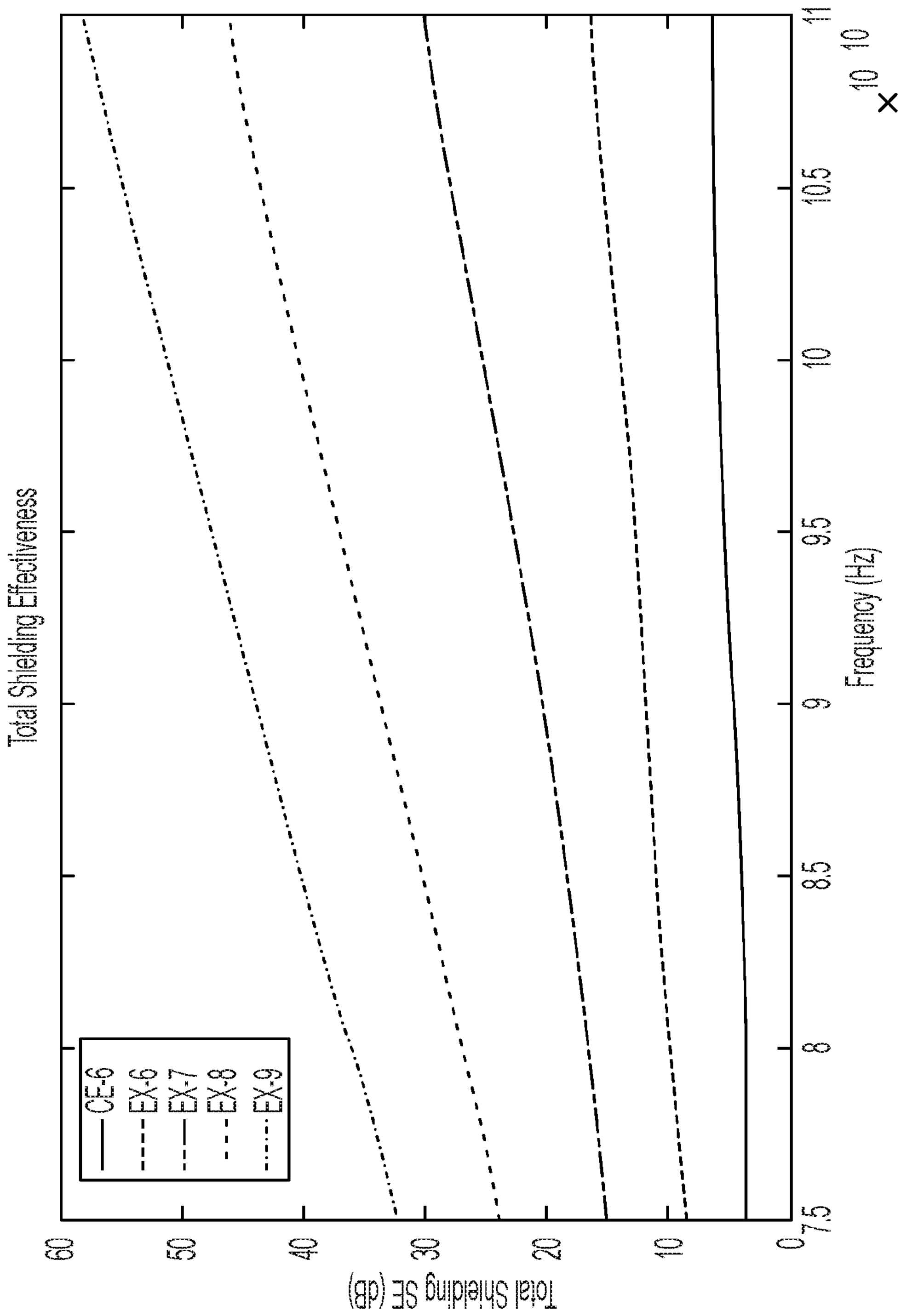
FIG. 27 is a graphical representation of the Total Shielding Effectiveness for CE-6 and EX-6 to EX-9 in the W-Band (75-110 GHz).
Figure 28:
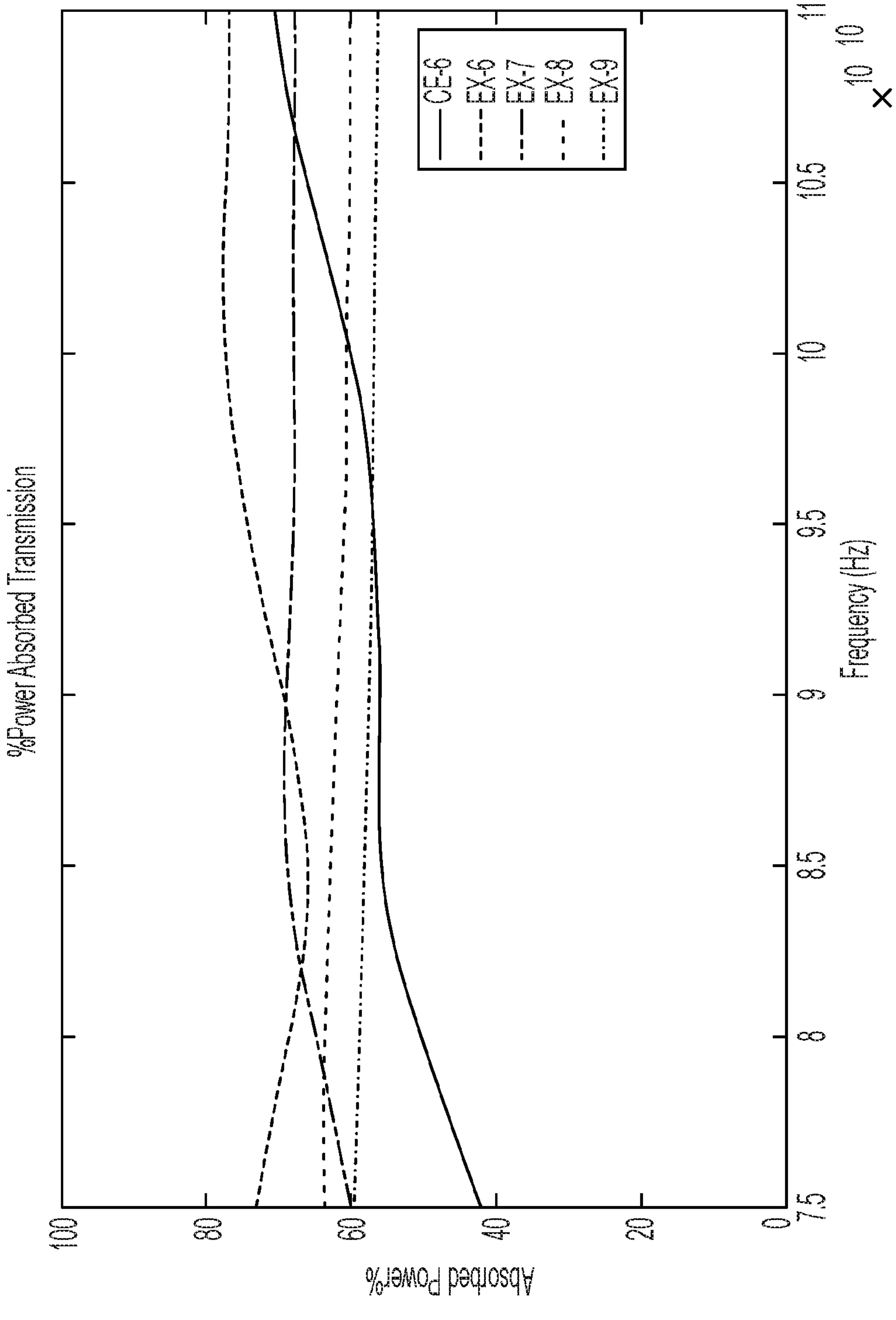
FIG. 28 is a graphical representation of Percent Absorbed Power in Transmission Mode for CE-6 and EX-6 to EX-9 in the W-Band (75-110 GHz).

To further evaluate the performance of carbon fiber, various composite samples further comprising poly(carbonate-siloxane) copolymer were prepared. Formulations are presented in Table 4 (shown in FIG. 22). All samples included a combination of PBT and PC-siloxane, however Comparative sample CE-6 included less carbon fiber (0.1 wt. %). Composite samples were prepared as provided in Example I. Dielectric properties were observed on 3.175 mm (0.125 in.) nominal thick samples at 77 GHz. Values are presented in Table 5 (FIG. 23). Complex Permittivities were also observed at frequencies in the W-band (75-110 GHz). Real and imaginary parts of complex dielectric permittivity were observed with Teflon used as a control or standard. The dielectric performance of samples CE-6 and EX-6 through EX-9 at frequencies between 75 and 110 GHz was observed. FIGS. 24 and 25 show the real ε' and imaginary ε" parts, respectively, of the complex dielectric permittivity at frequencies of 75 GHz to 110 GHz. FIG. 26 is a graphical representation of the Attenuation Constant, which also appeared to become increasingly more negative with the increasing amount of carbon fiber. FIG. 27 is a graphical representation of the Total Shielding Effectiveness, which increased with more carbon fiber across the samples. FIG. 28 shows a graphical representation of the Percent Power Absorbed in Transmission mode in terms of the amount of carbon fiber added to the formulation.

Figure 29:
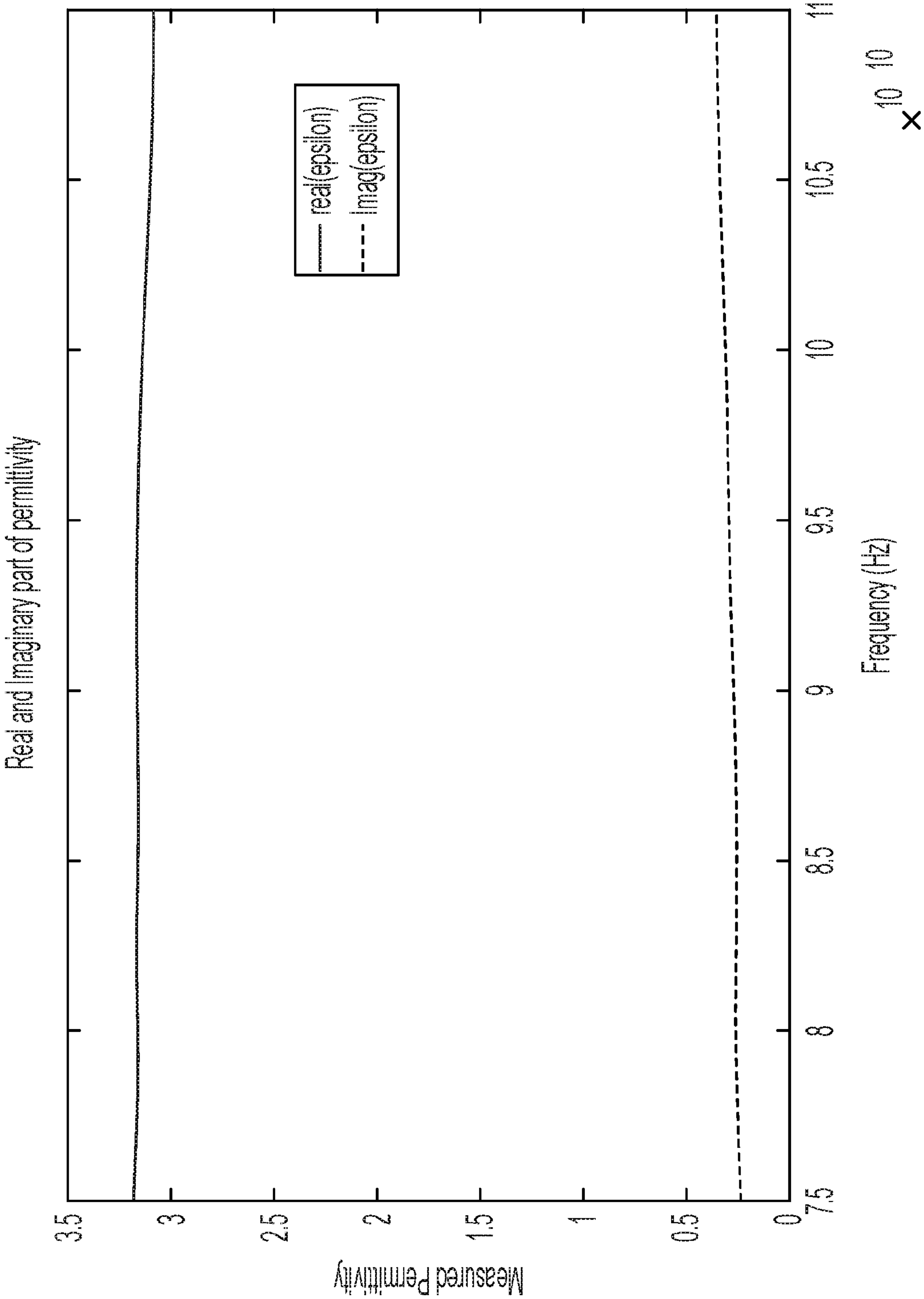
FIG. 29 is a graphical representation of ε' and ε" for CE-6 at 75-110 GHz.
Figure 30:
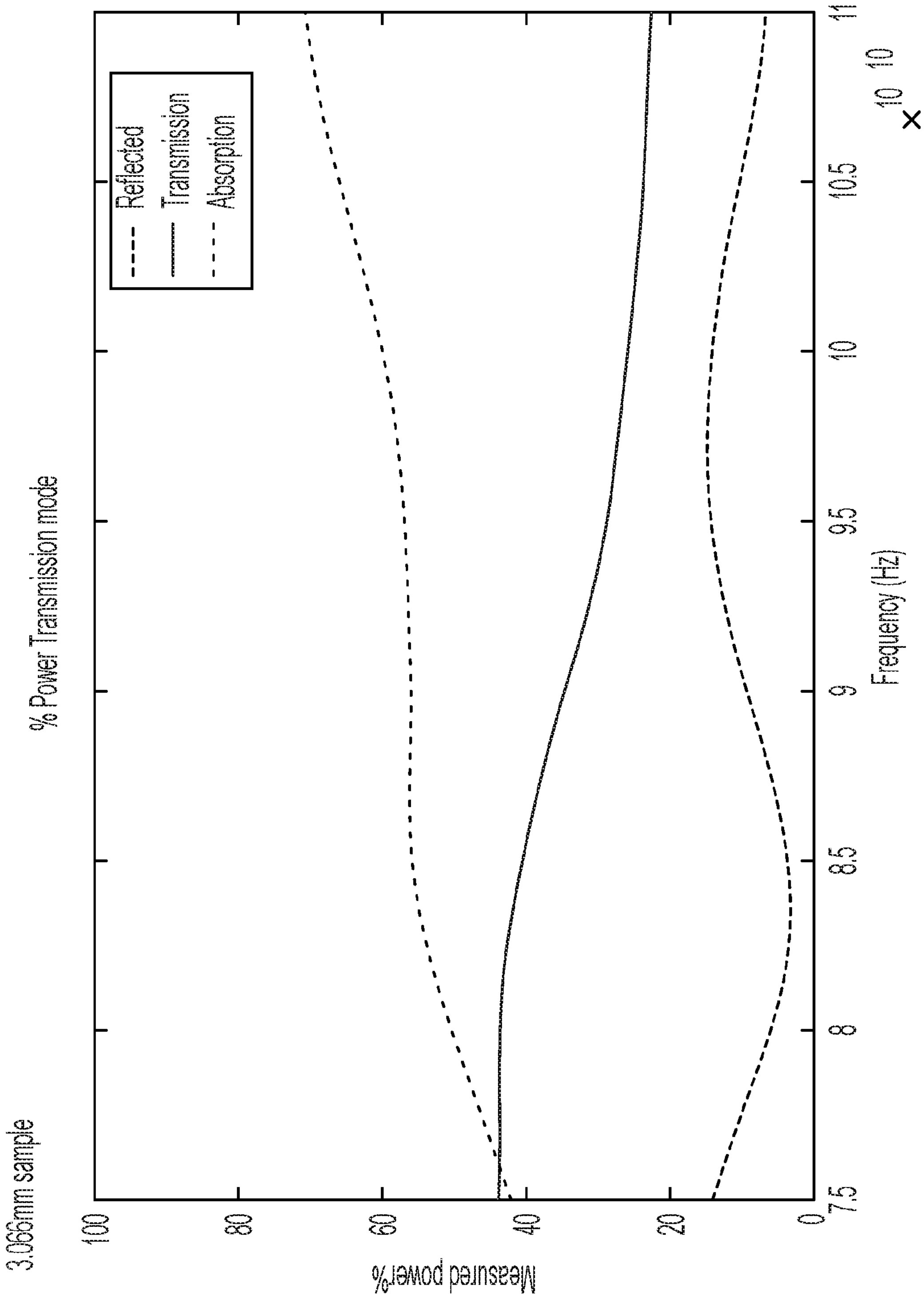
FIG. 30 is a graphical representation of Percent Power in Transmission Mode for CE-6 at 75-110 GHz.
Figure 31:
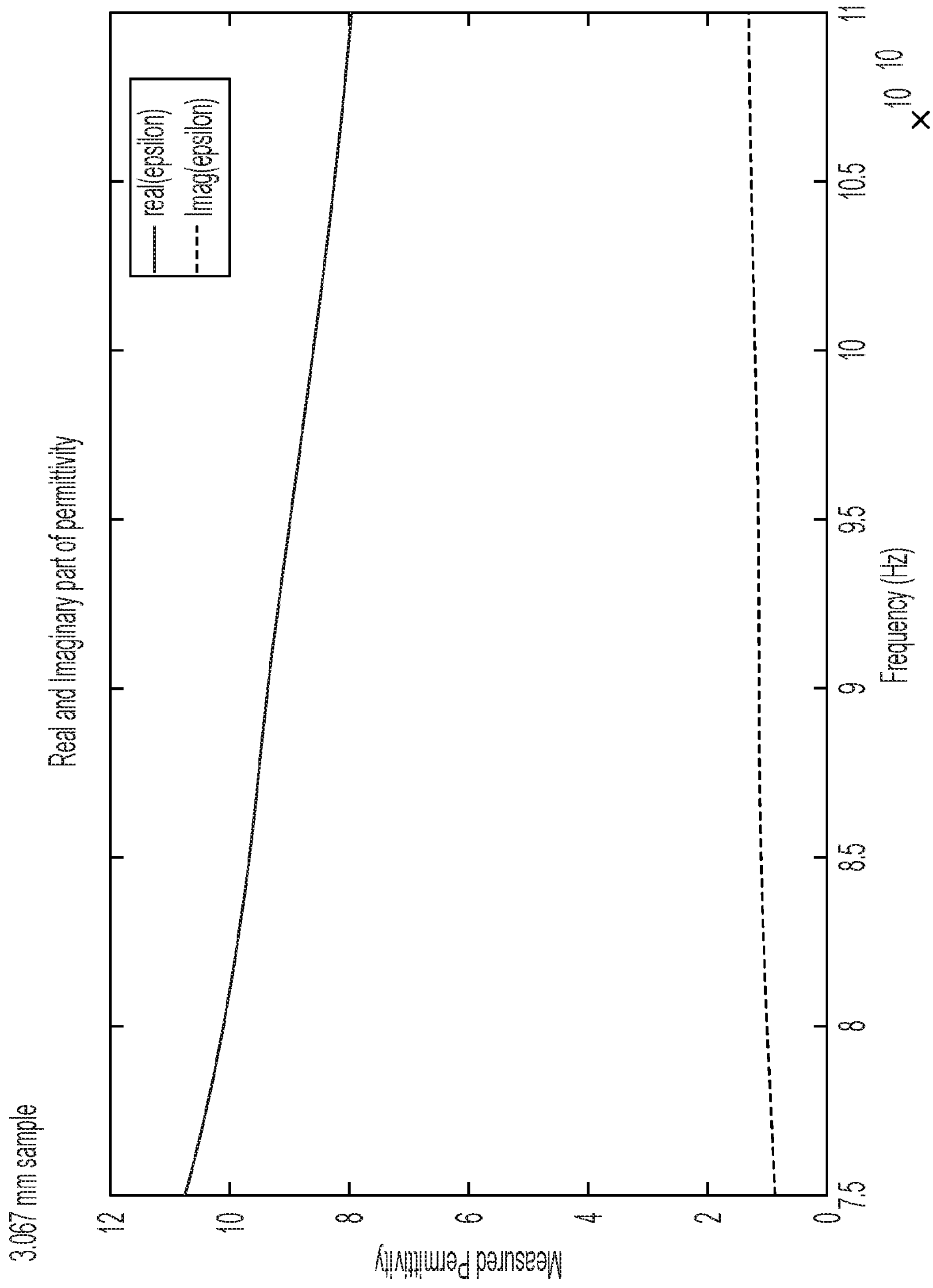
FIG. 31 is a graphical representation of ε' and ε" for EX-6 at 75-110 GHz.
Figure 32:
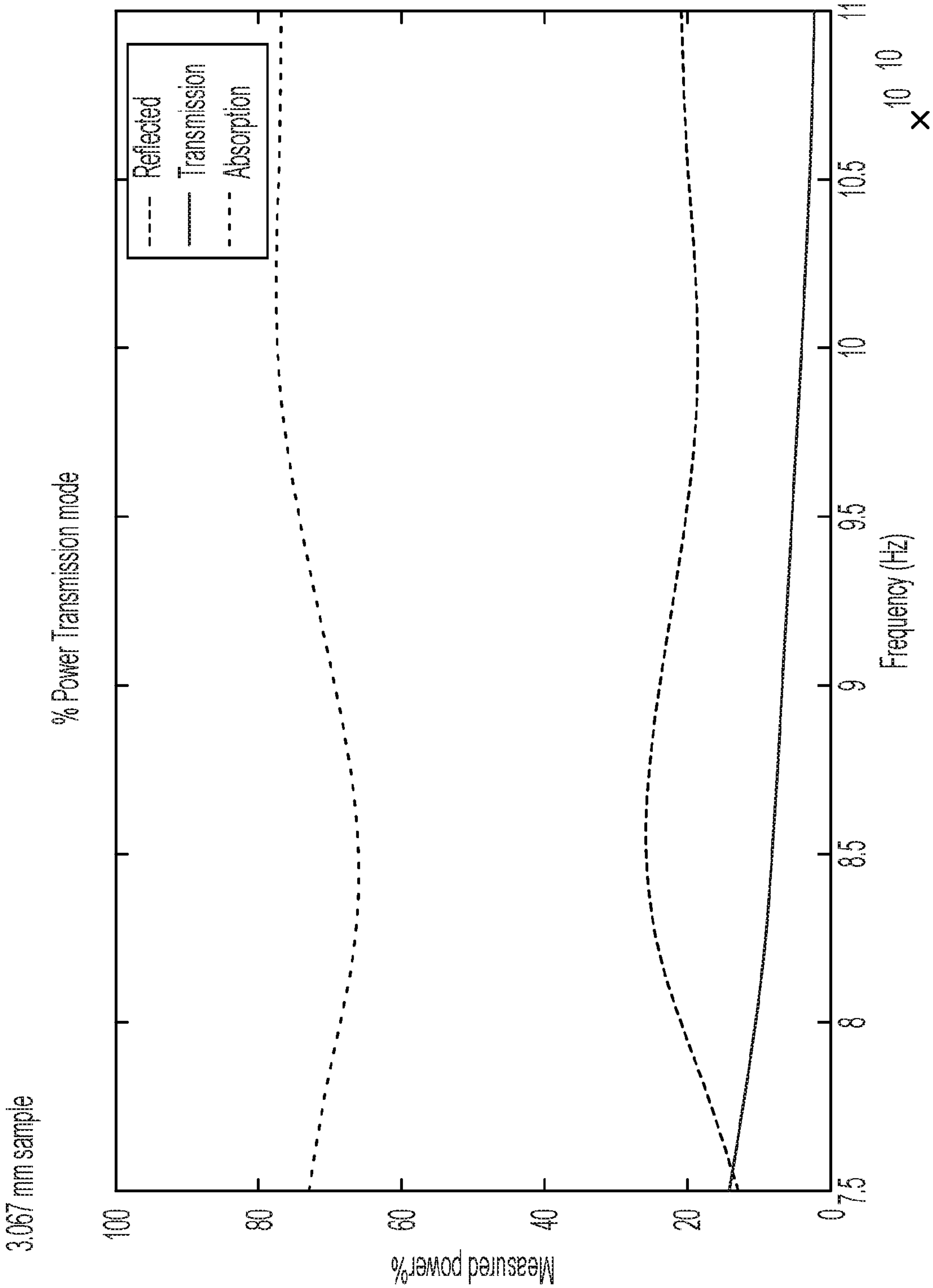
FIG. 32 is a graphical representation of Percent Power in Transmission Mode for EX-6 at 75-110 GHz.
Figure 33:
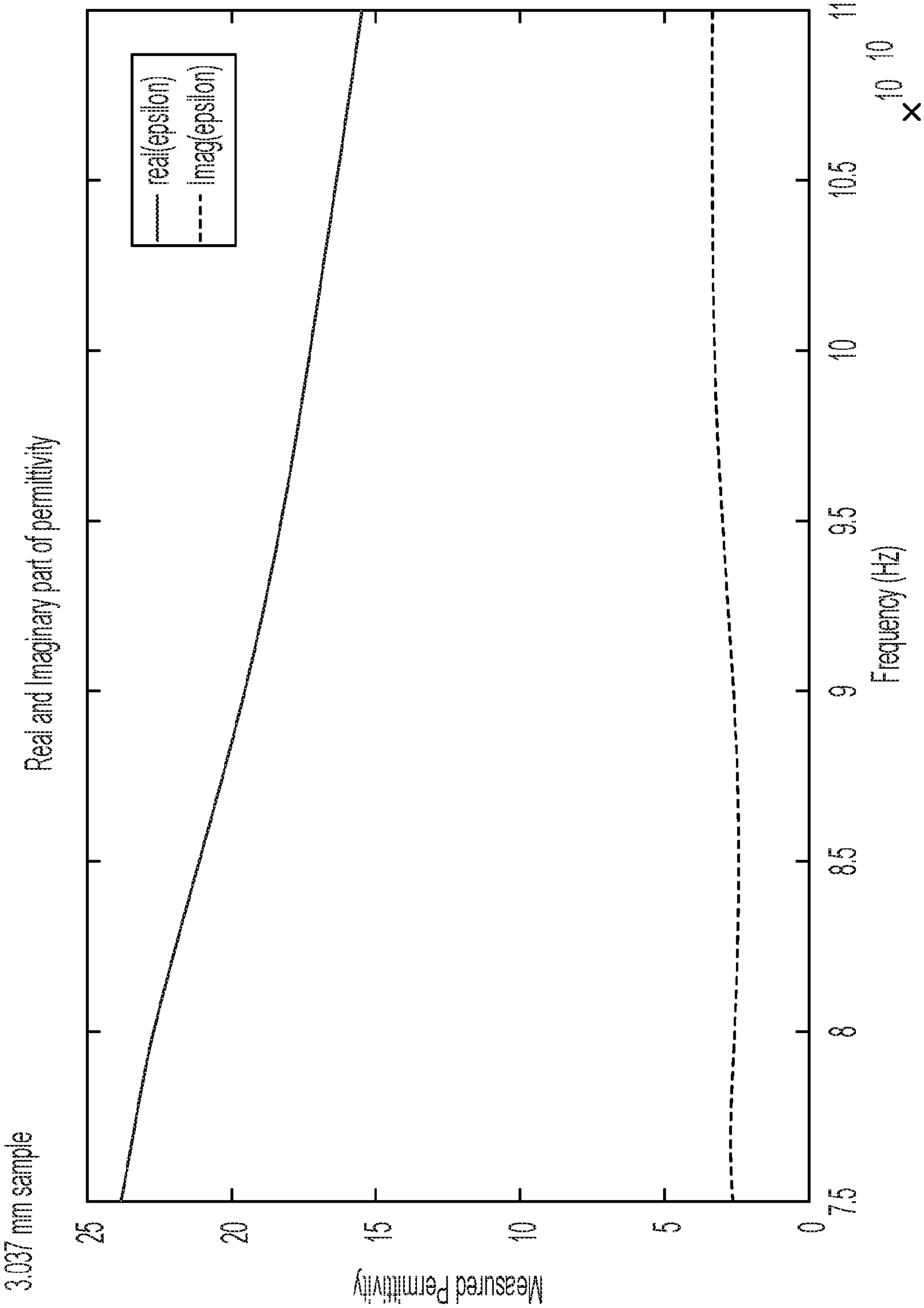
FIG. 33 is a graphical representation of ε' and ε" for EX-7 at 75-110 GHz.
Figure 34:
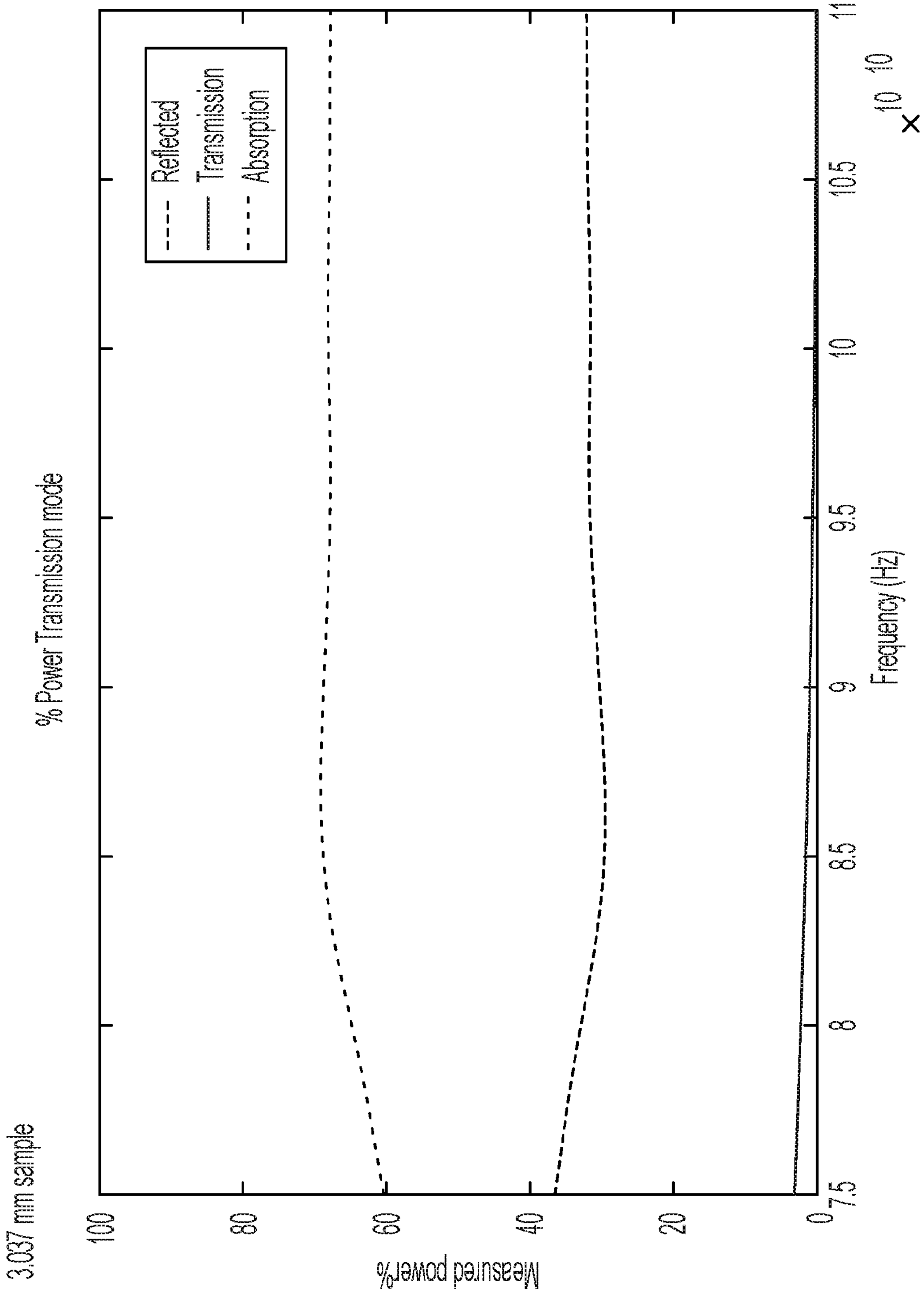
FIG. 34 is a graphical representation of Percent Power in Transmission Mode for EX-7 at 75-110 GHz.
Figure 35:
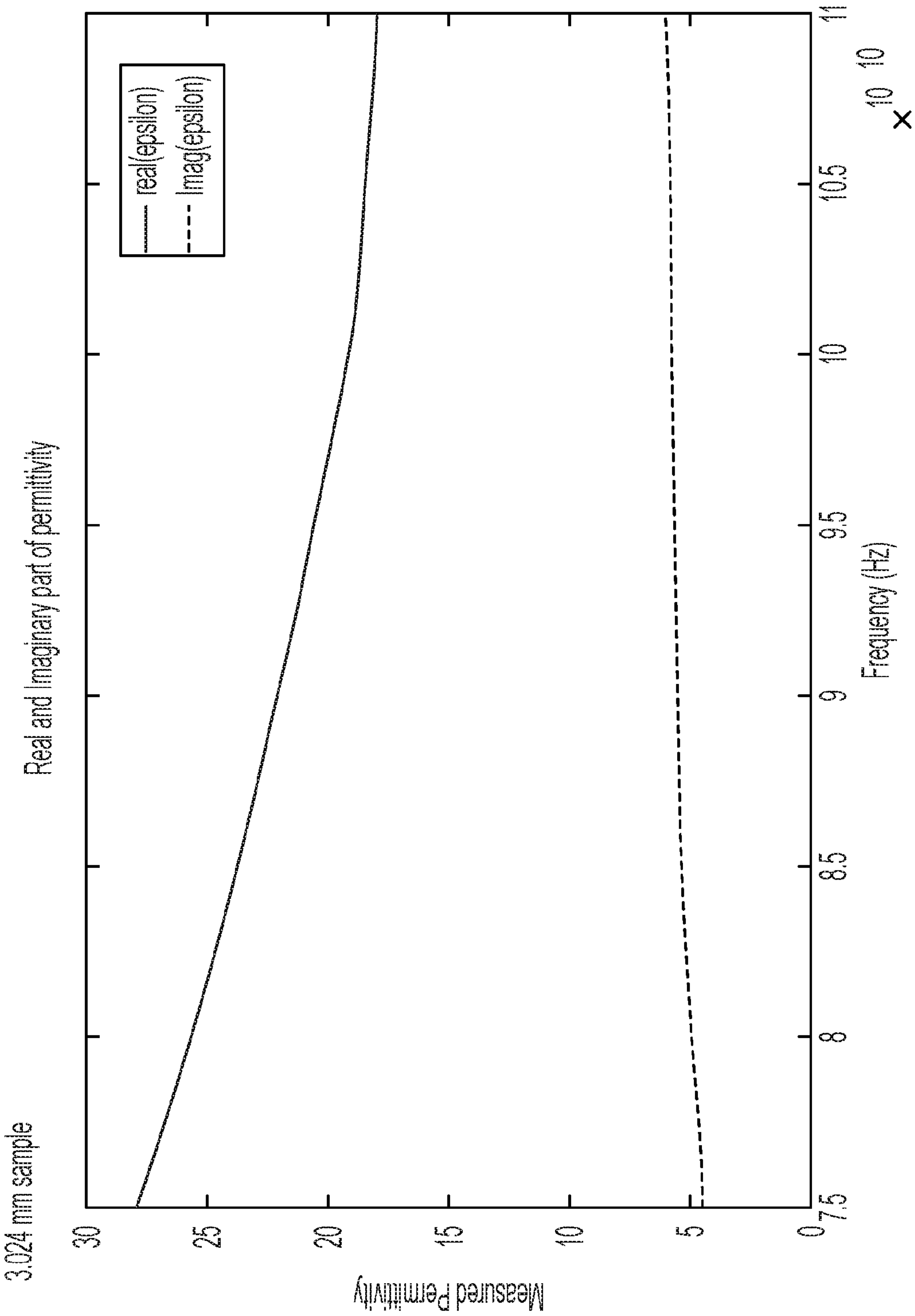
FIG. 35 is a graphical representation of ε' and ε" for EX-8 at 75-110 GHz.
Figure 36:
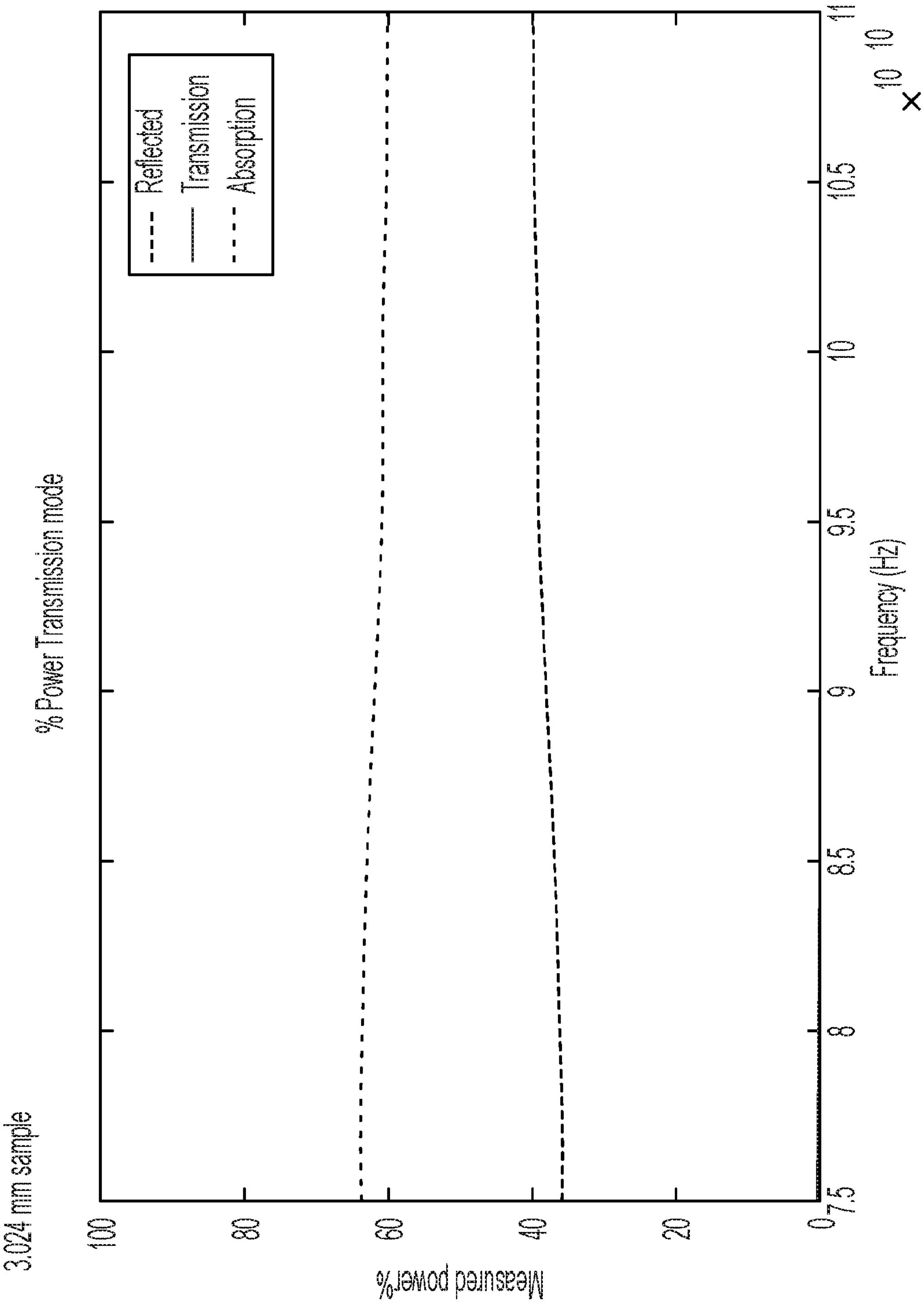
FIG. 36 is a graphical representation of Percent Power in Transmission Mode for EX-8 at 75-110 GHz.
Figure 37:
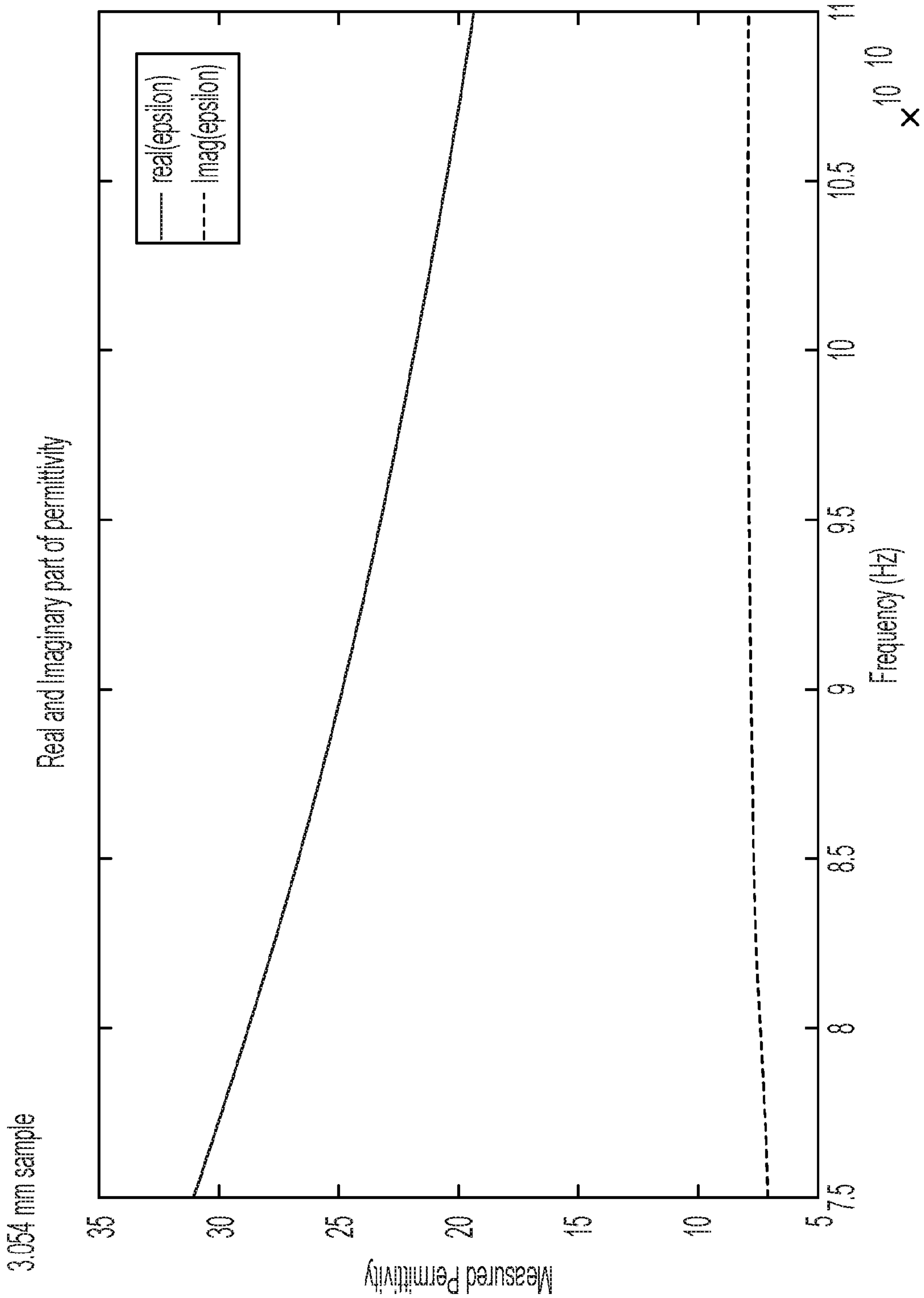
FIG. 37 is a graphical representation of ε' and ε" for EX-9 at 75-110 GHz.
Figure 38:
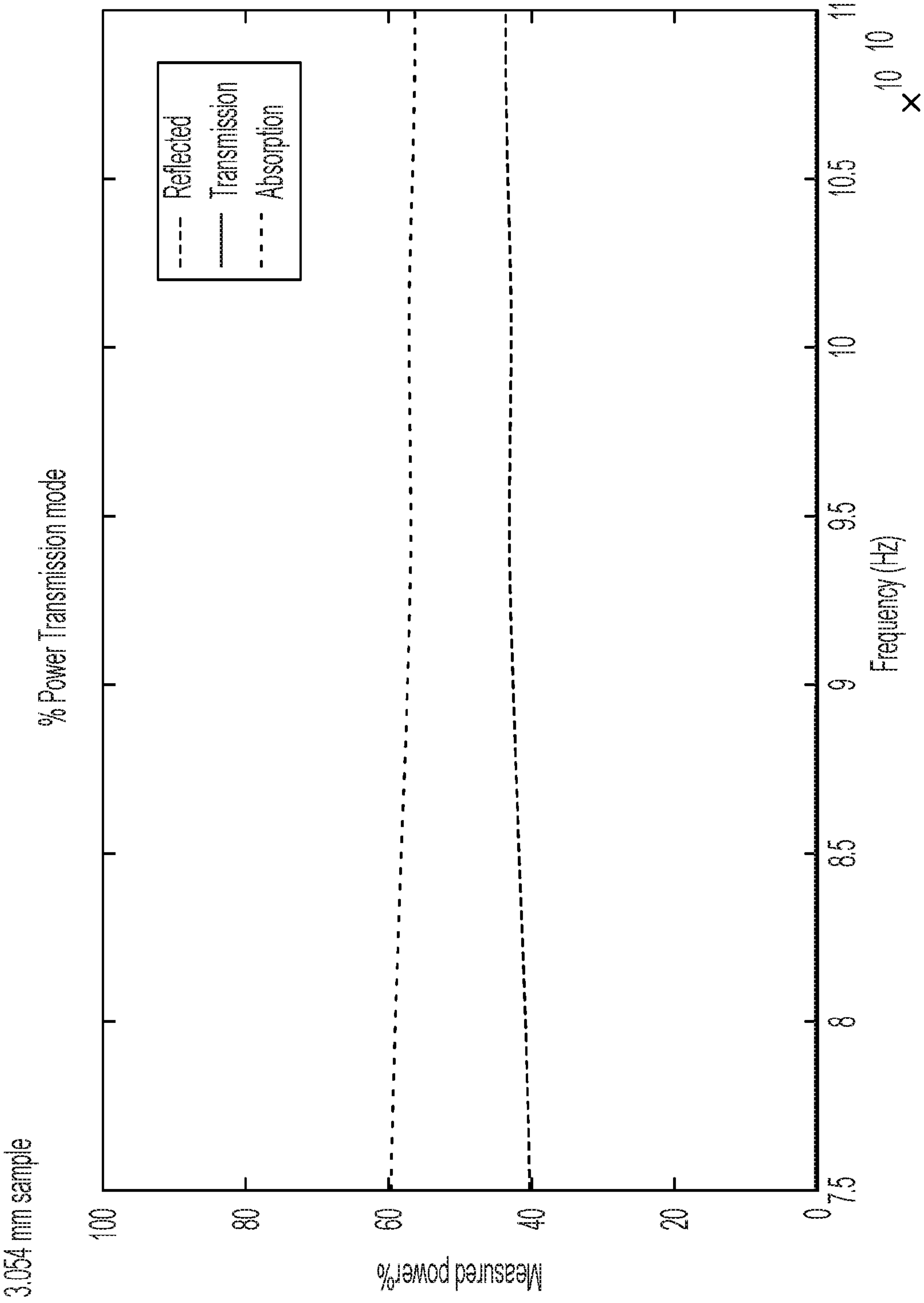
FIG. 38 is a graphical representation of Percent Power in Transmission Mode for EX-9 at 75-110 GHz.
Figure 39:
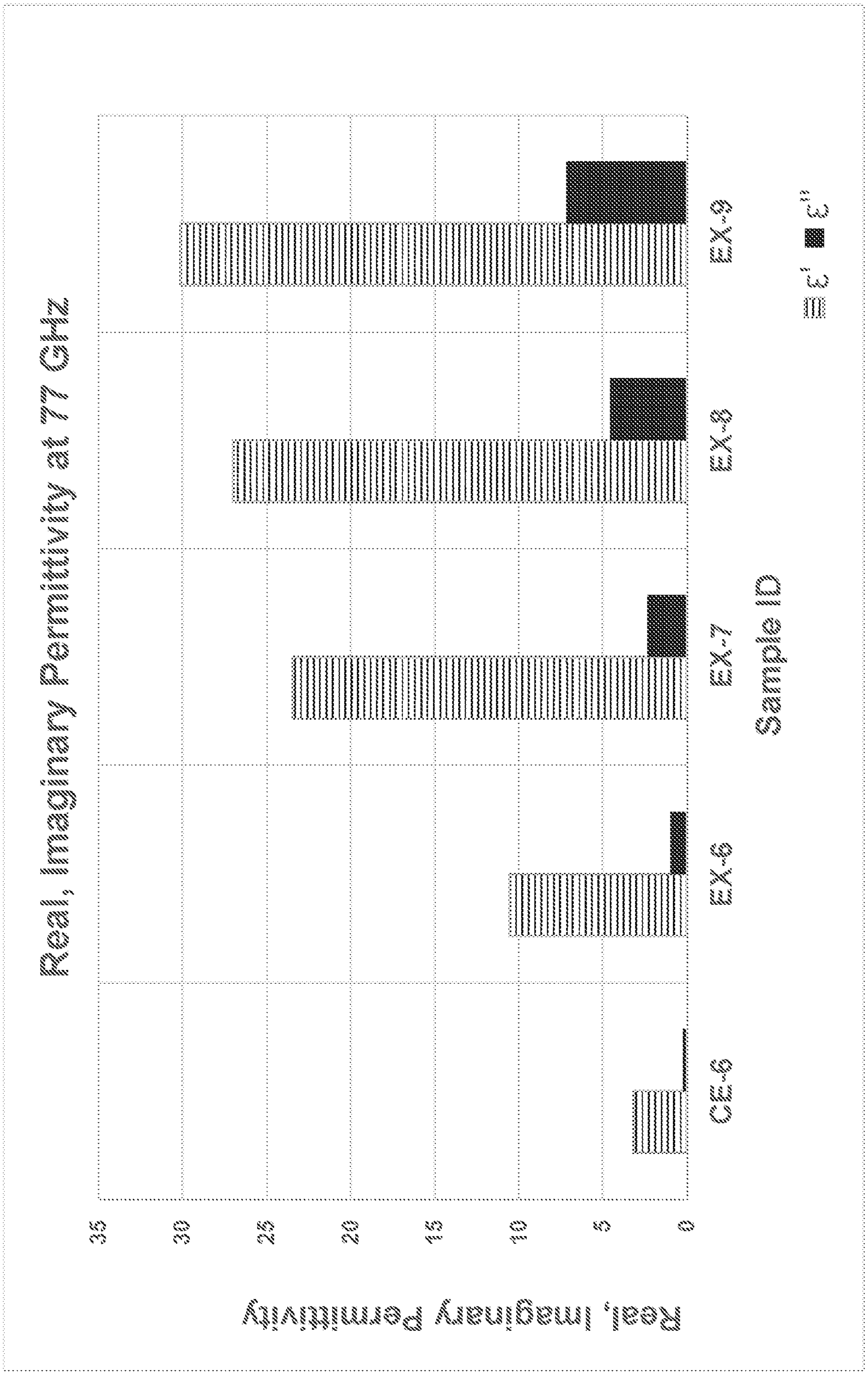
FIG. 39 is a graphical representation of ε, ε" for CE-6 and EX-6 to EX-9 at 77 GHz.
Figure 40:
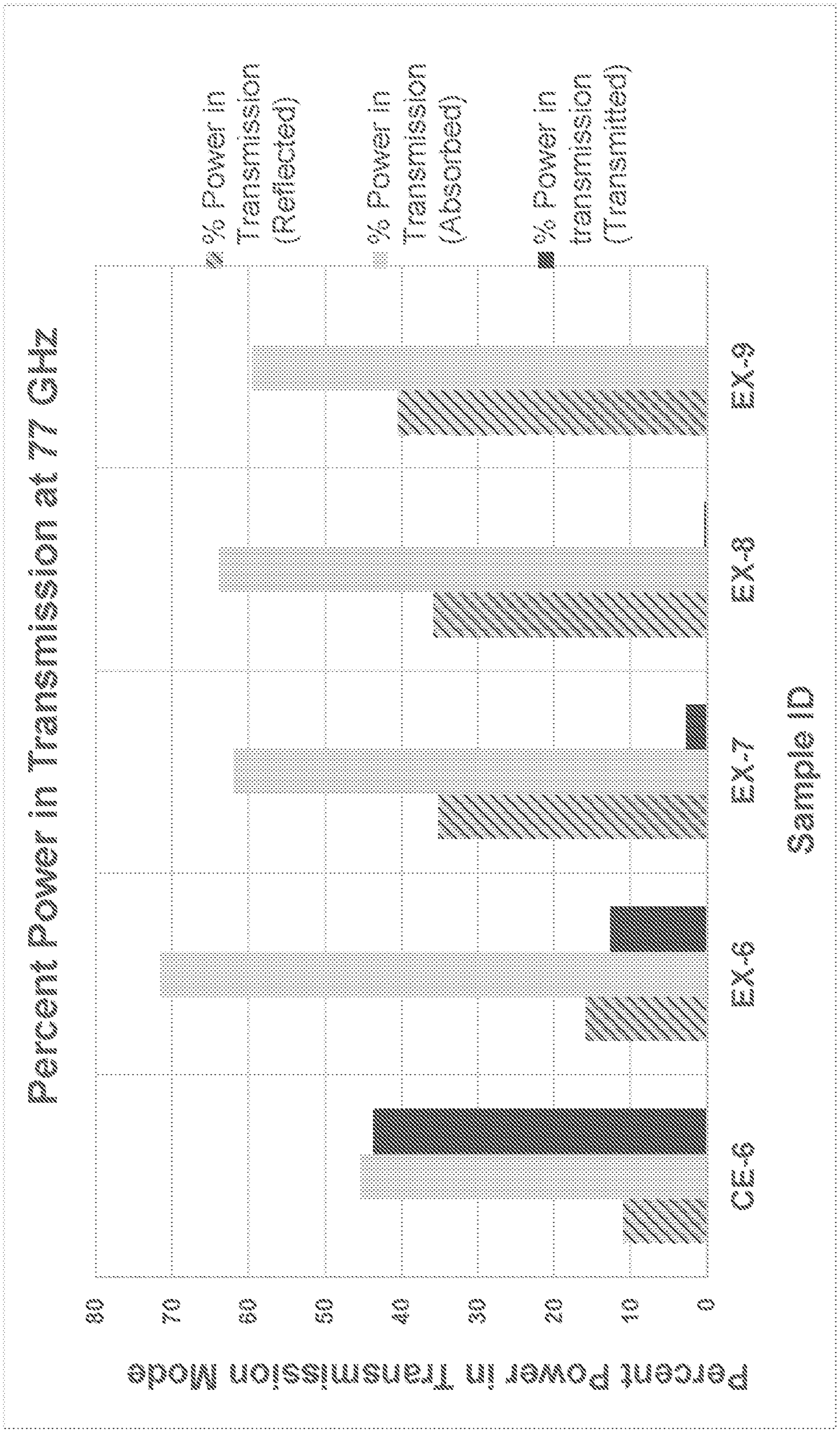
FIG. 40 is a graphical representation of the Percent Power in Transmission Mode Reflected, Absorbed, and Transmitted for CE-6 and EX-6 to EX-9 at 77 GHz.

Values for the real and imaginary parts of complex permittivity, as well as the values for the Percent Power Reflected, Transmitted, and Absorbed measured in Transmission mode for a 3.066 mm sample of CE-6 are shown in FIGS. 29 and 30, respectively. Values for the real and imaginary parts of complex permittivity, as well as the values for the Percent Power Reflected, Transmitted, and Absorbed measured in Transmission mode for a 3.067 mm sample of EX-6 are shown in FIGS. 31 and 32, respectively. Values for the real and imaginary parts of complex permittivity, as well as the values for the Percent Power Reflected, Transmitted, and Absorbed measured in Transmission mode for a 3.037 mm sample of EX-7 are shown in FIGS. 33 and 34, respectively. Values for the real and imaginary parts of complex permittivity, as well as the values for the Percent Power Reflected, Transmitted, and Absorbed measured in Transmission mode for a 3.024 mm sample of EX-8 are shown in FIGS. 35 and 36, respectively. Values for the real and imaginary parts of complex permittivity, as well as the values for the Percent Power Reflected, Transmitted, and Absorbed measured in Transmission mode for a 3.054 mm sample of EX-9 are shown in FIGS. 37 and 38, respectively. Comparative Example CE-6, having less than 0.2 wt. % carbon fiber in the PBT/PC-siloxane blend, has a much higher transmission than the inventive samples EX-6 through EX-9. Reflection appeared to increase with increasing carbon fiber content from EX-6 through EX-9. The Percent Absorbed Power measured in Transmission mode at 77 GHz goes through a maximum (approximately 71.5%) when the concentration of carbon fiber in the composition is about 0.5 wt. %. FIGS. 39 and 40 provide a further graphical representation of the real and imaginary permittivities, as well as the Percent Power in Transmission that is Absorbed, Reflected, and Transmitted at 77 GHz, respectively.

Figure 44:
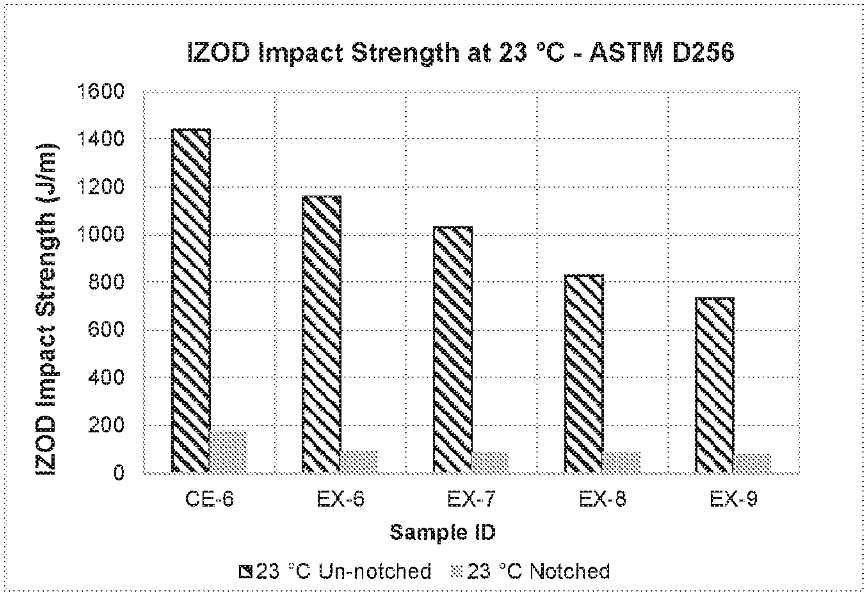
FIG. 44 is a graphical representation of impact strength properties of CE-6 and EX-6 to EX-9 at 23° C.
Figure 45:
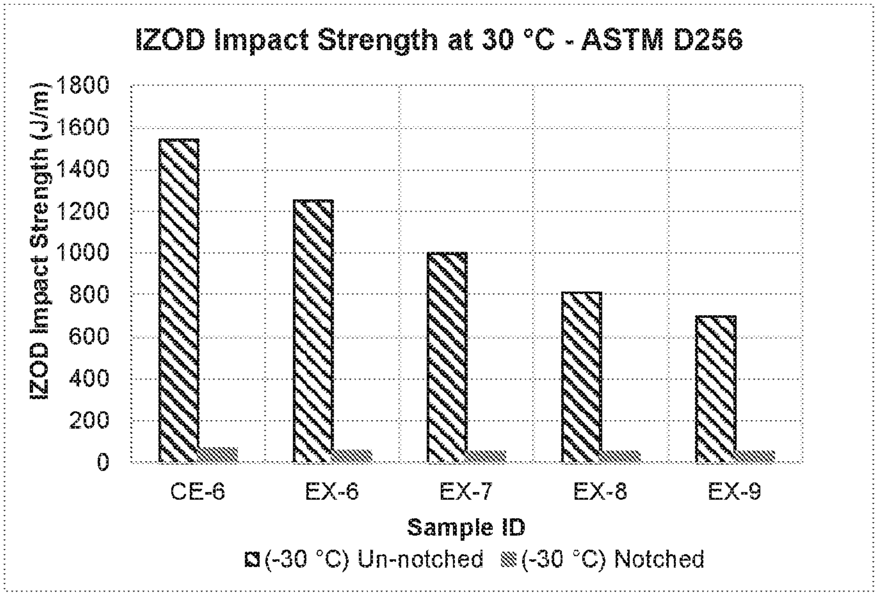
FIG. 45 a graphical representation of impact strength properties of CE-6 and EX-6 to EX-9 at 30° C.

Additional physical and mechanical properties were also evaluated for CE-6 and EX6-9 and are presented in Tables 6A. and 6B at 23° C. (shown in FIGS. 41 and 42, respectively) and in Tables 7 at 30° C. (shown in FIG. 43). Graphical representations of the IZOD impact strength at 23° C. and 30° C. according to ASTM D256 are presented in FIGS. 44 and 45, respectively. The presence of the poly(carbonate-siloxane) appeared to improve the low temperature impact strength and ductility of the formulations. Table 8 (shown in FIG. 46) presents values for heat deflection HDT, specific gravity, flow rate, and viscosity, or CE-6 and EX-6 to EX-9. Table 9 (shown in FIG. 47) presents values for the volume and surface resistivities for CE-6 and EX-6 to EX-9.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

It will be apparent to those skilled in the art that various modifications and variations can be made in the present disclosure without departing from the scope or spirit of the disclosure. Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A composite comprising:

from about 50 wt. % to about 99 wt. % of a thermoplastic resin comprising a polyester and a poly(carbonate-siloxane) copolymer; and from about 0.1 wt. % to 2 wt. % of a carbon fiber filler, wherein the carbon fiber has a bulk density of at least 500 g/l and a volume electrical resistivity of less than 2,000 μΩ·cm, with individual filaments that have a length-to-diameter ratio of at least 300, wherein a 3.175 mm thick molded sample of the composite exhibits a Transmission of less than 15% of incident microwave radiation when observed according to a Free Space method, measured at frequencies of 75 to 110 GHz, a 3.175 mm thick molded sample of the composite exhibits a Percent Reflected Power measured in Transmission mode of at least 15% when observed according to a Free Space method at frequencies from 75 GHz to 110 GHz, and the combined weight percent value of all components does not exceed 100 wt. %, and all weight percent values are based on the total weight of the composite.

2. The composite according to claim 1, wherein the polyester comprises a polyalkylene terephthalate polymer.

3. The composite according to claim 1, wherein the polyester comprises polybutylene terephthalate.

4. The composite according to claim 1, wherein a 3.175 mm thick molded plaque comprising the composite transmits less than about 5% of incident microwave radiation at frequencies from 75 GHz to 110 GHz.

5. The composite according to claim 1, wherein a 3.175 mm thick molded sample of the composite exhibits a Total Shielding Effectiveness of between 40 and 120 dB when measured according to a Free Space method at frequencies from 75 GHz to 110 GHz.

6. The composite according to claim 1, wherein a 3.175 mm thick molded sample of the composite exhibits a Total Shielding Effectiveness greater than that of a reference composite comprising the same amount of a carbon powder filler rather than the carbon fiber filler measured according to a Free Space method at frequencies from 75 GHz to 110 GHz.

7. The composite according to claim 1, wherein a 3.175 mm thick molded sample of the composite exhibits a higher reflection of microwave radiation than a reference composite comprising the same amount of a carbon powder filler rather than the carbon fiber filler, when observed according to a Free Space method, measured at frequencies of 18 to 26.5 GHz and of 75 to 110 GHz.

8. The composite according to claim 1, wherein individual filaments of the carbon fiber filler have a length of from 5 to 10 mm.

9. The composite according to claim 1, wherein individual filaments of the carbon fiber filler have a length-to-diameter ratio of at least 500.

10. The composite according to claim 1, wherein the composite further comprises from 0.01 wt. % to 0.5 wt. % of a heat stabilizer.

11. The composite according to claim 10, wherein the heat stabilizer comprises phosphoric acid.

12. The composite according to claim 1, wherein the composite further comprises from 0.01 wt. % to 0.5 wt. % of an antioxidant.

13. The composite according to claim 1, wherein the composite is free of or substantially free of carbon nanotubes, carbon platelets, or carbon powder.

14. The composite according to claim 1, wherein a 3.175 mm molded sample of the composite exhibits a Percent Absorbed Power of at least 55% measured in Transmission mode of incident microwave radiation when observed according to a Free Space method, measured at frequencies of 75 to 110 GHz.

15. The composite according to claim 14, wherein the composite exhibits an un-notched Izod Impact strength at −30° C. of at least 500 J/m, and a notched Izod Impact strength at −30° C. of at least 45 J/m when measured according to ASTM D256.

16. The composite according to claim 14, wherein the composite exhibits an un-notched Izod Impact strength at 23° C. of at least 600 J/m, and a notched Izod Impact strength at 23° C. of at least 60 J/m when measured according to ASTM D256.

17. The composite according to claim 14, wherein the carbon fiber filler is present in an amount of between about 0.12 wt. % and about 0.98 wt. %, and wherein the Percent Absorbed Power measured in Transmission mode is at least 70% when observed at a frequency of 77 GHz.

18. The composite according to claim 1, wherein the poly(carbonate-siloxane) copolymer has a siloxane content of at least 5 wt. % based on the total weight of the poly(carbonate-siloxane) copolymer, and wherein the composite has a total siloxane content of between 1 wt. % and 15 wt. % based on the total weight of the composite.

19. An article comprising the composite of claim 1, wherein the article is an autoradar sensor for electromagnetic radiation.

* * * * *